United States Patent
Huang et al.

(10) Patent No.: US 12,274,109 B2
(45) Date of Patent: Apr. 8, 2025

(54) METHODS OF MAKING SEMICONDUCTOR PEROVSKITE LAYERS AND COMPOSITIONS THEREOF

(71) Applicant: Caelux Corporation, Pasadena, CA (US)

(72) Inventors: Jing-Shun Huang, Pasadena, CA (US); John Iannelli, San Marino, CA (US); Jiunn Benjamin Heng, Los Altos Hills, CA (US); Jeong Chul Lee, Monrovia, CA (US); Liam Sohngen, Pasadena, CA (US); Brian D. Hunt, La Crescenta, CA (US); Eric W. Wong, Los Angeles, CA (US); Chenyu Chou, Pasadena, CA (US)

(73) Assignee: Caelux Corporation, Baldwin Park, CA (US)

( * ) Notice: Subject to any disclaimer, the term of this patent is extended or adjusted under 35 U.S.C. 154(b) by 0 days.

(21) Appl. No.: 17/752,764

(22) Filed: May 24, 2022

(65) Prior Publication Data

US 2023/0110770 A1 Apr. 13, 2023
US 2023/0320108 A9 Oct. 5, 2023

Related U.S. Application Data

(63) Continuation of application No. PCT/US2021/051465, filed on Sep. 22, 2021.
(Continued)

(51) Int. Cl.
*H10K 30/10* (2023.01)
*H01G 9/00* (2006.01)
(Continued)

(52) U.S. Cl.
CPC .......... *H10K 30/10* (2023.02); *H01G 9/0036* (2013.01); *H01G 9/2009* (2013.01);
(Continued)

(58) Field of Classification Search
CPC ........ H10K 30/10; H10K 30/88; H10K 85/30; H10K 30/40; H01L 31/043; H01L 31/048;
(Continued)

(56) References Cited

U.S. PATENT DOCUMENTS

| | | |
|---|---|---|
| 4,255,474 A | 3/1981 | Smith |
| 4,847,669 A | 7/1989 | Yamazaki et al. |

(Continued)

FOREIGN PATENT DOCUMENTS

| | | | |
|---|---|---|---|
| CN | 206250211 U | | 6/2017 |
| CN | 109904330 A | * | 6/2019 |

(Continued)

OTHER PUBLICATIONS

John, "Module Encapsulation Materials, Processing, and Testing," National Renewable Energy Laboratory, Dec.4-5, 2008.*
(Continued)

*Primary Examiner* — Bitew A Dinke
(74) *Attorney, Agent, or Firm* — Fish & Richardson P.C.

(57) ABSTRACT

The present disclosure may provide semiconductor perovskite layers and method of making thereof. In some cases, the perovskite layer may comprise a composition of $MA_{n1}FA_{n2}Cs_{n3}PbX_3$. MA may be methylammonium, FA may be formamidinium, n1, n2, and n3 may independently be greater than 0 and less than 1, and n1+n2+n3 may equal 1.

21 Claims, 27 Drawing Sheets

Related U.S. Application Data

(60) Provisional application No. 63/081,747, filed on Sep. 22, 2020, provisional application No. 63/081,750, filed on Sep. 22, 2020, provisional application No. 63/081,753, filed on Sep. 22, 2020, provisional application No. 63/081,758, filed on Sep. 22, 2020, provisional application No. 63/081,756, filed on Sep. 22, 2020, provisional application No. 63/081,755, filed on Sep. 22, 2020, provisional application No. 63/081,752, filed on Sep. 22, 2020, provisional application No. 63/090,636, filed on Oct. 12, 2020, provisional application No. 63/090,642, filed on Oct. 12, 2020, provisional application No. 63/090,643, filed on Oct. 12, 2020, provisional application No. 63/126,481, filed on Dec. 16, 2020, provisional application No. 63/126,483, filed on Dec. 16, 2020, provisional application No. 63/159,277, filed on Mar. 10, 2021, provisional application No. 63/176,845, filed on Apr. 19, 2021, provisional application No. 63/196,585, filed on Jun. 3, 2021, provisional application No. 63/196,601, filed on Jun. 3, 2021, provisional application No. 63/322,084, filed on Mar. 21, 2022.

(51) Int. Cl.
| | | |
|---|---|---|
| *H01G 9/20* | (2006.01) | |
| *H10K 19/20* | (2023.01) | |
| *H10K 30/30* | (2023.01) | |
| *H10K 30/57* | (2023.01) | |
| *H10K 30/82* | (2023.01) | |
| *H10K 30/87* | (2023.01) | |
| *H10K 30/88* | (2023.01) | |
| *H10K 85/10* | (2023.01) | |
| *H10K 85/20* | (2023.01) | |
| *H10K 85/30* | (2023.01) | |
| *H10K 102/10* | (2023.01) | |

(52) U.S. Cl.
CPC .......... *H01G 9/2018* (2013.01); *H01G 9/2027* (2013.01); *H01G 9/2072* (2013.01); *H01G 9/2077* (2013.01); *H01G 9/209* (2013.01); *H10K 19/20* (2023.02); *H10K 30/30* (2023.02); *H10K 30/57* (2023.02); *H10K 30/82* (2023.02); *H10K 30/87* (2023.02); *H10K 30/88* (2023.02); *H10K 85/141* (2023.02); *H10K 85/215* (2023.02); *H10K 85/30* (2023.02); *H10K 2102/103* (2023.02)

(58) Field of Classification Search
CPC ............ H01L 31/0488; B23K 2101/36; B23K 2103/172; B23K 2103/54; B23K 2103/56; B23K 26/0622; B23K 26/38; B23K 26/402; B23K 26/362; Y02E 10/549; Y02E 10/50
See application file for complete search history.

(56) References Cited

U.S. PATENT DOCUMENTS

| | | |
|---|---|---|
| 6,413,794 B1 | 7/2002 | Sano et al. |
| 9,082,992 B2 | 7/2015 | Guo et al. |
| 9,231,136 B2 | 1/2016 | Wu et al. |
| 9,252,374 B2 | 2/2016 | Seok et al. |
| 9,331,292 B2 | 5/2016 | Irwin et al. |
| 9,391,287 B1 | 7/2016 | Huang et al. |
| 9,425,396 B2 | 8/2016 | Irwin et al. |
| 9,431,613 B2 | 8/2016 | Lin et al. |
| 9,880,458 B1 | 1/2018 | Irwin et al. |
| 9,911,935 B2 | 3/2018 | Ek et al. |
| 10,069,025 B2 | 9/2018 | Snaith et al. |
| 10,189,998 B2 | 1/2019 | Irwin et al. |
| 10,199,579 B2 | 2/2019 | Huang |
| 10,236,402 B2 | 3/2019 | Beck |
| 10,297,395 B2 | 5/2019 | Hayakawa et al. |
| 10,332,689 B2 | 6/2019 | Aswani et al. |
| 10,340,458 B2 | 7/2019 | Gong et al. |
| 10,388,898 B2 | 8/2019 | Xu |
| 10,403,829 B2 | 9/2019 | Satou et al. |
| 10,483,046 B2 | 11/2019 | Bakr et al. |
| 10,483,411 B2 | 11/2019 | Nishihara et al. |
| 10,535,828 B2 | 1/2020 | Saliba et al. |
| 10,566,143 B2 | 2/2020 | Zhu et al. |
| 10,573,814 B2 | 2/2020 | Gershon et al. |
| 10,580,585 B2 | 3/2020 | Snaith et al. |
| 10,593,487 B2 | 3/2020 | Beaumont et al. |
| 10,608,190 B2 | 3/2020 | Irwin et al. |
| 10,622,162 B2 | 4/2020 | Snaith et al. |
| 10,622,409 B2 | 4/2020 | Kamino et al. |
| 10,636,632 B2 | 4/2020 | Hilt et al. |
| 10,651,401 B2 | 5/2020 | Kim et al. |
| 10,756,282 B2 | 8/2020 | He et al. |
| 10,770,239 B1 | 9/2020 | Mohite et al. |
| 10,777,364 B2 | 9/2020 | Beaumont et al. |
| 10,777,693 B2 | 9/2020 | Snaith et al. |
| 10,796,857 B2 | 10/2020 | Seo et al. |
| 10,804,412 B2 | 10/2020 | Lee et al. |
| 10,840,030 B2 | 11/2020 | Choy et al. |
| 11,038,132 B2 | 6/2021 | Snaith et al. |
| 11,258,024 B2 | 2/2022 | Snaith et al. |
| 11,296,244 B2 | 4/2022 | Bush et al. |
| 11,342,130 B2 | 5/2022 | Christensen et al. |
| 11,469,338 B2 | 10/2022 | Snaith et al. |
| 11,527,663 B2 | 12/2022 | Snaith et al. |
| 11,634,440 B2 | 4/2023 | Taylor et al. |
| 2005/0095809 A1* | 5/2005 | Nakayama ......... C23C 14/3464 438/454 |
| 2008/0105302 A1 | 5/2008 | Lu et al. |
| 2008/0178932 A1 | 7/2008 | Den Boer et al. |
| 2010/0059111 A1 | 3/2010 | Shin et al. |
| 2011/0011533 A1* | 1/2011 | Golden ............. C08G 59/1466 156/330 |
| 2012/0227803 A1 | 9/2012 | Nakagawa et al. |
| 2015/0122314 A1 | 5/2015 | Snaith et al. |
| 2015/0200377 A1 | 7/2015 | Etgar et al. |
| 2015/0249170 A1* | 9/2015 | Snaith ................ H01L 31/1864 136/265 |
| 2015/0249172 A1 | 9/2015 | Irwin et al. |
| 2015/0311364 A1* | 10/2015 | Wu ........................ H01L 31/18 438/93 |
| 2015/0318477 A1* | 11/2015 | Irwin ..................... H10K 30/82 204/192.1 |
| 2015/0349178 A1 | 12/2015 | Rubio et al. |
| 2016/0035496 A1 | 2/2016 | Irwin et al. |
| 2016/0035917 A1 | 2/2016 | Gershon et al. |
| 2016/0035927 A1 | 2/2016 | Gershon et al. |
| 2016/0087233 A1 | 3/2016 | Guha et al. |
| 2016/0163904 A1 | 6/2016 | Mailoa et al. |
| 2016/0226011 A1 | 8/2016 | Nazeeruddin et al. |
| 2016/0268510 A1* | 9/2016 | Moon .................... H10K 85/50 |
| 2016/0322172 A1 | 11/2016 | Chaudhari |
| 2017/0040557 A1 | 2/2017 | Bailie et al. |
| 2017/0092697 A1 | 3/2017 | Chang et al. |
| 2017/0154735 A1 | 6/2017 | Park et al. |
| 2017/0200562 A1 | 7/2017 | Kim et al. |
| 2017/0207033 A1 | 7/2017 | Chaudhari |
| 2017/0221639 A1 | 8/2017 | Hayakawa et al. |
| 2017/0278640 A1 | 9/2017 | Hayakawa et al. |
| 2017/0309408 A1 | 10/2017 | Hayakawa et al. |
| 2017/0330693 A1* | 11/2017 | Lunt, III ................ H10K 30/30 |
| 2018/0019066 A1 | 1/2018 | Hayakawa et al. |
| 2018/0019358 A1 | 1/2018 | Ahn |
| 2018/0040841 A1 | 2/2018 | Asano et al. |
| 2018/0062096 A1 | 3/2018 | Uno et al. |
| 2018/0083213 A1 | 3/2018 | Snaith et al. |
| 2018/0158976 A1 | 6/2018 | Ahn |
| 2018/0174761 A1 | 6/2018 | Kamino et al. |
| 2018/0175112 A1 | 6/2018 | Robinson et al. |

(56) References Cited

U.S. PATENT DOCUMENTS

| | | | |
|---|---|---|---|
| 2018/0204709 A1* | 7/2018 | Hilt | H01J 37/32348 |
| 2018/0240606 A1 | 8/2018 | Bawendi et al. | |
| 2018/0248134 A1 | 8/2018 | Irwin et al. | |
| 2018/0290897 A1 | 10/2018 | Snaith et al. | |
| 2018/0330889 A1 | 11/2018 | Park et al. | |
| 2018/0351009 A1* | 12/2018 | Snaith | H01G 9/2004 |
| 2018/0366657 A1 | 12/2018 | Wakamiya et al. | |
| 2019/0044080 A1 | 2/2019 | Li et al. | |
| 2019/0173025 A1 | 6/2019 | Uchida et al. | |
| 2019/0185495 A1 | 6/2019 | Cahen et al. | |
| 2019/0218108 A1* | 7/2019 | Kuo | C09K 11/663 |
| 2019/0228917 A1 | 7/2019 | Seok et al. | |
| 2019/0292375 A1 | 9/2019 | Irwin et al. | |
| 2019/0312155 A1* | 10/2019 | Saliba | H10K 85/60 |
| 2020/0024733 A1 | 1/2020 | Bulovic et al. | |
| 2020/0058819 A1 | 2/2020 | Kirner | |
| 2020/0176618 A1 | 6/2020 | Ahn et al. | |
| 2020/0203633 A1* | 6/2020 | Qin | H01G 9/2009 |
| 2021/0028319 A1 | 1/2021 | Snaith et al. | |
| 2021/0054288 A1 | 2/2021 | Tavakoli et al. | |
| 2021/0070776 A1 | 3/2021 | Mercier et al. | |
| 2021/0104686 A1 | 4/2021 | Yan et al. | |
| 2021/0159022 A1 | 5/2021 | Irwin et al. | |
| 2021/0159426 A1 | 5/2021 | Huang et al. | |
| 2021/0167309 A1 | 6/2021 | Baran et al. | |
| 2021/0308934 A1* | 10/2021 | Zakhidov | B29C 59/026 |
| 2021/0388009 A1* | 12/2021 | Febriansyah | C07F 7/24 |
| 2022/0025195 A1* | 1/2022 | Huang | C09D 11/03 |
| 2022/0029118 A1* | 1/2022 | Lee | H10K 71/00 |
| 2022/0093345 A1* | 3/2022 | Iannelli | H01G 9/2072 |
| 2022/0122782 A1 | 4/2022 | Jung et al. | |
| 2022/0231233 A1 | 7/2022 | Huang et al. | |
| 2022/0231243 A1 | 7/2022 | Snaith et al. | |
| 2022/0336158 A1 | 10/2022 | Kim | |
| 2022/0367739 A1 | 11/2022 | Bush et al. | |
| 2022/0384527 A1 | 12/2022 | Robinson et al. | |
| 2022/0393048 A1 | 12/2022 | Snaith et al. | |
| 2022/0416107 A1 | 12/2022 | Yu et al. | |
| 2023/0082682 A1* | 3/2023 | Chen | C23C 14/228 |
| | | | 136/256 |
| 2023/0092881 A1 | 3/2023 | Lee et al. | |
| 2023/0110770 A1* | 4/2023 | Huang | B23K 26/38 |
| | | | 438/57 |
| 2023/0120127 A1* | 4/2023 | Palmstrom | H10K 85/1135 |
| | | | 136/263 |
| 2023/0162928 A1* | 5/2023 | Heng | H01G 9/2072 |
| | | | 136/255 |

FOREIGN PATENT DOCUMENTS

| | | | | |
|---|---|---|---|---|
| CN | 110350105 A | * | 10/2019 | B82Y 30/00 |
| CN | 111446385 | | 7/2020 | |
| CN | 111446385 A | * | 7/2020 | H01L 51/0003 |
| EP | 3435436 A1 | * | 1/2019 | H01L 51/4293 |
| EP | 3650576 | | 5/2020 | |
| EP | 3650576 A1 | * | 5/2020 | |
| JP | 2016082006 A | | 5/2016 | |
| JP | 2016178290 A | | 10/2016 | |
| JP | 2016178295 A | | 10/2016 | |
| JP | 2017028093 A | | 2/2017 | |
| JP | 2017126731 A | | 7/2017 | |
| JP | 2017152476 A | | 8/2017 | |
| JP | 2018517303 A | | 6/2018 | |
| JP | 2019021912 A | | 2/2019 | |
| JP | 2019145621 A | * | 8/2019 | |
| JP | 2020013982 A | | 1/2020 | |
| WO | WO-2016081682 A1 | | 5/2016 | |
| WO | WO-2018026326 A1 | * | 2/2018 | C30B 29/54 |
| WO | WO-2018056312 A1 | | 3/2018 | |
| WO | WO 2021260084 | | 12/2021 | |
| WO | WO 2022006515 | | 1/2022 | |
| WO | WO 2022061015 | | 3/2022 | |
| WO | WO-2022066707 A1 | | 3/2022 | |
| WO | WO 2022081461 | | 4/2022 | |
| WO | WO 2022113038 | | 6/2022 | |
| WO | WO 2022137231 | | 6/2022 | |
| WO | WO 2022175687 | | 8/2022 | |
| WO | WO 2022177642 | | 8/2022 | |
| WO | WO 2023008085 | | 2/2023 | |
| WO | WO 2023026189 | | 3/2023 | |

OTHER PUBLICATIONS

PCT International Preliminary Report on Patentability in International Appln. No. PCT/US2021/051465, dated Mar. 28, 2023, 10 pages.

Bellini E. New Tech to Apply Perovskite Thin-Film Layers to Conventional Solar Panels. PV Magazine International. Nov. 17, 2020. Available at URL: www.pv-magazine.com/2020/11/17/new-tech-to-apply-perovskite-thin-film-layers-to-conventional-solar-panels/. Date accessed Dec. 1, 2020. (7 pages).

Cheacharoen, et al. Encapsulating perovskite solar cells to withstand damp heat and thermal cycling. Sustainable Energy Fuels, 2018,2, 2398-2406. https://doi.org/10.1039/c8se00250a.

Evolar AB. Evolar pitch featuring Kathrin Theelen. YouTube video channel: Uppsala Innovation Centre. Published Jun. 11, 2020. https://www.youtube.com/watch?v=c6XPr3ZtkWo (3 pages).

Filipic, et al. CH3NH3PbI3 perovskite/silicon tandem solar cells: characterization based optical simulations. OSA Publishing Optical Express Vo. 23, Issue 7, pp. A263-A278, Feb. 27, 2015 (Year: 2015).

Gharibzadeh, et al. 2D/3D Heterostructure for Semitransparent Perovskite Solar Cells with Engineered Bandgap Enables Efficiencies Exceeding 25% in Four-Terminal Tandems with Silicon and CIGS. Advanced Functional Materials. Published May 11, 2020. vol. 30, Issue 19. 1909919. doi:10.1002/adfm.201909919.

Liu, et al. A worldwide theoretical comparison of outdoor potential for various silicon-based tandem module architecture. Cell Reports Physical Science 1.4 (Apr. 22, 2020): 100037. p. 1-20 and supplemental pp. S1-S17.

Manzoor, et al. Improved light management in planar silicon and perovskite solar cells using PDMS scattering layer. Solar Energy Materials and Solar Cells 173 (2017) 59-65.

Moon, et al. Laser-Scribing Patterning for the Production of Organometallic Halide Perovskite Solar Modules, in IEEE Journal of Photovoltaics, vol. 5, No. 4, pp. 1087-1092, Jul. 2015, doi: 10.1109/JPHOTOV.2015.2416913.

PCT/US2021/051465 International search report with written opinion dated Mar. 3, 2022.

Sting. "List: Meet the 15 New Startups Accepted to Sting." Sep. 7, 2020, Accessed online at URL: sting.co/list-meet-the-15-new-startups-accepted-to-sting/.

Strandberg, R. Detailed balance analysis of area de-coupled double tandem photovoltaic modules. Appl. Phys. Lett. 106, 033902 (2015); https://doi.org/10.1063/1.4906602.

U.S. Appl. No. 16/953,247 Office Action dated Apr. 15, 2022.

U.S. Appl. No. 16/953,247 Office Action dated Apr. 16, 2021.

U.S. Appl. No. 16/953,247 Office Action dated Oct. 18, 2021.

Walter, et al. Closing the Cell-to-Module Efficiency Gap: A Fully Laser Scribed Perovskite Minimodule With 16% Steady-State Aperture Area Efficiency. IEEE Journal of Photovoltaics. vol. 8, No. 1, pp. 151-155, Jan. 2018, doi: 10.1109/JPHOTOV.2017.2765082.

Wöhrle, et al. Solar cell demand for bifacial and singulated-cell module architectures. Photovoltaics International. 48. (2017).

AU Office Action in Australian Appln. No. 2021347825, mailed on Feb. 22, 2024, 3 pages.

Lee et al., "Scalable perovskite coating via anti-solvent-free Lewis acid-base adduct engineering for efficient perovskite solar modules," Journal of Materials Chemistry A, Feb. 2021, 9(5):3018-28.

Liu et al., "Understanding of perovskite crystal growth and film formation in scalable deposition processes," Chemical Society Reviews, Mar. 2020, 49(6):1653-87.

Aydin et al., "Zr-doped indium oxide (IZRO) transparent electrodes for perovskite-based tandem solar cells," Advanced Functional Materials, Jun. 2019, 29(25):1901741, 37 pages.

(56) References Cited

OTHER PUBLICATIONS

Matsui et al., "Room-Temperature Formation of Highly Crystalline Multication Perovskites for Efficient, Low-Cost Solar Cells," Advanced Materials, Apr. 2017, 29(15):1606258, 15 pages.
Yang et al., "High-bandgap perovskite materials for multijunction solar cells," Joule, Aug. 15, 2018, 2(8):1421-36.
Aydin et al., "Zr-doped indium oxide (IZRO) transparent electrodes for perovskite- based tandem solar cells," Advanced Functional Materials, Jun. 2019, 29(25):1901741, 38 pages.
Choi et al., "Two-terminal mechanical perovskite/silicon tandem solar cells with transparent conductive adhesives," Nano Energy, Nov. 2019, 65:104044, 10 pages.
Dudem et al., "CH 3 NH 3 PbI 3 planar perovskite solar cells with antireflection and self-cleaning function layers," Journal of Materials Chemistry A, Jan. 2016, 4(20):7573-9.
EP Extended European Search Report in European Appln. No. 21873317.8, mailed on Oct. 14, 2024, 13 pages.
Jaysankar et al., "Four-terminal perovskite/silicon multijunction solar modules," Advanced Energy Materials, Aug. 2017, 7(15):1602807, 8 pages.
Li et al., "Perovskite tandem solar cells: from fundamentals to commercial deployment," Chemical Reviews, Aug. 2020, 120(18):9835-950.
Shi et al., "Enhanced light absorption of thin perovskite solar cells using textured substrates," Solar Energy Materials and Solar Cells, Aug. 2017, 168:214-20.

\* cited by examiner

| | Integrated Production Flow | |
|---|---|---|
| Category | Top Cell | Toolsets |
| Incoming + Scribe | Glass + ITO + NiO + P1 | Tool1 |
| Spray-on + Scribe | PbI2+MAI+Anneal+PCBM+P2 | Tool2 |
| PVD + Scribe | ITO + P3 + Ag + Iso | Tool3 |
| Category | Module (Standard) | Toolsets |
| Incoming check | Perovskite-on-Glass | Tool1 |
| Encapsulant | Encapsulant (low moisture) | Tool2 |
| Stringing/Tabbing | Mono/Multi-Si | Tool3 |
| Busbar Layout | 2-terminal + 2-terminal | Manual |
| Soldering | Connecting matched network | Manual |
| Encap + Backsheet | Low moisture material | Manual |
| Lamination | Low temp | Tool4 |
| Jbox | Standard 2 cable 3-4diodes | Manual |
| Edge Sealant | Low moisture material | Tool5 |
| Frames | Standard | Tool6 |

METHODS OF MAKING SEMICONDUCTOR PEROVSKITE LAYERS AND COMPOSITIONS THEREOF

CROSS-REFERENCE

This application is a continuation application of International Application No PCT/US2021/051465, filed Sep. 22, 2021, which claims the benefit of U.S. Provisional Patent Application No. 63/081,747, filed on Sep. 22, 2020, U.S. Provisional Patent Application No. 63/081,750, filed on Sep. 22, 2020, U.S. Provisional Patent Application No. 63/081,753, filed on Sep. 22, 2020, U.S. Provisional Patent Application No. 63/081,758, filed on Sep. 22, 2020, U.S. Provisional Patent Application No. 63/081,756, filed on Sep. 22, 2020, U.S. Provisional Patent Application No. 63/081,755, filed on Sep. 22, 2020, and U.S. Provisional Patent Application No. 63/081,752, filed on Sep. 22, 2020, U.S. Provisional Patent Application No. 63/090,636, filed on Oct. 12, 2020, U.S. Provisional Patent Application No. 63/090,642, filed on Oct. 12, 2020, U.S. Provisional Patent Application No. 63/090,643, filed on Oct. 12, 2020, U.S. Provisional Patent Application No. 63/126,481, filed on Dec. 16, 2020, U.S. Provisional Patent Application No. 63/126,483, filed on Dec. 16, 2020, U.S. Provisional Patent Application No. 63/159,277, filed on Mar. 10, 2021, U.S. Provisional Patent Application No. 63/176,845, filed on Apr. 19, 2021, U.S. Provisional Patent Application No. 63/196,585, filed on Jun. 3, 2021, U.S. Provisional Patent Application No. 63/196,601, filed Jun. 3, 2021, and U.S. patent application Ser. No. 16/953,247, filed on Nov. 19, 2020, this application also claims the benefit of U.S. Provisional Patent Application No. 63/322,084, filed Mar. 21, 2022, each of which is incorporated herein by reference in its entirety.

BACKGROUND

Solar cells are electrical devices that convert light into electricity. Silicon solar cells may be capable of converting light with a wavelength greater than about 300 nanometers ("nm") and less than about 1100 nm to electricity. However, the conversion efficiency of silicon solar cells may be increasingly poor as the wavelength of light decreases from 1100 nm. Additionally, silicon solar cells may be unable to convert wavelengths of light above about 1100 nm to electricity because such wavelengths of light lack the energy required to overcome the band gap of silicon.

A tandem solar cell may have two individual solar cells stacked on top of one another. The bottom cell may be a silicon solar cell, and the top cell may be made of a different material. The top cell may have a higher band gap than the silicon solar cell. Accordingly, the top cell may be capable of efficiently converting shorter wavelengths of light to electricity. The top cell may be transparent to longer wavelengths of light, which may allow the underlying silicon solar cell to absorb and convert such longer wavelengths of light to electricity.

Optical losses at the interface between the top cell and the bottom cell and recombination losses in any of the layers of the top cell or bottom cell may result in a lower efficiency cell. Additionally, tandem solar cells may be difficult to manufacture.

SUMMARY

The present disclosure describes tandem silicon-perovskite solar modules and manufacturing methods thereof. A tandem silicon-perovskite solar module as described herein may have a bottom silicon solar cell and a top perovskite solar cell. The perovskite solar cell may have a higher bandgap than the silicon solar cell. For example, the perovskite solar cell may have a bandgap of about 1.7 electron volts ("eV") and the silicon solar cell may have a bandgap of about 1.1 eV. Accordingly, the perovskite solar cell may be capable of efficiently converting shorter wavelengths of light to electricity. The perovskite solar cell may be transparent to longer wavelengths of light, which may allow the underlying silicon solar cell to absorb and convert such longer wavelengths of light to electricity. Together, the perovskite solar cell and the silicon solar cell may be capable of efficiently converting a wider spectrum of light to electricity than a single solar cell (i.e., there may be less thermalization loss in a tandem cell than in a single cell solar module resulting in a higher full spectrum efficiency). The addition of perovskite solar cells can improve the resultant solar modules by decreasing cost, improving performance per weight of the module, improve overall performance of the module, and the like.

The silicon solar cell may be a monocrystalline or multicrystalline silicon solar cell. The silicon solar cell may be a component of a conventional solar panel. The solar panel may have a back sheet on which the silicon solar cell is disposed. An encapsulant may cover the top of the silicon solar cell to prevent it from being exposed to dust and moisture. The solar panel may also have a top glass sheet that provides additional protection to the silicon solar cell.

The perovskite solar cell may be deposited on the bottom surface of the top glass sheet. This may differ from the construction of conventional tandem solar modules in which a perovskite cell is merely disposed on top of a silicon wafer. Depositing the perovskite solar cell on the bottom surface of the top glass sheet may allow manufacturers to incorporate perovskite solar cells into their conventional silicon solar panels with no re-tooling or process changes. Instead, such manufacturers can merely substitute a conventional glass sheet with the perovskite glass sheet. This disclosure may refer to the perovskite glass sheet as "active glass."

The perovskite solar cell may have a first transparent conducting oxide ("TCO") layer deposited on the top glass sheet, a hole transport layer ("HTL") deposited on the first TCO layer, a perovskite layer deposited on the HTL, an electron transport layer ("ETL") deposited on the perovskite layer, and a second TCO layer deposited on the ETL. The first and second TCO layers may serve as terminals for the perovskite solar cell. The ETL and HTL may facilitate electron and hole transport, respectively, while inhibiting hole and electron transport, respectively. The perovskite layer can absorb light to generate charge carriers, which results in a voltage and current flow across the terminals of the perovskite solar cell.

The perovskite solar cell and the silicon solar cell may be electrically isolated from each other, and each cell may have its own terminals. That is, the tandem solar module may be a 4-terminal module. The perovskite solar cell and the silicon solar cell may be connected in series or parallel by connecting the terminals in the appropriate manner. In the case of a series connection, the perovskite solar cell and the silicon solar cell may be current-matched. In the case of a parallel connection, the perovskite solar cell and the silicon solar cell may be voltage-matched.

The present disclosure also describes methods for fabricating the active glass described above. An active glass may comprise a perovskite layer formed by applying the perovskite precursors individually, and subsequently annealing the precursors. A metallic lead layer can be deposited, followed by an inorganic halide layer (e.g., methylammonium iodide/formamidinium iodide), followed by a halide (e.g., iodine). By applying the various precursors in such a fashion, the same deposition equipment can be used for multiple layers, decreasing complexity and cost, and enabling high throughput manufacturing processes to be used. Additionally, the various ratios of the precursors can be tightly controlled, resulting in higher quality films. Also, a variety of different precursors for each layer can be deposited to improve film quality. For example, lead acetate can be applied on the lead layer to improve integration of the organic halides and halides into the lead layer. Similarly, different halides can be introduced to improve grain growth and other film properties. The perovskite precursors can be applied by a variety of techniques, including ultrasonic-spray on, blade-coating, slot-die coating and physical vapor deposition. Ultrasonic spray-on, when combined with multiple 'shower head' type nozzles, may provide for even and controlled application of precursors, which in turn can generate high quality films substantially free of defects.

The present disclosure also provides for methods of depositing the first and second TCO layers onto the perovskite solar cell. The TCO layers may be deposited on the perovskite solar cell via physical vapor deposition (PVD). The PVD of the TCO layers may occur in an inline manufacturing process. The inline manufacturing process may comprise multiple process chambers where deposition of selected target materials onto the perovskite solar cell occurs. The multiple process chambers may include a single conveyor belt which transports the perovskite solar cell throughout the multiple process chambers. The inline manufacturing process may limit the exposure of the perovskite solar cell to direct exposure of the deposition process and ultraviolet (UV) radiation and ultimately reduce the number of defects formed in the ETL and perovskite layers due to the TCO deposition process.

The present disclosure also provides for method of connecting the layers of a tandem solar module. The silicon and perovskite layers of a tandem module can be connected in different ways depending on the type of silicon solar cells used. The different methods of connecting can provide optimal performance for the various types of silicon solar cells. The present disclosure also provides a method of preparing a tandem solar module where the voltage output of the top perovskite and bottom silicon modules are matched. The method can include laser scribing a perovskite layer to form the perovskite solar cells. The laser scribing can be different for different bottom solar modules, as differences in the voltage output of various bottom modules can be accounted for in the generation of the perovskite solar cells. This level of control can improve efficiency by more closely matching the voltages between the modules to decrease wasted voltage. Additionally, a wider range of bottom modules can be used due to the flexibility offered by custom perovskite solar cell sizes.

In one aspect, the present disclosure provides a device, comprising: a silicon solar cell having a first band gap; a glass sheet covering the silicon solar cell, wherein the glass sheet comprises a top surface and a bottom surface; and a perovskite solar cell having a second band gap, wherein the perovskite solar cell is deposited on the bottom surface of the glass sheet. In some embodiments, the silicon solar cell is electrically isolated from the perovskite solar cell. In some embodiments, the silicon solar cell comprises two terminals and the perovskite solar cell comprises two terminals. In some embodiments, the perovskite solar cell comprises a photoactive perovskite layer, wherein the photoactive perovskite layer comprises $CH_3NH_3PbX_3$ or $H_2NCHNH_2PbX_3$. In some embodiments, X comprises iodide, bromide, chloride, or a combination thereof. In some embodiments, the perovskite solar cell comprises a first transparent conductive oxide (TCO) layer and a second TCO layer. In some embodiments, the first TCO layer and the second TCO layer are terminals of the perovskite solar cell. In some embodiments, the first TCO layer and the second TCO layer comprise indium oxide. In some embodiments, the perovskite solar cell comprises an electron transport layer (ETL) comprising phenyl-C61-butyric acid methyl ester. In some embodiments, the perovskite solar cell comprises a hole transport layer (HTL) comprising nickel oxide. In some embodiments, the device further comprises a plurality of silicon solar cells including the silicon solar cell and a plurality of perovskite solar cells including the perovskite solar cell, wherein the plurality of perovskite solar cells is laser scribed in the top glass sheet so as to voltage-match or current-match the plurality of perovskite solar cells to the plurality of silicon solar cells. In some embodiments, the top glass sheet has a surface area that substantially corresponds to a surface area of a 60- or 72-cell solar panel. In some embodiments, the top surface of the top glass sheet comprises an anti-reflective coating. In some embodiments, the top surface of the top glass sheet comprises polydimethylsiloxane (PDMS). In some embodiments, the PDMS comprises 1:10 alumina PDMS, textured 1:50 alumina PDMS, or textured PDMS. In some embodiments, the bottom surface of the top glass sheet has a textured surface. In some embodiments, the device further comprises an encapsulant disposed between the silicon solar cell and the perovskite solar cell. In some embodiments, the encapsulant is selected from the group consisting of ethylene-vinyl-acetate ("EVA"), thermal plastic polyolefin ("TPO"), PDMS, silicone, and paraffin. In some embodiments, the silicon solar cell and the perovskite solar cell are connected electrically in parallel. In some embodiments, the silicon solar cell and the perovskite solar cell are connected electrically in series. In some embodiments, the second bandgap is between about 1.5 and 1.9 electron volts (eV). In some embodiments, the device has a power conversion efficiency of at least about 30%. In some embodiments, the silicon solar cell is selected from the group consisting of a monocrystalline solar cell, a polycrystalline solar cell, a passivated emitter rear contact (PERC) solar cell, an interdigitated back contact cell (IBC), and a heterojunction with intrinsic thin layer (HIT) solar cell.

In another aspect, the present disclosure provides a device comprising: a silicon solar cell having a first band gap; a perovskite solar cell having a second band gap, wherein the perovskite solar cell is disposed adjacent to the silicon cell, and wherein the device has a power conversion efficiency of at least about 26%. In some embodiments, the silicon solar cell is electrically isolated from the perovskite solar cell. In some embodiments, the silicon solar cell comprises two terminals and the perovskite solar cell comprises two terminals. In some embodiments, the perovskite solar cell comprises a photoactive perovskite layer, wherein the photoactive perovskite layer comprises $CH_3NH_3PbX_3$ or $H_2NCHNH_2PbX_3$. In some embodiments, X comprises iodide, bromide, chloride, or a combination thereof. In some embodiments, the perovskite solar cell comprises a first transparent conductive oxide (TCO) layer and a second TCO layer. In some embodiments, the first TCO layer and the second TCO layer are terminals of the perovskite solar cell. In some embodiments, the first TCO layer and the second TCO layer comprise indium oxide, indium tin oxide, or aluminum zinc oxide. In some embodiments, the perovskite solar cell comprises an electron transport layer (ETL) comprising phenyl-C61-butyric acid methyl ester or C60. In some embodiments, the perovskite solar cell comprises a hole transport layer (HTL) comprising nickel oxide. In some embodiments, the device further comprises an encapsulant disposed between the silicon solar cell and the perovskite solar cell. In some embodiments, the encapsulant is selected from the group consisting of ethylene-vinyl-acetate ("EVA"), thermal plastic polyolefin ("TPO"), PDMS, silicone, and paraffin. In some embodiments, the silicon solar cell and the perovskite solar cell are connected electrically in parallel. In some embodiments, the silicon solar cell and the perovskite solar cell are connected electrically in series. In some embodiments, the second bandgap is between about 1.5 and 1.9 electron volts (eV). In some embodiments, the silicon solar cell is selected from the group consisting of a monocrystalline solar cell, a polycrystalline solar cell, a passivated emitter rear contact (PERC) solar cell, an interdigitated back contact cell (IBC), and a heterojunction with intrinsic thin layer (HIT) solar cell.

In another aspect, the present disclosure provides a method for forming a transparent conductive layer of a solar cell, comprising: (a) using a deposition energy of at most about 0.6 Watts per square centimeter (W/cm$^2$), depositing a buffer layer of the transparent conductive layer on the solar cell; and (b) using a deposition energy of at most about 1 W/cm$^2$, depositing a bulk layer of the transparent conductive layer on the buffer layer. In some embodiments, (a) and (b) comprise a physical vapor deposition process. In some embodiments, buffer layer is at least 5 nanometers thick. In some embodiments, the method further comprises, prior to (a), depositing a silver layer on the solar cell. In some embodiments, the silver layer is at most about 10 angstroms thick. In some embodiments, the method further comprises annealing the transparent conductive layer.

In another aspect, the present disclosure provides a method for forming a perovskite layer of a solar cell, comprising: (a) depositing a metallic lead (Pb) layer on a top glass of the solar cell via physical vapor deposition; (b) applying a methylammonium iodide (MAI) or formamidinium iodide (FAI) layer on the metallic Pb layer via ultrasonic spray-on; and (c) exposing the MAI or FAI layer to iodine gas by translating a dispensing unit across the MAI or FAI layer, wherein the dispensing unit comprises a plurality of nozzles configured to provide the iodine gas. In some embodiments, the method further comprises, prior to (b), applying Pb salts to metallic lead layer. In some embodiments, the lead salts comprise one or more salts selected from the group consisting of lead (II) acetate, lead (II) chloride, lead (II) bromide, and lead (II) iodide. In some embodiments, the MAI or FAI layer comprises a methylammonium chloride (MACl) additive. In some embodiments, the method further comprises applying a phenylethylammonium iodide (PEAI) solution to the MAI or FAI layer. In some embodiments, (a)-(c) are performed in a chamber that is not reactive to the iodine gas. In some embodiments, the chamber is made of glass. In some embodiments, the chamber is made of titanium. In some embodiments, the method further comprises (d) performing one or more annealing operations to form the perovskite layer from the metallic Pb layer, the MAI or FAI layer, and the iodine gas. In some embodiments, the plurality of nozzles comprises one or more shower head nozzles.

In another aspect, the present disclosure provides a method for forming a perovskite layer of a solar cell, comprising: (a) using an ultrasonic dispensing unit comprising a plurality of nozzles to apply a lead halide layer comprising lead iodide, lead bromide, and lead chloride on the solar cell; and (b) using the ultrasonic dispensing unit to apply a methylammonium halide layer on the lead halide layer. In some embodiments, the lead halide layer comprises more lead chloride by weight than lead bromide.

In another aspect, the present disclosure provides a method, comprising: (a) providing a silicon solar module with a first voltage output, wherein the silicon solar module comprises a top glass panel; (b) forming a perovskite layer on the top glass panel; (c) fabricating one or more perovskite solar cells from the perovskite layer, wherein the one or more perovskite solar cells produce a voltage substantially matched to the voltage output of the silicon solar module; and (d) electrically connecting the silicon solar module to the one or more perovskite solar cells.

In some embodiments, the fabricating comprises use of a laser scribe to define the one or more perovskite solar cells. In some embodiments, the one or more perovskite solar cells are a plurality of perovskite solar cells. In some embodiments, the plurality of perovskite solar cells are connected in series. In some embodiments, the method further comprises applying a plurality of contacts to the one or more perovskite solar cells to electrically couple the one or more perovskite solar cells. In some embodiments, the method further comprises applying an encapsulant to the one or more perovskite solar cells. In some embodiments, the encapsulant is a thermal-plastic polyolefin. In some embodiments, the thermal-plastic polyolefin is ethyl-vinyl acetate. In some embodiments, the method further comprises applying an edge seal to the one or more perovskite solar cells.

In another aspect, the present disclosure provides a tandem solar module. The tandem solar module may comprise a silicon solar panel comprising (i) a plurality of silicon solar cells connected in series and (ii) a top glass sheet, wherein the plurality of silicon solar cells are connected in series and combined have a first open circuit voltage; a perovskite solar panel disposed on an underside of the top glass sheet of the silicon solar panel, wherein the perovskite solar panel comprises a plurality of segments, wherein each segment of the plurality of segments comprises a plurality of laser-scribed strips of perovskite, wherein the plurality of laser-scribed strips of perovskite within a segment are connected in series to generate a second open circuit voltage that is substantially the same as the first open circuit voltage; and an interconnect connecting the plurality of silicon solar cells and the plurality of segments of the perovskite solar panel in parallel.

In some embodiments, the plurality of segments comprises from about 10 to about 200 segments. In some embodiments, the silicon solar panel is a top contact solar panel, an integrated back contact solar panel, or a shingled solar panel. In some embodiments, the silicon solar panel and the perovskite solar panel are connected to a same junction box. In some embodiments, the silicon solar panel and the perovskite solar panel have a substantially similar area. In some embodiments, the plurality of laser-scribed strips of perovskite are connected via a P1/P2/P3 scheme.

In another aspect, the present disclosure provides a perovskite layer, comprising: a composition of $MA_{n1}FA_{n2}Cs_{n3}PbX_3$, wherein MA is methylammonium, FA is formamidinium, n1, n2, and n3 are independently greater than 0 and less than 1, and n1+n2+n3=1, wherein a perovskite solar cell comprising the perovskite layer retains at least about 80% solar conversion efficiency after 300 hours of illumination under one sun conditions in an air atmosphere at >25° C. and <100° C.

In some embodiments, X is selected from the group consisting of fluorine, chlorine, bromine, and iodine. In some embodiments, X is a combination of two or more of fluorine, chlorine, bromine, and iodine. In some embodiments, n1 is from about 0.001 to about 0.05. In some embodiments, n3 is from about 0.001 to about 0.15. In some embodiments, the solar conversion efficiency is at least about 90% of the initial conversion efficiency value after 300 hours of illumination under one sun conditions. In some embodiments, the solar conversion efficiency is at least about 95% of the initial conversion efficiency value after 300 hours of illumination under one sun conditions. In some embodiments, the perovskite layer does not comprise additional additives.

In another aspect, the present disclosure provides a method, comprising: (a) providing a substrate; (b) applying a perovskite precursor to the substrate; (c) annealing the perovskite precursor to form a perovskite layer; wherein the perovskite layer has a composition of $MA_{n1}FA_{n2}Cs_{n3}PbX_3$, wherein n1, n2, and n3 are independently greater than 0 and less than 1 and n1+n2+n3=1, wherein a perovskite solar cell comprising the perovskite layer retains at least about 80% solar conversion efficiency after 300 hours of illumination under one sun conditions at >25° C. and <100° C.; and (d) subjecting the perovskite layer to an encapsulation lamination process at a temperature of at least about 120° C.

In some embodiments, the perovskite solar cell retains at least about 80% of the initial conversion efficiency value after the encapsulation lamination process. In some embodiments, the perovskite solar cell retains at least about 97% of the initial conversion efficiency value after the encapsulation lamination process. In some embodiments, the applying the perovskite precursor via an ultrasonic spray-on process. In some embodiments, the annealing process comprises heating the perovskite layer to a temperature of at least about 40-120° C.

In another aspect, the present disclosure provides a perovskite layer, comprising: a composition of $MA_{n1}FA_{n2}Cs_{n3}PbX_3$, wherein MA is methylammonium, FA is formamidinium, n1 is from about 0.01 to 0.03, n2 is from about 0.82 to 0.94, and n3 is from about 0.05 to 0.015, and n1+n2+n3=1.

In some embodiments, X is selected from the group consisting of fluorine, chlorine, bromine, and iodine. In some embodiments, X is a combination of two or more of fluorine, chlorine, bromine, and iodine. In some embodiments, the perovskite solar cell does not comprise additional additives.

Other aspects of the present disclosure provide methods of fabricating and manufacturing the devices and components described above and elsewhere in this disclosure Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIG. 10 schematically illustrates an integrated production flow for a perovskite photovoltaic, according to an embodiment;

DETAILED DESCRIPTION

Figure 1:
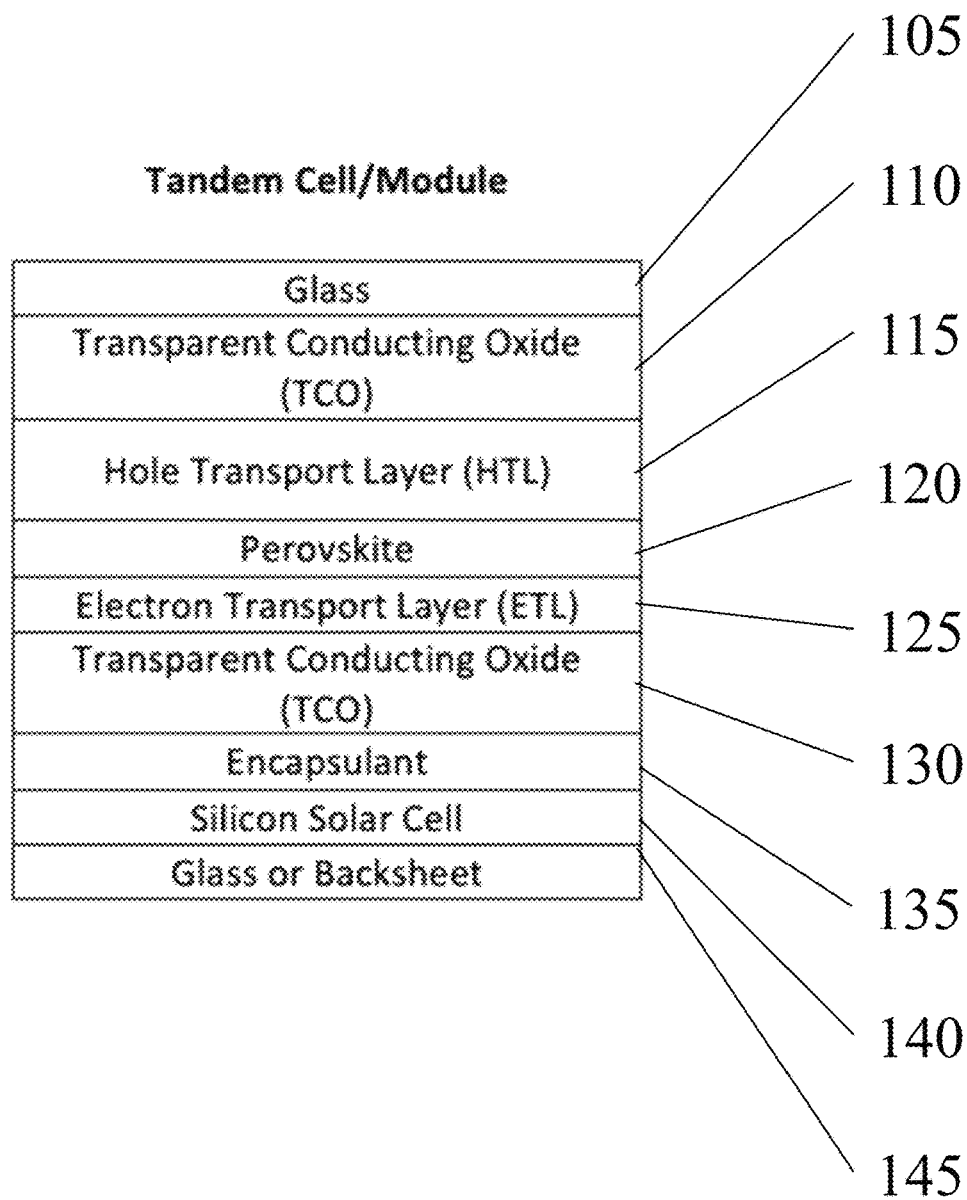
FIG. 1 schematically illustrates a tandem, 4-terminal, silicon-perovskite solar cell, according to an embodiment.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

The term "solar cell," as used herein, generally refers to a device that uses the photovoltaic effect to generate electricity from light.

The term "tandem," as used herein, refers to a solar module with two solar cells that are stacked on top of one another.

The term "4-terminal," as used herein, refers to a tandem solar module in which the top and bottom solar cells each have two accessible terminals.

The term "perovskite," as used herein, generally refers to a material with a crystal structure similar to calcium titanium oxide and one that is suitable for use in perovskite solar cells. The general chemical forum for a perovskite material is $ABX_3$. Examples of perovskite materials include methylammonium lead trihalide (i.e., $CH_3NH_3PbX_3$, where X is a halogen ion such as iodide, bromide, or chloride) and formamidinium lead trihalide (i.e., $H_2NCHNH_2PbX_3$, where X is a halogen ion such as iodide, bromide, or chloride).

The term "monocrystalline silicon," as used herein, generally refers to silicon with a crystal structure that is homogenous throughout the material. The orientation, lattice parameters, and electronic properties of monocrystalline silicon may be constant throughout the material. Monocrystalline silicon may be doped with phosphorus or boron, for example, to make the silicon n-type or p-type respectively.

The term "polycrystalline silicon," as used herein, generally refers to silicon with an irregular grain structure.

The terms "passivated emitter rear contact (PERC) solar cell," as used herein, generally refer to a solar cell with an extra dielectric layer on the rear-side of the solar cell. This dielectric layer may act to reflect unabsorbed light back to the solar cell for a second absorption attempt, and may additionally passivate the rear surface of the solar cell, increasing the solar cell's efficiency.

The terms "heterojunction with intrinsic thin layer solar cell (HIT) solar cell," as used herein, generally refer to a solar cell that is composed of a monocrystalline silicon wafer surrounded by ultra-thin amorphous silicon layers. One amorphous silicon layer may be n-doped, while the other may be p-doped.

The terms "an interdigitated back contact cell (IBC)," as used herein, generally refer to a solar cell comprising two or more electrical contacts disposed on the back side of the solar cell (e.g., on the side opposite the incident light). The two or more electrical contacts can be disposed adjacent to alternatingly n- and p-doped regions of the solar cell. An IBC may comprise a high-quality absorber material configured to permit carrier migration over a long distance.

The terms "bandgap" and "band gap," as used herein, generally refer to the energy difference between the top of the valence band and the bottom of the conduction band in a material.

The term "electron transport layer" ("ETL"), as used herein, generally refers to a layer of material that facilitates electron transport and inhibits hole transport in a solar cell. Electrons may be majority carriers in an ETL, while holes may be minority carriers. An ETL may be made of one or more n-type layers. The one or more n-type layers may include an n-type exciton blocking layer. The n-type exciton blocking layer may have a wider band gap than the photoactive layer of the solar cell (e.g., the perovskite layer) but a conduction band that is closely matched to the conduction band of the photoactive layer. This may allow electrons to easily pass from the photoactive layer to the ETL.

The n-type layer may be a metal oxide, a metal sulfide, a metal selenide, a metal telluride, amorphous silicon, an n-type group IV semiconductor (e.g., germanium), an n-type group III-V semiconductor (e.g., gallium arsenide), an n-type group II-VI semiconductor (e.g., cadmium selenide), an n-type group I-VII semiconductor (e.g., cuprous chloride), an n-type group IV-VI semiconductor (e.g., lead selenide), an n-type group V-VI semiconductor (e.g., bismuth telluride), or an n-type group II-V semiconductor (e.g., cadmium arsenide), any of which may be doped (e.g., with phosphorus, arsenic, or antimony) or undoped. The metal oxide may be an oxide of titanium, tin, zinc, niobium, tantalum, tungsten, indium, gallium, neodymium, palladium, cadmium, or an oxide of a mixture of two or more of such metals. The metal sulfide may be a sulfide of cadmium, tin, copper, zinc or a sulfide of a mixture of two or more of such metals. The metal selenide may be a selenide of cadmium, zinc, indium, gallium or a selenide of a mixture of two or more of such metals. The metal telluride may be a telluride of cadmium, zinc, cadmium or tin, or a telluride of a mixture of two or more of said metals. Other n-type materials may alternatively be employed, including organic and polymeric electron transporting materials, and electrolytes. Suitable examples include, but are not limited to, a fullerene or a fullerene derivative (e.g., phenyl-C61-butyric acid methyl ester, C60, etc.) or an organic electron transporting material comprising perylene or a derivative thereof.

The term "hole transport layer" ("HTL"), as used herein, generally refers to a layer of material that facilitates hole transport and inhibits electron transport in a solar cell. Holes may be majority carriers in an HTL, while electronics may be minority carriers. An HTL may be made of one or more p-type layers. The one or more p-type layers may include a p-type exciton blocking layer. The p-type exciton blocking layer may have a valence band that is closely matched to the valence band of the photoactive layer (e.g., the perovskite layer) of the solar cell. This may allow holes to easily pass from the photoactive layer to the HTL.

The p-type layer may be made of a molecular hole transporter, a polymeric hole transporter, or a copolymer hole transporter. For example, the p-type layer may be one or more of the following: nickel oxide, thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Additionally or alternatively, the p-type may comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), poly(3-hexylthiophene), poly[N,N-diphenyl-4-methoxyphenylamine-4',4''-diyl], sexithiophene, 9,10-bis(phenylethynyl)anthracene, 5,12-bis(phenylethynyl)naphthacene, diindenoperylene, 9,10-diphenylanthracene, PEDOT-TMA, PEDOT:PSS, perfluoropentacene, perylene, poly(pphenylene oxide), poly(p-phenylene sulfide), quinacridone, rubrene, 4-(dimethylamino)benzaldehyde diphenylhydrazone, 4-(dibenzylamino) benzaldehyde-N,Ndiphenylhydrazone or phthalocyanines.

Though described herein with respect to silicon-perovskite tandem solar modules, the methods and devices of the present disclosure may be used with any combination of solar cells with a perovskite layer. For example, the tandem solar module can be a tandem CdTe-perovskite solar module. In another example, the tandem solar module can be a dye sensitized solar cell-perovskite solar cell module.

FIG. 1 schematically illustrates a tandem, 4-terminal, silicon-perovskite solar module 100, according to an embodiment of the present disclosure. The solar module 100 may have a top glass sheet 105, a first TCO layer 110, an HTL 115, a perovskite layer 120, an ETL 125, a second TCO layer 130, an encapsulant 135, a silicon solar cell 140, and a back sheet 145.

The top glass sheet 105 may protect underlying layers of the solar module 100 from dust and moisture. The top glass sheet 105, and the solar module 100 as a whole, may have a form factor that corresponds to a conventional silicon solar panel. For example, the top glass sheet 105 may have a form factor that corresponds to a 32-cell, 36-cell, 48-cell, 60-cell, 72-cell, 96-cell, or 144-cell silicon solar panel. The top glass sheet 105 may have a thickness of at least about 2.0 millimeters (mm), 2.5 mm, 3.0 mm, 3.5 mm, 4.0 mm, 4.5 mm, 5.0 mm, or more. The top glass sheet 105 may have a thickness of at most about 5.0 mm, 4.5 mm, 4.0 mm, 3.5 mm, 3.0 mm, 2.5 mm, 2.0 mm, or less. The top glass sheet 105 may be transparent so as to allow light to access the underlying solar cells. In some cases, the top surface of the top glass sheet 105 may be covered with polydimethylsiloxane ("PDMS") (e.g., 1:10 alumina PDMS, textured 1:50 alumina PDMS, or textured PDMS), which may improve light trapping and refractive index matching. In some cases, the top surface of the top glass sheet 105 may be covered with an anti-reflective coating. In some cases, the bottom surface of the top glass sheet 105 may be textured in order to enable more light scattering back into the perovskite layer 120.

Together, the first TCO layer 110, the HTL 115, the perovskite layer 120, the ETL 125, and the second TCO layer 130 may form a perovskite solar cell. The perovskite solar cell may be disposed on the bottom surface of the top glass sheet 105 through fabrication methods that are described in reference to FIG. 3 through FIG. 10. The perovskite solar cell may have a higher bandgap than the silicon solar cell 140. For example, the perovskite solar cell may have a bandgap of about 1.30, 1.31, 1.32, 1.33, 1.34, 1.35, 1.36, 1.37, 1.38, 1.39, 1.40, 1.41, 1.42, 1.43, 1.44, 1.45, 1.46, 1.47, 1.48, 1.49, 1.50, 1.51, 1.52, 1.53, 1.54, 1.55, 1.56, 1.57, 1.58, 1.59, 1.60, 1.61, 1.62, 1.63, 1.64, 1.65, 1.66, 1.67, 1.68, 1.69, 1.70, 1.71, 1.72, 1.73, 1.74, 1.75, 1.76, 1.77, 1.78, 1.79, 1.80, 1.81, 1.82, 1.83, 1.84, 1.85, 1.86, 1.87, 1.88, 1.89, 1.90, 1.91, 1.92, 1.93, 1.94, 1.95, 1.96, 1.97, 1.98, 1.99, 2.00, 2.01, 2.02, 2.03, 2.04, 2.05, 2.06, 2.07, 2.08, 2.09, 2.10, or greater electron volts ("eV"). In contrast, the silicon solar cell may have a bandgap of about 1.1 eV. Accordingly, the perovskite solar cell may be capable of efficiently converting shorter wavelengths of light to electricity. The perovskite solar cell may be transparent to longer wavelengths of light, which may allow the underlying silicon solar cell to absorb and convert such longer wavelengths of light to electricity. Together, the perovskite solar cell and the silicon solar cell may be capable of efficiently converting a wider spectrum of light to electricity than a single solar cell.

The first TCO layer 110 may be disposed directly on the top glass sheet 105. Depositing the first TCO layer 110 directly on the top glass sheet 105 may prevent damage to the HTL 115 and the perovskite layer 120. The first TCO layer 110 may serve as the positive terminal or cathode of the perovskite solar cell. The first TCO layer 110 may have a thickness of at least about 100 nanometers (nm), 200 nm, 300 nm, 400 nm, 500 nm, 600 nm, 700 nm, 800 nm, 900 nm, 1 micrometer, or more. The first TCO layer 110 may have a thickness of at most about 1 micrometer, 900 nm, 800 nm, 700 nm, 600 nm, 500 nm, 400 nm, 300 nm, 200 nm, 100 nm, or less. The first TCO layer 110 may be made of indium tin oxide (ITO). The first TCO layer 110 may be made of doped ITO. The TCO layer may have a resistance of at least about 1, 2, 3, 4, 5, 6, 7, 8, 9, 10, 11, 12, 13, 14, 15, 16, 17, 18, 19, 20, 21, 22, 23, 24, 25, or more Ohm/square meter. The TCO layer may have a resistance of at most about 25, 24, 23, 22, 21, 20, 19, 18, 17, 16, 15, 14, 13, 12, 11, 10, 9, 8, 7, 6, 5, 4, 3, 2, 1, or less Ohm/square meter The HTL 115 may be disposed on the TCO layer 110. The HTL 115 may facilitate the transport of holes from the perovskite layer 120 to the first TCO layer 110 without compromising transparency and conductivity. In contrast, the HTL 115 may inhibit electron transport. In some embodiments, the HTL 115 is made of one or more nickel oxide layers. In other embodiments, the HTL 115 is made of another appropriate p-type material described in this disclosure. The HTL 115 may have a thickness of at least about 5 nm, 10 nm, 20 nm, 50 nm, 100 nm, 200 nm, 300 nm, 400 nm, 500 nm, 600 nm, 700 nm, 800 nm, 900 nm, 1 micrometer, or more. The HTL 115 may have a thickness of at most about 1 micrometer, 900 nm, 800 nm, 700 nm, 600 nm, 500 nm, 400 nm, 300 nm, 200 nm, 100 nm, 50 nm, 20 nm, 10 nm, 5 nm, or less.

The perovskite layer 120 may be disposed on the HTL 115. The perovskite layer 120 may be the photoactive layer of the perovskite solar cell. That is, the perovskite layer 120 may absorb light and generate holes and electrons that subsequently diffuse into the HTL 115 and the ETL 125, respectively. In some embodiments, the perovskite layer 120 is made of methylammonium lead triiodide, methylammonium lead tribromide, methylammonium lead trichloride, or any combination thereof. In other embodiments, the perovskite layer 120 is made of formamidinium lead triiodide, formamidinium lead tribromide, formamidinium lead trichloride, or any combination thereof. In other embodiments, the perovskite layer 120 is made of cesium lead triiodide, cesium lead tribromide, cesium lead trichloride, or any combination thereof. In some embodiments, the perovskite layer may be a triple cation perovskite material with formamidinium, methylammonium, and cesium cations in different ratios. Incorporating cesium into the perovskite lattice provides enhanced thermodynamic stability. The bandgap of the perovskite layer 120 may be tuned by adjusting the halide content of the methylammonium lead trihalide or formamidinium lead trihalide. The perovskite layer 120 may have a thickness of at least about 250 nm, 300 nm, 400 nm, 500 nm, 600 nm, 700 nm, 800 nm, 900 nm, 1 micrometer, 1.25 micrometers, 1.5 micrometers, 1.75 micrometers, 2 micrometers, or more. The perovskite layer 120 may have a thickness of at most about 2 micrometers, 1.75 micrometers, 1.5 micrometers, 1.25 micrometers, 1 micrometer, 900 nm, 800 nm, 700 nm, 600 nm, 500 nm, 400 nm, 300 nm, 250 nm, or less.

The ETL 125 may be disposed on the perovskite layer 120. The ETL 125 may facilitate the transport of electrons from the perovskite layer 120 to the second TCO layer 130 without compromising transparency and conductivity. In contrast, the ETL 115 may inhibit electron transport. In some embodiments, the ETL 125 is made of phenyl-C61-butyric acid methyl ester ("PCBM"). In other embodiments, the ETL 125 is made of another appropriate n-type material described in this disclosure (e.g., C60). The ETL 115 may have a thickness of at least about 10 nm, 20 nm, 30 nm, 40 nm, 50 nm, 60 nm, 70 nm, 80 nm, 90 nm, 100 nm, 200 nm, 300 nm, 400 nm, 500 nm, or more. The ETL 115 may have a thickness of at most about 500 nm, 400 nm, 300 nm, 200 nm, 100 nm, 90 nm, 80 nm, 70 nm, 60 nm, 50 nm, 40 nm, 30 nm, 20 nm, 10 nm, or less. The interface between the ETL and the perovskite layer may be important to the performance of the perovskite layer. The surface of the perovskite layer may be hydrophilic to enable good coverage of a hydrophilic ETL (e.g., PCBM). The combination of environment (e.g., low humidity<15%, low temperature from 18 to 24 degrees Celsius) and solvent compatibility may impact the quality of the perovskite layer-ETL connection.

The second TCO layer 130 may be disposed on the ETL 125. The second TCO layer 130 may serve as the negative terminal or anode of the perovskite solar cell. The second TCO layer 130 may have a thickness of at least about 100 nm, 200 nm, 300 nm, 400 nm, 500 nm, 600 nm, 700 nm, 800 nm, 900 nm, 1 micrometer, or more. The second TCO layer 130 may have a thickness of at most about 1 micrometer, 900 nm, 800 nm, 700 nm, 600 nm, 500 nm, 400 nm, 300 nm, 200 nm, 100 nm, or less. The second TCO layer 110 may be made of indium oxide (ITO). The second TCO layer 110 may be made of doped ITO.

The encapsulant 135 may be disposed between the second TCO layer 130 of the perovskite solar cell and the silicon solar cell 140. The encapsulant 135 may prevent the perovskite solar cell and the silicon solar cell 140 from being exposed to dust and moisture. The encapsulant 135 may electrically isolate the perovskite solar cell from the silicon solar cell 140. The encapsulant 135 may have a high refractive index (e.g., a refractive index greater than 1.4) that matches the refractive index of the TCO layer 130 of the perovskite solar cell and the top silicon nitride or TCO layer of the silicon solar cell 140. Thus of a high refractive index material may decrease transmission losses between the TCO layer 130, encapsulant 135, and silicon solar cell 140, resulting in improved current density of the solar module 100. The user of a high refractive index material may also improve light trapping. The high refractive index material may be ethylene-vinyl-acetate ("EVA"), thermal plastic polyolefin ("TPO"), PDMS, silicone, paraffin, or the like. Example 1 and FIG. 9, which are described below, show the improvements achieved by using certain high refractive index materials in the encapsulant 135. The encapsulant may be the TCO layer. For example, the TCO layer may cover the perovskite layer such that the TCO layer protects the perovskite layer from external conditions (e.g., water, oxygen, etc.). In this example, the reliability of the integrated tandem module can be improved through use of the TCO layer as the encapsulant. The encapsulant may comprise ethylene-vinyl-acetate ("EVA"), thermal plastic polyolefin ("TPO"), PDMS, silicone, paraffin, or the like. The encapsulation layer may isolate both the perovskite solar cell and the silicon solar cell from the surrounding environment. For example, the encapsulant may encapsulate both the perovskite layer and the silicon layer simultaneously. The encapsulant layer may be configured to prevent volatilization of one or more components of the perovskite layer. For example, the encapsulant can minimize loss of organic cations (e.g., methylammonium, formamidinium, etc.) due to heating of the perovskite layer. In another example, the encapsulant can reduce the egress of chemical species from the perovskite layer such as lead iodide or other lead halides, the egress of which can result in degraded reliability of the integrated tandem module. The encapsulant may be treated to have sufficient cross linking to protect the perovskite layer from water, oxygen, volatilization of the organic compounds of the perovskite layer, or the like, or any combination thereof. The encapsulant may have a cross linked percentage of at least about 50, 60, 70, 80, 90, 95, or more percent. The encapsulant may have a cross linked percentage of at most about 95, 90, 80, 70, 60, 50, or less percent.

In general, the silicon solar cell 140 may be a p-type silicon solar cell with a p-type substrate covered by a thin n-type layer ("emitter"), or it may be an n-type silicon solar cell with an n-type substrate covered by a thin p-type emitter. The silicon solar cell 140 may be a monocrystalline silicon solar cell, a polycrystalline silicon solar cell, a PERC silicon solar cell, a HIT silicon solar cell, an interdigitated back contact cell (IBC), or the like.

The silicon solar cell 140 may have a back sheet 145. The back sheet 145 may seal the solar module 100 to prevent moisture ingress. In some cases, the back sheet 145 may be a glass sheet with a top surface and a bottom surface. The top surface of the glass sheet may have a highly reflective coating or textured surface in to further increase light trapping or scattering back in the silicon solar cell 140 and the perovskite layer 120. The glass sheet may be transparent. The glass sheet may be substantially transparent. The transparency of the glass sheet may facilitate bifacial operation of the solar cell. For example, the solar cell can be configured to absorb light from both sides of the solar cell.

The perovskite solar cell and the silicon solar cell 140 may be electrically isolated from each other, and each cell may have its own terminals. That is, the tandem solar module may be a 4-terminal module. The perovskite solar cell and the silicon solar cell 140 may be connected in series or parallel by connecting the terminals in the appropriate manner. In the case of a series connection, the perovskite solar cell and the silicon solar cell may be current-matched. In the case of a parallel connection, the perovskite solar cell and the silicon solar cell may be voltage-matched. Laser scribing can be used to achieve the current matching or voltage matching, e.g., by connecting individually scribed perovskite solar cells in series or parallel to achieve a desired voltage or current. Parallel or series connection between the perovskite solar cells and the silicon solar cell can be made via busbars/electrodes before module lamination. This allows rapid and easy introduction into any existing silicon manufacturing process.

The solar module 100 may have a power conversion efficiency of at least about 25%, 26%, 27%, 28%, 29%, 30%, or more.

Figure 2:
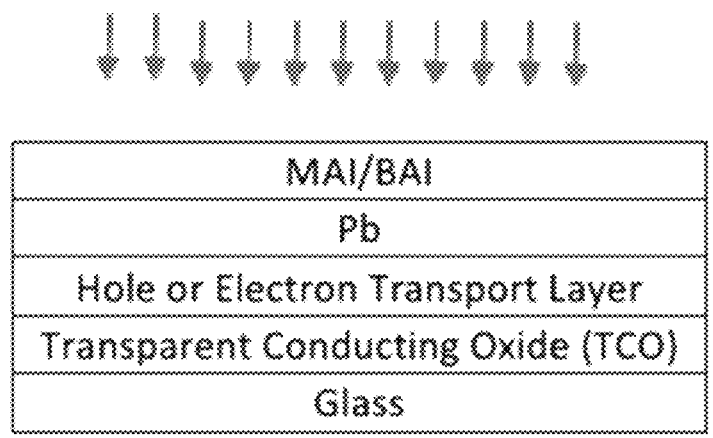
FIG. 2 schematically illustrates the formation of a perovskite layer of a solar cell, according to an embodiment.

FIG. 2 schematically illustrates how the perovskite layer 120 of FIG. 1 may be formed. A metallic Pb layer may be deposited on the HTL via physical vapor deposition. Next, a methylammonium iodide (MAI) or formamidinium iodide (FAI) may be applied to the metallic Pb layer. Finally, the MAI or FAI may be exposed to iodine gas to form the perovskite layer 120, which may be methylammonium lead triiodide or formamidinium lead triiodide. This and other fabrication processes will be described in more detail in subsequent figures.

TCO Fabrication

The first TCO layer 110 and the second TCO layer 130 may serve as electrical contacts for the perovskite solar cell while maintaining the semi-transparency of the perovskite solar cell so that the underlying silicon solar cell 140 can still absorb light. A physical vapor deposition (PVD) process may be used to fabricate the first TCO layer 110 and the second TCO layer 130. The PVD process may be tuned such that the resulting TCO layer is transparent to light (e.g., light with a wavelength from 300 nanometers ("nm") to 1200 nm for the second TCO layer). For example, the argon pressure and deposition power of the PVD process may be tuned accordingly. For example, the argon pressure can be at about 1 to about 5 millitorr, and the deposition power can be about 20 watts to about 100 watts. Additionally, the thickness of the first TCO layer 110 and the second TCO layers 130 can be set to achieve such transparency. Such transparency may allow the underlying silicon solar cell 140 to absorb as much light as possible that was not already absorbed by the perovskite layer 120, which typically absorbs light with a wavelength from 300 nm to 700 nm.

In fabricating the second TCO layer 130, the PVD process may tend to create defects in the ETL 125 and the perovskite layer 120 due the ultraviolet light and argon/oxygen ions generated by the plasma during the process. Such defects may degrade the performance of the perovskite layer 120 as an electron-hole pair absorber. For example, the perovskite layer 120 may exhibit a lower open circuit voltage and a lower fill factor as the result of such defects. It may be beneficial to minimize the creation of such defects.

In one embodiment, the damage described above can be minimized by first creating a buffer layer of TCO on the ETL 125 through a low-power PVD process. The power during the low-power PVD process may be at most about 0.60, 0.55, 0.50, 0.45, 0.40, 0.35, 0.30, 0.25, 0.20, 0.15, 0.10, 0.05, or less Watts per square centimeter ("$W/cm^2$"). The buffer layer may be at least about 5, 10, 15, 20, 25, 30, 35, 40, 45, 50, 55, 60, 65, or more nm thick. The buffer layer may be at most about 65, 60, 55, 50, 45, 40, 35, 30, 25, 20, 15, 10, 5, or less nm thick. The ultraviolet damage is normally generated by high power ions that penetrate deep into the bulk of the ETL 125 and the perovskite layer 120, breaking or damaging molecular bonds and causing degradation in both the open circuit voltage and series resistance. The use of a low-power PVD to create the buffer layer may block high energy ions in subsequent process steps from reaching the ETL 125 and the perovskite layer 125.

A bulk layer of TCO may be deposited on the buffer layer of TCO at a deposition energy of at most 1.00, 0.95, 0.90, 0.85, 0.80, 0.75, 0.70, 0.65, 0.60, 0.55, 0.50, 0.45, or less $W/cm^2$.

In some cases, an ultrathin layer of silver may be deposited at the interface between the ETL 125 and the second TCO layer 130 through an evaporation, sputtering, or atomic layer deposition. The ultrathin layer of silver may be at most about 20, 19, 18, 17, 16, 15, 14, 13, 12, 11, 10, 9, 8, 7, 6, 5, 4, 3, 2, or 1 angstroms thick. The ultrathin layer of silver may act as a barrier against ultraviolet light or plasma during PVD of the second TCO layer 130. In some cases, a post-anneal may be performed on the second TCO layer to partially repair some of the damage caused by the ultraviolet light or plasma during the PVD process. The post-anneal may be performed at 100-140 degrees Celsius for 2 to 4 minutes.

A bulk layer of TCO may be deposited on the buffer layer of TCO at a deposition energy of at most 0.90, 0.85, 0.80, 0.75, 0.70, 0.65, 0.60, 0.55, 0.50, 0.45, or less $W/cm^2$.

Conventionally, the physical vapor deposition process described above may be performed in a chamber that has a shutter disposed between the sputtering source and the target substrate. The shutter may quickly actuate (i.e., open and close) in order to shield the target substrate from the sputtering source for short periods of time. The abrupt nature of the shutter may result in the sensitive perovskite and transport layers being damaged by ion impacts and exposure to UV radiation. Additionally, the entire target substrate is subjected to the whole sequence of TCO deposition, which may be minutes long to achieve a thickness on the order of 300-900 nm to meet sheet resistance and transmission requirement. As such, the physical vapor deposition process may intrinsically cause larger than expected ion and UV damage to the target substrate, which may result in defects and recombination sites in the layers of the target substrate, degrading its electrical performance as an electron-hole pair absorber layer.

Figure 14:
FIG. 14 illustrates a horizontal inline manufacturing system, according to an embodiment.

To address the shortcomings of conventional physical vapor deposition processes, the TCO layers 110 and 130 may instead be fabricated in an inline manufacturing process. The inline manufacturing process may be performed in multiple process chambers where deposition of selected target materials occurs. A conveyor belt can transport the target substrate between the multiple process chambers. The inline manufacturing process may provide for the deposition of TCO layers while maintaining low resistivity, good transmission, and uniform thickness of the perovskite solar cell. The inline manufacturing process can be a vertical or horizontal process. An example of a horizontal inline manufacturing system is illustrated in FIG. 14.

The inline manufacturing process may reduce the defects formed in the ETL 125 and the perovskite layer 120 due the ultraviolet light and argon/oxygen ions generated by the plasma during the TCO physical vapor deposition process. Utilization of a moving conveyor belt in the multiple process chambers may reduce the defects formed in the ETL 125 and the perovskite layer 120. The multiple chamber system may minimize the amount of time the target substrate is exposed to plasma deposition. The target substrate may only be exposed to deposition in certain chambers. For example, the target substrate may not be exposed to deposition in a buffer chamber, whereas the target substrate is exposed to deposition in process chambers where the first and second TCO layers are fabricated. In some embodiments, a target substrate containing the top glass sheet 105, the first TCO layer 110, the HTL 115, the perovskite layer 120, and the ETL 125 is loaded onto the conveyor belt of the inline PVD manufacturing tool. The conveyor transports the target substrate into a target chamber, with the ETL layer 125 facing the TCO source for TCO deposition. Depending on the desired thickness and composition of the second TCO layer and the throughput of the TCO source, there may be one or multiple target substrates inside the chamber at a time or multiple chambers with a single target substrate. Each chamber may be separated by gates to minimize cross-contamination and to minimize damage due to plasma exposure. In some cases, the target substrate passes through a first deposition chamber for deposition of a buffer layer of ITO. Then the substrate passes through a buffer chamber, and finally through a second deposition chamber for deposition of a bulk layer of ITO. The buffer chamber may prevent cross-contamination between the first deposition chamber and the second deposition chamber if, for example, the composition or deposition parameters of the two ITO layers are different.

To further reduce direct exposure to deposition, a moving target substrate on the conveyor belt ensures that each portion of the target substrate is only subject to direct exposure to deposition until that portion of the target substrate moves past the deposition area. The amount of time each portion of the target substrate is exposed to direct deposition depends on the speed of the conveyor belt. The speed of the conveyor belt can be adjusted to minimize the amount of time each portion of the substrate is subjected to direct exposure while still ensuring each layer is sufficiently deposited on the target substrate. The moving conveyor belt provides a more gradual deposition profile on the target substrate, in contrast to the more abrupt profile generated by a conventional shutter.

The multiple chambers may also include shields, or other blocking obstacles, between chambers to ensure ions and UV exposure in other chambers are blocked when the target substrate enters a chamber with no deposition. The multiple chambers may also comprise shields around the deposition area to block ions and UV radiation from areas of the substrate that are not directly exposed to the deposition. Further, the multiple chamber system allows for TCO layer deposition at uniform thickness and at much lower plasma power without compromising deposition duration.

The inline manufacturing process can also implement the techniques mentioned above (e.g., optimizing process parameters like gas flow/pressure, deposition power, thickness and materials, use of a buffer layer, lowering deposition energy, use of an ultrathin layer of silver, and use of an annealing process) when fabricating the second TCO layer to further reduce the defects formed in the ETL 125 and the perovskite layer 120. The process limits the number of defects both at the interface between the second TCO layer 130 and the ETL 125, and in the bulk of the ETL 125 and the perovskite layer 120. Other examples of process parameters may include, but are not limited to, chemical formation parameters (e.g., solvent composition, presence or absence of additives, one-operation formulations, two-operation formulations, etc.), ultrasonic spray on process parameters (e.g., spray volume, spray speed, ultrasonic power, lateral speed of the substrate, nozzle height, nozzle width, nozzle angle, environmental factors, humidity, atmospheric composition, temperature, etc.), slot-die or blade coating parameters (e.g., deposition volume, slot size, lateral speed of the substrate, pressure of the applicator on the substrate, etc.), gas-blade parameters (e.g., air-blade parameters) (e.g., gas pressure, gas temperature, height of gas blade, angle of gas blade, substrate lateral speed, presence or absence of ambient particles, etc.), post application treatment parameters (e.g., dry duration, rinse duration, exterior environmental parameters, solvent chemistry, anneal time, anneal temperature, etc.), transport layer application parameters (e.g., application type, surface conditions, layer thickness, layer conformality, etc.), or the like, or any combination thereof. A slot-die coating may comprise use of a slot through which a material (e.g., perovskite precursor solution) may be passed to deposit the material onto a substrate. An example of a slot-die apparatus may be a nRad2™ system produced by nTact™. A gas-blade system may be configured to provide a stream of a gas in a controlled manner. For example, a gas-blade system can provide a sheet of pressurized gas over an area. An example of a gas-blade system may be an air-knife.

Figure 3:
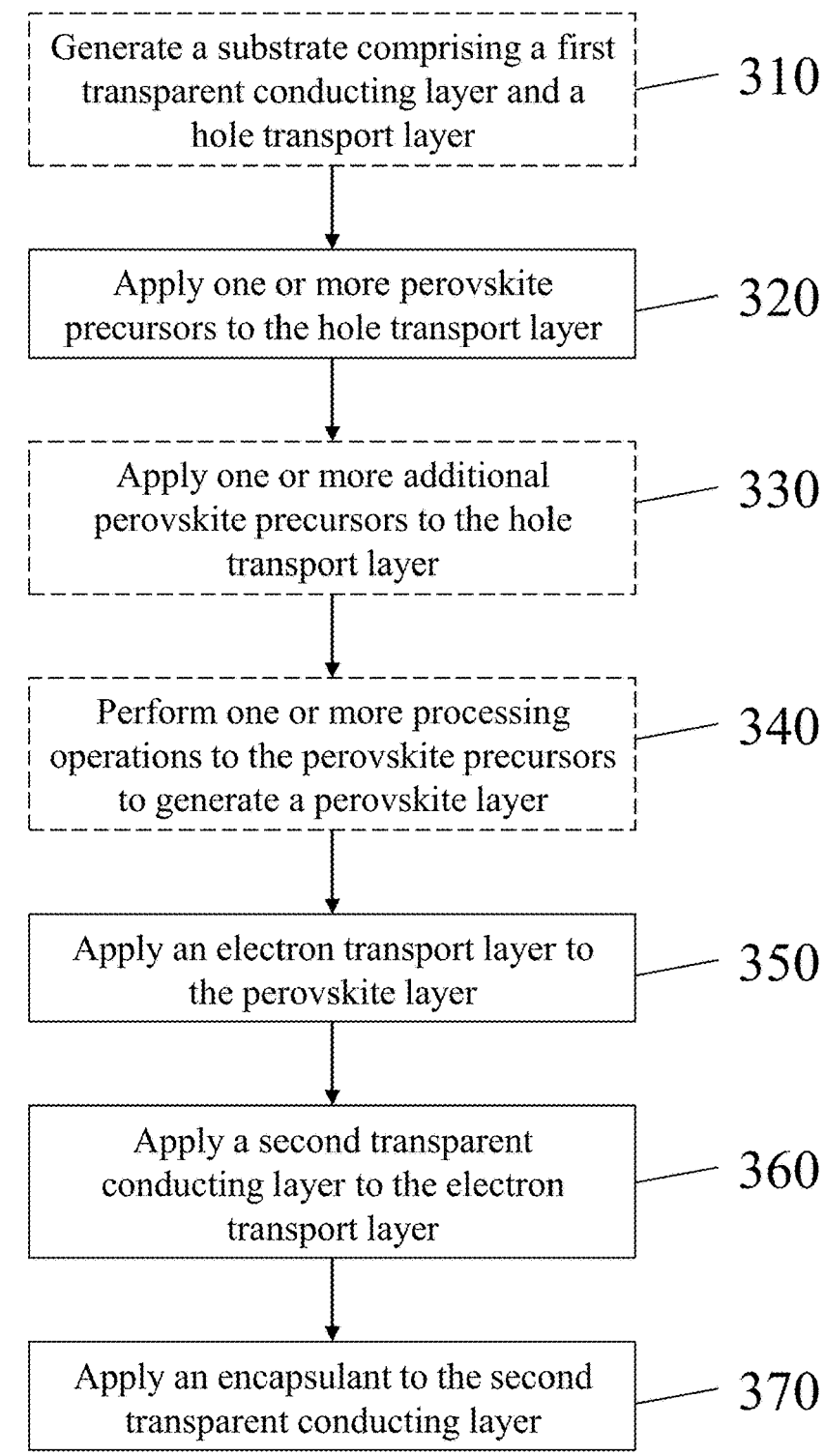
FIG. 3 is a flow chart of a fabrication process for forming a perovskite photovoltaic, according to an embodiment of the present disclosure.

FIG. 3 is a flow chart of a fabrication process 300 for forming a perovskite photovoltaic. The process 300 may optionally comprise generating a substrate comprising a first transparent conducting layer and a hole transport layer (310). In some cases, a pre-formed substrate may instead be provided.

Figure 4:
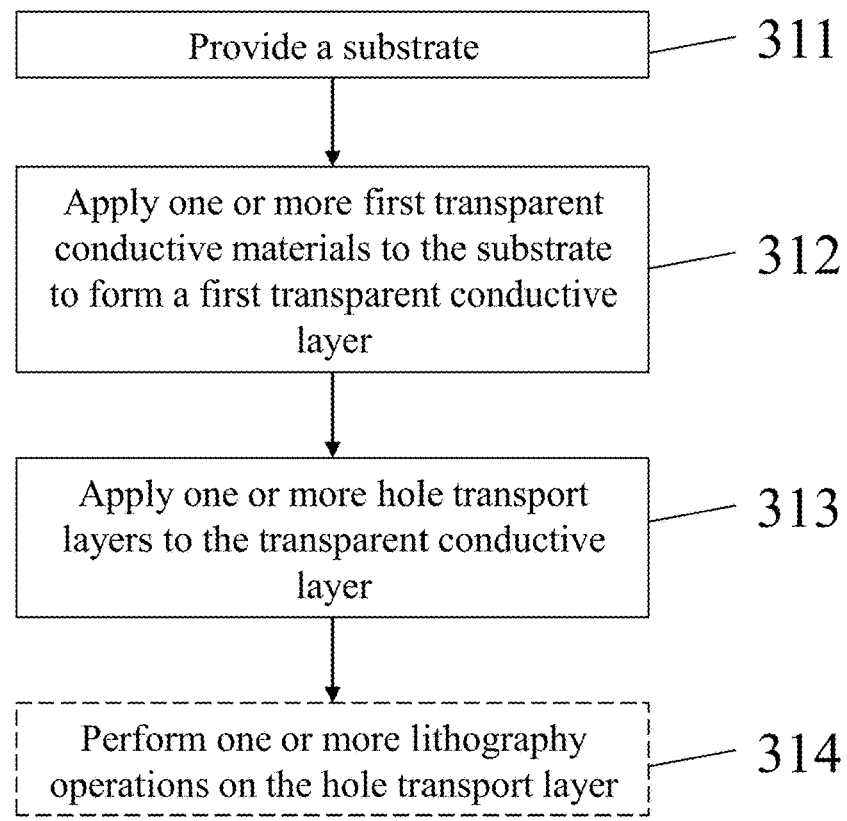
FIG. 4 is a flowchart of operation 310 of FIG. 3, according to an embodiment.

FIG. 4 is a flowchart of operation 310 of FIG. 3. Operation 310 may comprise providing a substrate (311). The substrate may be a transparent substrate. The substrate may comprise a silicon-based glass (e.g., an amorphous silicon dioxide, a doped silicon dioxide, etc.), a transparent conductive oxide, a ceramic, a chalcogenide glass, a polymer (e.g., a transparent plastic, poly(methyl methacrylate, etc.), or the like, or any combination thereof. The substrate may comprise a top surface of a solar module. For example, the substrate may be a top glass of a silicon solar panel assembly. The substrate may be textured and/or patterned. For example, the substrate may comprise nano-scale texturing configured as an antireflective coating and an adhesion surface. In another example, the substrate may comprise patterning configured to generate photonic channels. In another example, the substrate may comprise pre-patterned portions with electrodes for removing energy from the solar cell (e.g., a top contact grid layout). The substrate may have an area of at least about 0.1, 0.5, 1, 2, 3, 4, 5, 6, 7, 8, 9, 10, 11, 12, 13, 14, 15, 20, 25, or more square meters. The substrate may have an area of at most about 25, 20, 15, 14, 13, 12, 11, 10, 9, 8, 7, 6, 5, 4, 3, 2, 1, 0.5, 0.1, or fewer square meters. The substrate may be a large format substrate. For example, the substrate can be a $10^{th}$ generation substrate.

Operation 310 may comprise applying one or more first transparent conductive materials to the substrate to form a first transparent conductive layer (312). The first transparent conducting layer may comprise a transparent conductive oxide (e.g., indium tin oxide (ITO), indium zinc oxide, aluminum zinc oxide, indium cadmium oxide, etc.), a transparent conductive polymer (e.g., poly(3,4-ethylenedioxythiophene) (PEDOT), poly(3,4-ethylenedioxythiophene):poly(styrene sulfonate) (PEDOT:PSS), poly(4,4-dioctyl cyclopentadithiophene), etc.), carbon nanotubes, graphene, nanowires (e.g., silver nanowires), metallic grids (e.g., grid contacts comprising metals), thin films (e.g., thin metal films), conductive grain boundaries, or the like, or any combination thereof. The transparent conducting layer may have a full spectrum transparency of at least about 20%, 30%, 40%, 50%, 60%, 70%, 75%, 80%, 85%, 90%, 95%, 96%, 97%, 98%, 99%, 99.9%, or more. The transparent conducting layer may have a full spectrum transparency of at most about 99.9%, 99%, 98%, 97%, 96%, 95%, 90%, 85%, 80%, 75%, 70%, 60%, 50%, 40%, 30%, 20%, or less. The transparent conducting layer may have a full spectrum transparency in a range as defined by any two of the proceeding values. For example, the transparent conducting layer can have a full spectrum transparency of 75% to 85%. The transparent conducting layer may have a transparency over a spectral band of at least about 20%, 30%, 40%, 50%, 60%, 70%, 75%, 80%, 85%, 90%, 95%, 96%, 97%, 98%, 99%, 99.9%, or more. The transparent conducting layer may have a transparency over a spectral band of at most about 99.9%, 99%, 98%, 97%, 96%, 95%, 90%, 85%, 80%, 75%, 70%, 60%, 50%, 40%, 30%, 20%, or less. For example, the transparent conducting layer can have a transmission of 85% over the wavelength range from 400 nm to 1200 nm. The transparent conducting layer can function as a barrier to the perovskite layer for moisture, gas, dust, and the like. The transparent conducting layer can also prevent the diffusion of ions (e.g., metal ions) which may impact the performance of the perovskite layer. Methods for forming transparent conductive oxide layers are described elsewhere herein. For example, the transparent conducting oxide layers may be formed using the PVD and/or inline manufacturing processes described herein.

Operation 310 may comprise applying one or more hole transport layers to the transparent conductive layer (313). The one or more hole transport layers may be configured to shuttle holes from an absorbing layer to the transparent conductive layer and out of the solar module. The one or more hole transport layers may comprise organic molecules (e.g., 2,2',7,7'-Tetrakis[N,N-di(4-methoxyphenyl)amino]-9,9'-spirobifluorene (Spiro-OMeTAD)), inorganic oxides (e.g., nickel oxide ($NiO_x$), copper oxide ($CuO_x$), cobalt oxide ($CoO_x$), chromium oxide ($CrO_x$), vanadium oxide ($VO_x$), tungsten oxide ($WO_x$), molybdenum oxide ($MoO_x$), copper aluminum oxide ($CuAlO_2$), copper chromium oxide ($CuCrO_2$), copper gallium oxide ($CuGaO_2$), etc.), inorganic chalcogenides (e.g., copper iodide (CuI), copper indium sulfide ($CuInS_2$), copper zinc tin sulfide ($CuZnSnS_4$), cupper barium tin sulfide ($CuBaSnS_4$), etc.) other inorganic materials (e.g., copper thiocyanate (CuSCN), etc.), organic polymers, or the like, or any combination thereof. For example, a glass substrate covered in indium tin oxide can be coated with nickel oxide to form a hole transport layer on the transparent conducting layer.

Operation 310 may optionally comprise performing one or more lithography operations on the hole transport layer (314). The one or more lithography operations may comprise optical lithography (e.g., (extreme) ultraviolet lithography, x-ray lithography, laser scribing, etc.), electron beam lithography, ion beam lithography, nanoimprint lithography, other direct writing processes (e.g., dip-pen lithography, inkjet printing), or the like, or any combination thereof. For example, a plurality of features can be inscribed onto the hole transport layer using a laser scribe. The one or more lithography operations may comprise the addition and/or subtraction of features. For example, features can be cured and made permanent. In another example, features can be formed by the removal of material from the target.

Returning to FIG. 3, the process 300 may comprise applying one or more perovskite precursors to the hole transport layer (320). The applying may comprise chemical vapor deposition (CVD), plasma enhanced CVD, atomic layer deposition, spin coating, dip coating, doctor blading, drop casting, centrifugal casting, chemical solution deposition, sol-gel deposition, plating, physical vapor deposition, thermal evaporation, molecular beam epitaxy, sputtering, pulsed laser deposition, cathodic arc deposition, ultrasonic spray-on, inkjet printing, slot-die coating, or the like, or any combination thereof. The applying may comprise the application of a single perovskite precursor at a time. For example, a first perovskite precursor can be evaporated onto the hole transport layer, and subsequently a second perovskite precursor can be sprayed onto the first precursor. The applying may comprise applying a plurality of precursors at one time. For example, an inkjet printer can apply a solution comprising a plurality of precursors. The process 300 may optionally comprise applying one or more additional perovskite precursors to the hole transport layer (330). The additional perovskite layers may be applied in the same way as in operation 320. For example, a first precursor can be deposited by physical vapor deposition, and subsequently a second precursor can be deposited by physical vapor deposition. Alternatively, the additional perovskite layer may be applied in a different way from operation 320. For example, a first perovskite precursor can be deposited by physical vapor deposition while a second perovskite precursor can be deposited by ultrasonic spray. Operation 330 may be repeated a plurality of times. For example, a plurality of additional perovskite precursors can be applied to the hole transport layer in a plurality of operations.

The ultrasonic spray-on application may comprise the use of a plurality of spray nozzles. The ultrasonic spray-on process may comprise the use of a single spray nozzle. For example, the single spray nozzle can be configured to raster across the application area to provide coverage of the area. A plurality of different types of spray nozzles may be tested for formation of a predetermined uniformity and/or thickness of the film deposited by the spray nozzle, and an optimal spray nozzle may be selected from the plurality of different types of spray nozzles. Once an optimal spray nozzle is selected, a plurality of that type of nozzle may be used in the ultrasonic spray-on application. The plurality of nozzles may form a bank of nozzles configured to spray over a large area to improve throughput and efficiency. The bank of nozzles may be a strip of nozzles (e.g., a line of nozzles across a single dimension), a two-dimensional arrangement of nozzles (e.g., nozzles distributed over a rectangular shape), a three-dimensional arrangement of nozzles (e.g., a plurality of nozzles distributed in three dimensions). The spray nozzles may be adjusted to dispense at an angle. The angle may be at least about 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, or more degrees off of a parallel line from the substrate. The angle may be at most about 90, 85, 80, 75, 70, 65, 60, 55, 50, 45, 40, 35, 30, 25, 20, 15, 14, 13, 12, 11, 10, 9, 8, 7, 6, 5, 4, 3, 2, 1, or less degrees off of a parallel line from the substrate. The angle may be configured to reduce or eliminate the precursor missing the substrate and fouling other components of the manufacturing process. Use of an ultrasonic spray-on application can enable a roll to roll inline fabrication process. In the roll to roll inline fabrication process, a series of nozzle banks can each sequentially add different layers to a substrate, the substrate can be processed (e.g., annealed, laser scribed, etc.), and a finished photovoltaic cell can be generated on a single line. Using a roll to roll process can result in significant improvements in cost and speed of production as compared to step by step manufacture processes.

The one or more perovskite precursors may comprise one or more lead halides (e.g., lead fluoride, lead chloride, lead bromide, lead iodide, etc.), lead salts (e.g., lead acetates, lead oxides, etc.), other metal salts (e.g., manganese halides, tin halides, metal oxides, metal halides, etc.), organohalides (e.g., formamidinium chloride, formamidinium bromide, formamidinium iodide, methylammonium chloride, methylammonium bromide, methylammonium iodide, butylammonium halides, etc.), alkali metal salts (e.g., alkali metal halides, etc.), alkali earth metal salts (e.g., alkali earth metal halides, etc.), perovskite nanoparticles, or the like, or any combination thereof. A plurality of perovskite precursors can be used as the one or more perovskite precursors. For example, both methylammonium iodide and butylammonium iodide can be used as perovskite precursors. In this example, the methylammonium iodide can be at about a 1:99, 10:90, 20:80, 30:70, 40:60, 50:50, 60:40, 70:30, 80:20, 10:90, or 99:1 ratio with the butylammonium iodide. In another example, mixtures of lead halides can be used as a portion of the perovskite precursors. Using different mixtures of lead halides may permit tuning of the bandgap of the perovskite layer. For example, using different mixtures of lead (II) bromide and lead (II) iodide can result in different bandgaps. Using different amounts of lead (II) chloride can affect the crystal stability of the perovskite layer and can prevent phase segregation within the layer. The amount of lead (II) chloride added may be greater than the amount of lead (II) bromide added by weight. The amount of lead (II) chloride added may be less than the amount of lead (II) bromide added by weight. The amount of lead (II) chloride added may be the same as the amount of lead (II) bromide added by weight. The amount of lead (II) iodide soluble in a solution may be related to the amount of lead (II) bromide and lead (II) chloride in the solution. For example, adding in more lead (II) bromide and lead (II) chloride to a solution of lead (II) iodide can improve solubility of the lead (II) iodide and result in decreased particulate in the perovskite layer.

The one or more perovskite precursors may be one or more perovskite precursor solutions. For example, a lead (II) iodide solution in a solution of dimethyl sulfoxide can be a perovskite precursor. A perovskite precursor may be in a solution of at least about 0.1, 0.5, 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, 95, 99, or more weight percent perovskite precursor. A perovskite precursor may be in a solution of at most about 99, 95, 90, 85, 80, 75, 70, 65, 60, 55, 50, 45, 40, 35, 30, 25, 20, 15, 14, 13, 12, 11, 10, 9, 8, 7, 6, 5, 4, 3, 2, 1, 0.5, 0.1, or less weight percent perovskite precursor. The solution may comprise one or more solvents. Examples of solvents include, but are not limited to, polar solvents (e.g., water, dimethyl sulfoxide, dimethylformamide, N,N'-dimethylpropyleneurea, ethers, esters, acetates, acetone, etc.), non-polar solvents (e.g., hexanes, toluene, etc.), or the like, or any combination thereof. Proper mixing of the solvent as well as solvent composition can contribute to controlled solvent removal speeds and thus impact grain development as well as bulk defect formation. Tuning the interaction of the coordination strength of a solvent and the evaporation rate of a precursor solution can enable better control of the perovskite film that is formed as well as the reaction kinetics of the formation. For example, a weakly coordinating solvent that quickly evaporations may form a more disordered film, but may also result in less residual solvent being present in the film. Mixtures of solvents can improve solute solubility, decrease evaporation rates, improve performance of application methods, and the like. For example, a combination of NMP and DMSO can increase solute solubility and decrease solvent evaporation rates. In this example, the properties of the NMO/DMSO mixture can decrease premature crystallization of perovskite and improve film quality. In another example, adding NMP to DMF can increase spray width of the solution through an ultrasonic spray on apparatus, which can provide greater flexibility in the spray on parameters used. In another example, a mixture of DMSO and DMPU (N,N'-dimethylpropyleneurea) can be used. For fast drying production methods (e.g., spin coating, antisolvent addition, etc.), the DMSO/DMPU ratio can be reduced to match the drying rate. By matching or approximating the draying rate, the quality of the resultant crystals can be improved, and the efficiency of the perovskite layer can also improve. For slower drying rates, the ratio of DMSO/DMPU can be increased to slow crystallization and improve the properties of the crystals. Examples of ratios of DMSO/DMPU include at least about about 1:99, 10:90, 20:80, 30:70, 40:60, 50:50, 60:40, 70:30, 80:20, 10:90, 99:1, or more.

The one or more perovskite precursors may comprise one or more additives. The addition of the one or more additives may be configured to reduce and/or eliminate defects within perovskite layers as prepared elsewhere herein. The one or more additives may comprise one or more recrystallization solvents. The one or more recrystallization solvents may be added to a solution comprising the one or more perovskite precursors. The one or more recrystallization solvents may be applied after deposition of the one or more perovskite precursors and/or after an annealing of the one or more perovskite precursors. For example, a lead halide precursor can be applied and subsequently a recrystallization solvent can be applied, and the perovskite precursors can be further annealed to orient the lead halide precursor for better methylammonium iodide integration. Examples of recrystallization solvents include, but are not limited to, halobenzenes (e.g., chlorobenzene, bromobenzene, etc.), haloforms (e.g., chloroform, iodoform, etc.), ethers (e.g., diethyl ether), or the like, or any combination thereof.

A variety of parameters may be tuned to provide a predetermined perovskite layer. Examples of parameters include, but are not limited to, perovskite precursor solution application temperature, volume application rate, ultrasonic power of an ultrasonic spray-on instrument, lateral speed of precursor application (e.g., the speed of a substrate moving through an applicator), applicator height (e.g., the distance from an applicator to the substrate, environmental factors (e.g., humidity, reactive gas content, temperature, etc.), wetting surface energy, or the like, or any combination thereof. Any portion of process 300, including the application of the perovskite precursors, may take place in a controlled environment. The controlled environment may have a relative humidity of at least about 10%, 20%, 30%, 40%, 50%, 60%, 70%, 80%, 90%, 99%, or more. The controlled environment may have a relative humidity of at most about 99%, 90%, 80%, 70%, 60%, 50%, 40%, 30%, 20%, 10%, or less. The controlled environment may comprise a controlled atmosphere. The controlled atmosphere may comprise inert gasses (e.g., nitrogen, noble gases, etc.). The controlled atmosphere may have an oxygen content of at least about 1 part per million (ppm), 10 ppm, 50 ppm, 100 ppm, 500 ppm, 1,000 ppm, 5,000, ppm, 1%, 5%, 10%, 15%, 20%, or more. The controlled atmosphere may have an oxygen content of at most about 20%, 15%, 10%, 5%, 1%, 5,000 ppm, 1,000 pm, 500 ppm, 100 ppm, 50 ppm, 10 ppm, 1 ppm, or less. The controlled atmosphere may be at a temperature of at least about 15, 20, 25, 30, 35, 40, 45, 50, 55, 60, 65, 70, 75, 80, 85, 90, 95, 100, 105, 110, 115, 120, 125, 130, 135, 140, 145, 150, 160, 170, 180, 190, 200, or more degrees Celsius. The controlled atmosphere may be at a temperature of at most about 200, 190, 180, 170, 160, 150, 145, 140, 135, 130, 125, 120, 115, 110, 105, 100, 95, 90, 85, 80, 75, 70, 65, 60, 55, 50, 45, 40, 35, 30, 25, 20, 15, or less degrees Celsius.

Figure 5:
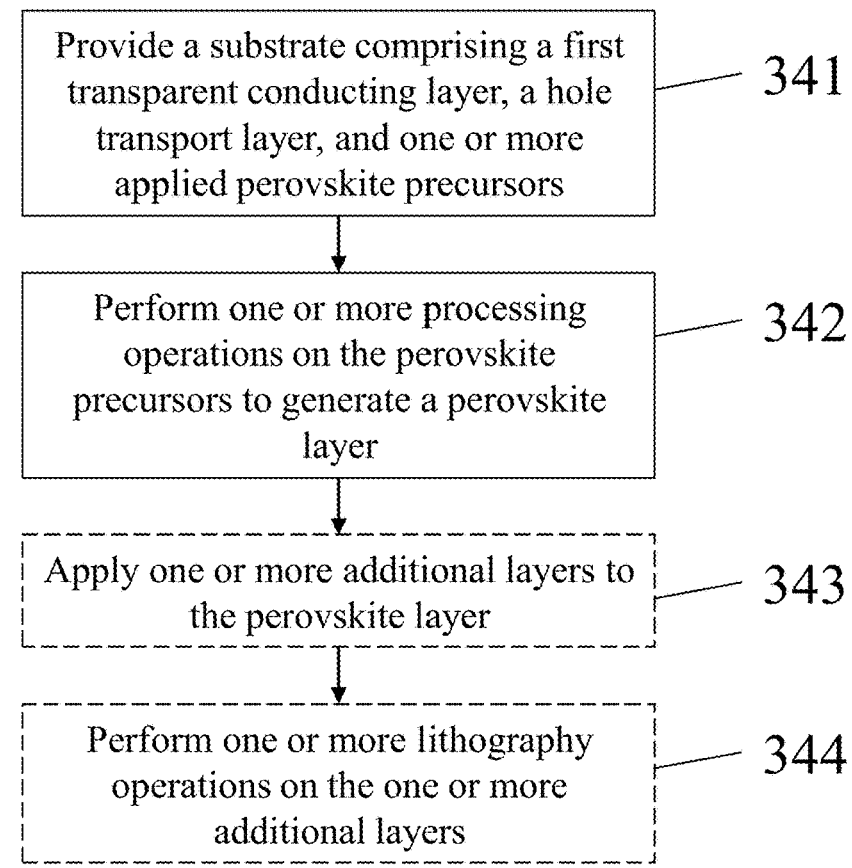
FIG. 5 is a flowchart of operation 340 of FIG. 3, according to an embodiment.

The process 300 may comprise performing one or more processing operations to the perovskite precursors to generate a perovskite layer (340). If the perovskite precursors are instead deposited as a completed perovskite layer, operation 340 may be omitted. FIG. 5 is a flowchart of operation 340 of FIG. 3. Operation 340 may comprise providing a substrate comprising a first transparent conducting layer, a hole transport layer, and one or more applied perovskite precursors (341). The substrate may be a result of operations 310-330 of process 300.

Operation 340 may comprise performing one or more processing operations on the perovskite precursors to generate a perovskite layer (342). The one or more processing operations may comprise annealing, light exposure (e.g., ultraviolet light exposure), agitation (e.g., vibration), functionalization (e.g., surface functionalization), electroplating, template inversion, or the like, or any combination thereof. For example, a substrate with perovskite precursors can be annealed to form a perovskite layer from the precursors. In another example, perovskite precursors can be annealed and subsequently functionalized. The annealing may be annealing under inert atmosphere (e.g., argon atmosphere, nitrogen atmosphere). The annealing may be under a reactive atmosphere (e.g., an atmosphere comprising a reagent (e.g., methylammonium)). The annealing may be at a temperature of at least about 15, 20, 25, 30, 35, 40, 45, 50, 55, 60, 65, 70, 75, 80, 85, 90, 95, 100, 105, 110, 115, 120, 125, 130, 135, 140, 145, 150, 160, 170, 180, 190, 200, or more degrees Celsius. The annealing may be at a temperature of at most about 200, 190, 180, 170, 160, 150, 145, 140, 135, 130, 125, 120, 115, 110, 105, 100, 95, 90, 85, 80, 75, 70, 65, 60, 55, 50, 45, 40, 35, 30, 25, 20, 15, or less degrees Celsius. The annealing may be at a temperature range as defined by any two of the proceeding values. For example, the annealing can be at a temperature of 90 to 120 degrees Celsius. The annealing may be for a time of at least about 0.5, 1, 2, 3, 4, 5, 6, 7, 8, 9, 10, 11, 12, 13, 14, 15, 20, 25, 30, 35, 40, 45, 50, 55, 60, 75, 90, 105, 120, or more minutes. The annealing may be for a time of at most about 120, 105, 75, 60, 55, 50, 45, 40, 35, 30, 25, 20, 15, 14, 13, 12, 11, 10, 9, 8, 7, 6, 5, 4, 3, 2, 1, 0.5, or less minutes. The annealing may be for a time range as defined by any two of the proceeding values. For example, the annealing can be for a time of about 5 to about 15 minutes. There may be a plurality of annealing processes applied to the substrate. For example, a substrate can be annealed at a first time and temperature, and subsequently annealed again at a second time and temperature. Such additional annealing processes can reduce the number of defects present in the perovskite layer and improve performance.

Operation 340 may comprise applying one or more additional layers to the perovskite layer (343). The one or more additional layers may comprise one or more additional perovskite layers. For example, a second perovskite layer with a different bandgap can be applied to the first perovskite layer. The one or more additional layers may comprise one or more additional perovskite precursors. For example, iodine gas can be applied to form an iodine layer on a perovskite and/or perovskite precursor layer. The one or more additional layers may comprise one or more washing operations. A washing operation may comprise an application of a solvent to the perovskite layer. Examples of solvents include, but are not limited to, water, non-polar organic solvents (e.g., hexanes, toluene, etc.), polar organic solvents (e.g., methanol, ethanol, isopropanol, acetone, etc.), ionic solvents, or the like. The one or more additional layers may comprise one or more passivating layers. A passivating layer may comprise a reagent configured to passivate and/or stabilize the perovskite layer. For example, an application of a solution comprising phenethylammonium iodide can passivate and stabilize the grains of the perovskite layer.

Operation 340 may comprise performing one or more lithography operations on the one or more additional layers and/or the perovskite layer (344). The one or more lithography operations may be one or more lithography operations as described elsewhere herein. For example, a laser scribe can be used to generate features on a perovskite layer.

Figure 6:
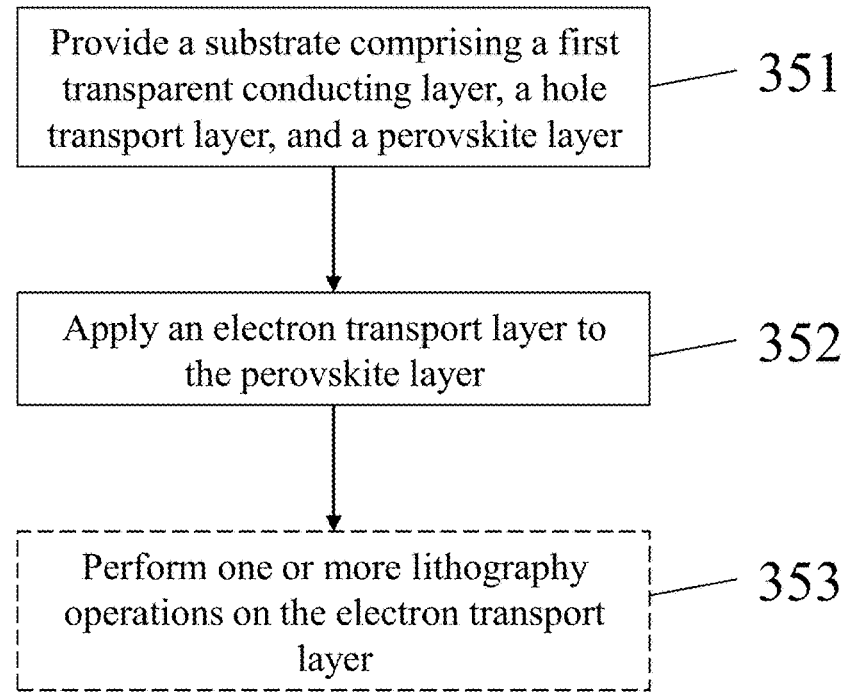
FIG. 6 is a flow chart of operation 350 of FIG. 3, according to an embodiment.

Returning to FIG. 3, the process 300 may comprise applying an electron transport layer to the perovskite layer (350). FIG. 6 is a flow chart of operation 350 of FIG. 3. Operation 350 may comprise providing a substrate comprising a first transparent conducting layer, a hole transport layer, and a perovskite layer (351). The substrate may be a substrate generated by operations 310-340 of FIG. 3.

Operation 350 may comprise applying an electron transport layer to the perovskite layer (352). The electron transport layer may be applied by methods and systems as described elsewhere herein (e.g., physical vapor deposition, ultrasonic spray-on, slot-die coating, etc.). The electron transport layer may comprise a material with a conduction band minimum less than that of the perovskite layer. For example, if the perovskite layer has a conduction band minimum of −3.9 eV, the electron transport layer may have a conduction band minimum of −4 eV. Examples of electron transport layer materials include, but are not limited to titanium oxide (e.g., $TiO_2$), zinc oxide, tin oxide, tungsten oxide, indium oxide, niobium oxide, iron oxide, cerium oxide, strontium titanium oxide, zinc tin oxide, barium tin oxide, cadmium selenide, indium sulfide, lead iodide, organic molecules (e.g., phenyl-C61-butyric acid methyl ester (PCBM), poly(3-hexylthiophene-2,5-diyl) (P3HT), etc.), lithium fluoride, buckminsterfullerene (C60), or the like, or any combination thereof. Operation 350 may optionally comprise performing one or more lithography operations on the electron transport layer (353). The one or more lithography operations may be one or more lithography operations as described elsewhere herein. For example, a laser scribe can be used to generate features on the electron transport layer.

Figure 7:
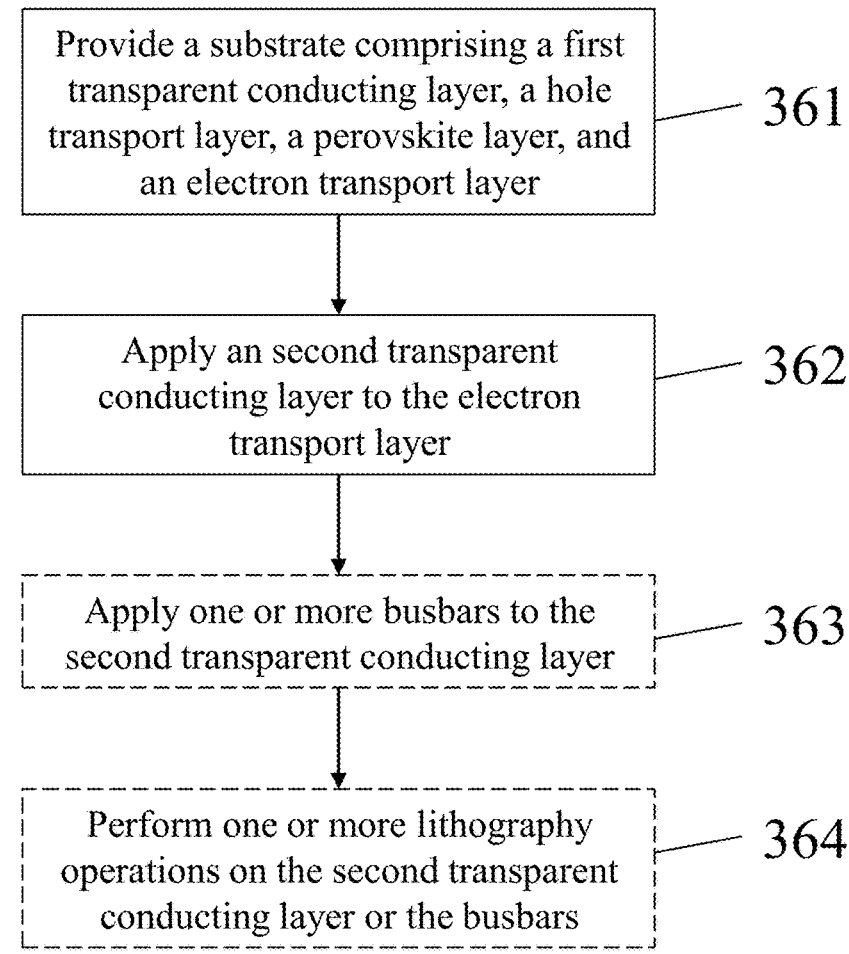
FIG. 7 is a flow chart of operation 360 of FIG. 3, according to an embodiment.

Returning to FIG. 3, the process 300 may comprise applying a second transparent conducting layer to the electron transport layer (360). FIG. 7 is a flow chart of operation 360 of FIG. 3. Operation 360 may comprise providing a substrate comprising a first transparent conducting layer, a hole transport layer, a perovskite layer, and an electron transport layer (371). The substrate may be a substrate generated by operations 310-350 of FIG. 3.

Operation 360 may comprise applying a second transparent conducting layer to the electron transport layer (362). The second transparent conducting layer may be of the same type as the first transparent conducting layer. For example, both the first and second transparent conducting layers may be indium tin oxide. The second transparent conducting layer may be of a different type as the first transparent conducting layer. The second transparent conducting layer may be deposited as described elsewhere herein (e.g., physical vapor deposition, etc.).

Operation 360 may comprise applying one or more busbars to the second transparent conducting layer (363). The one or more busbars may be applied as busbars (e.g., preformed busbars are applied to the second transparent conducting layer). For example, a mask can be used to form the busbars from an evaporation process. The one or more busbars may be applied as a solid film and subsequently formed into the busbars. For example, a silver film can be deposited onto the second transparent conductive layer and etched to form the busbars. In another example, a laser scribe can be used to form the busbars from a silver film. Operation 360 may optionally comprise performing one or more lithography operations on the electron transport layer (364). The one or more lithography operations may be one or more lithography operations as described elsewhere herein. For example, a laser scribe can be used to generate features on the second transparent conducting layer. The busbars may be attached to at least about 2, 3, 4, or more terminals. The busbars may be attached to at most about 4, 3, 2, or less terminals. The terminals may be configured to form a parallel connection with one or more additional photovoltaic modules. The terminals may be configured to form a series connection with one or more additional photovoltaic modules. The terminals may be scribed (e.g., laser scribed). The terminals may be configured to enable connection of a perovskite photovoltaic device with another photovoltaic device prior to a lamination of the two photovoltaic devices. For example, a perovskite photovoltaic device can be connection via two terminals to a silicon photovoltaic device.

Returning to FIG. 3, the process 300 may comprise applying an encapsulant to the second transparent conducting layer (370). The encapsulant may be configured to reduce or substantially eliminate an exposure of the perovskite layer to one or more reactive species. Examples of reactive species include, but are not limited to, oxygen, water, and polar molecules (e.g., polar volatile organic compounds, acids, etc.). The encapsulant may be substantially transparent. For example, the encapsulant may be transparent in a same region of light as the transparent conducting layer. Examples of encapsulants include, but are not limited to, polymers (e.g., buytl rubber, poly(methyl methacrylate), polycarbonate, polyethylene, polystyrene, thermoplastic olefins, polypropylene, etc.), waxes (e.g., paraffin wax), metals (e.g., iron, copper), semiconductors (e.g., wide bandgap semiconductors (e.g., zinc oxide, titanium oxide)), or the like, or any combination thereof.

The encapsulant may be applied across the second transparent conducting layer (e.g., applied to the whole layer), to a portion of the second transparent conducting layer (e.g., a portion of the layer), to the edges of the second transparent conducting layer (e.g., as a seal over the entire stack of layers), or the like, or any combination thereof. For example, the encapsulant can be applied on the edge of the full stack of layers to prevent moisture and oxygen diffusion into the stack. The encapsulant may be applied to the first conductive layer as well as the second conductive layer. For example, the substrate can comprise an encapsulant between the substrate and the first conducting layer. Example 3 below describes the use of PDMS as an encapsulant. Other examples of encapsulants include, but are not limited to, HelioSeal™, silicon glue, butyl-based sealants, or the like. For edge encapsulation, the encapsulant may comprise tape. The tape may be an adhesive backed barrier. The encapsulant may be placed such that the encapsulant ends at least about 1, 2, 3, 4, 5, 6, 7, 8, 9, 10, 11, 12, 13, 14, 15, 16, 17, 18, 19, 20, 21, 22, 23, 24, 25, or more millimeters from the edge. The encapsulant may be place such that the encapsulant ends at most about 25, 24, 23, 22, 21, 20, 19, 18, 17, 16, 15, 14, 13, 12, 11, 10, 9, 8, 7, 6, 5, 4, 3, 2, 1, or fewer millimeters from the edge.

Subsequently to operation 370, the completed stack (e.g., the substrate, perovskite layer, and other layers) may be used as a front panel for an additional photovoltaic module. For example, the completed stack can be configured to be a front junction of a two-junction photovoltaic module. The completed stack may be configured for use as a substrate for an additional stack. For example, the stack can be used as the initial substrate for growth of a silicon photovoltaic module. The stack may be laminated to a second photovoltaic cell. The stack may be laminated at a temperature of at least about 15, 20, 25, 30, 35, 40, 45, 50, 55, 60, 65, 70, 75, 80, 85, 90, 95, 100, 105, 110, 115, 120, 125, 130, 135, 140, 145, 150, 160, 170, 180, 190, 200, or more degrees Celsius. The stack may be laminated at a temperature of at most about 200, 190, 180, 170, 160, 150, 145, 140, 135, 130, 125, 120, 115, 110, 105, 100, 95, 90, 85, 80, 75, 70, 65, 60, 55, 50, 45, 40, 35, 30, 25, 20, 15, or less degrees Celsius.

Figure 13:
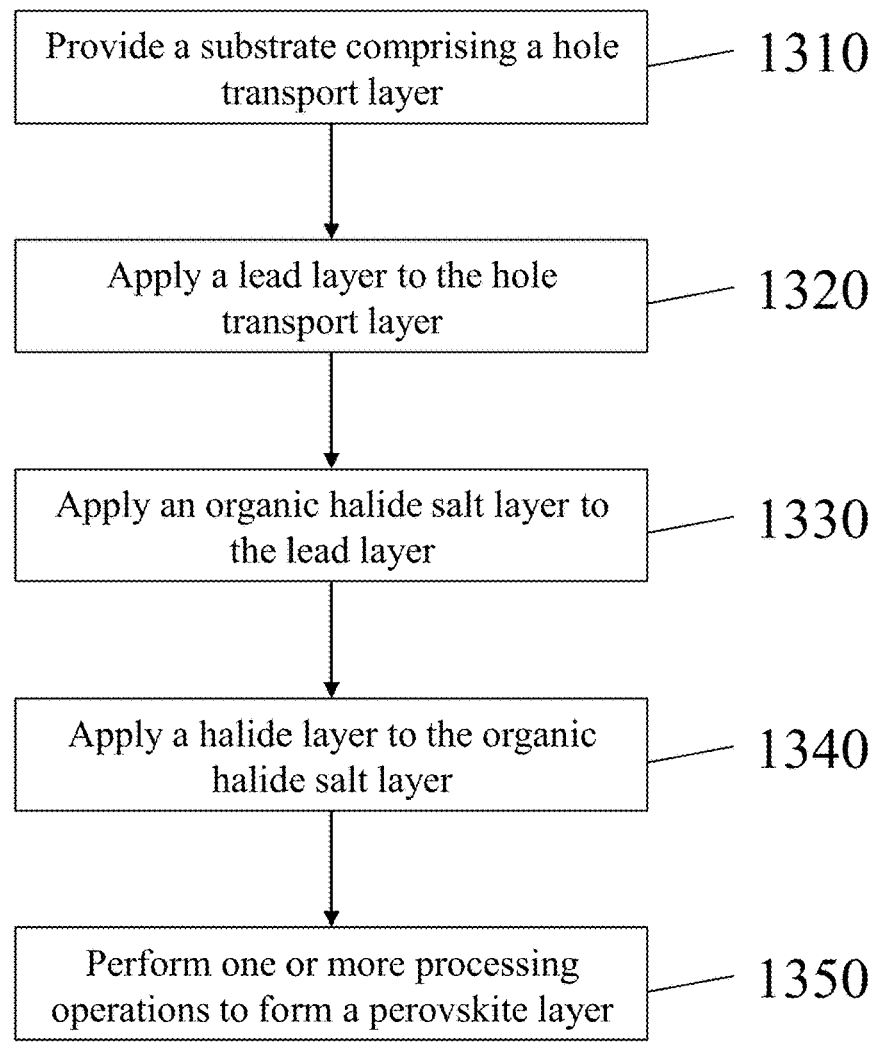
FIG. 13 is a flow chart of a fabrication process for forming a perovskite layer, according to an embodiment.

FIG. 13 is a flow chart of a fabrication process 1300 for forming a perovskite layer. The process 1300 may be one embodiment of operations 320-340 of FIG. 3. The process 1300 may comprise providing a substrate comprising a hole transport layer (1310). The substrate may also comprise a transparent conducting layer as described elsewhere herein. The hole transport layer may be a hole transport layer as described elsewhere herein. The substrate may be a substrate as described elsewhere herein.

The process 1300 may comprise applying a lead layer to the hole transport layer (1320). The lead layer may comprise lead metal (e.g., lead (0)), lead salts (e.g., lead (II) acetate, lead (II) halide, lead (I) salts, etc.), or any combination thereof. For example, a metallic lead layer may be deposited onto the hole transport layer, and a layer of lead (II) acetate may be applied to the lead layer. The lead layer may be deposited as described elsewhere herein. For example, the lead may be deposited by physical vapor deposition. The lead layer may be deposited by the same deposition method and/or deposition machinery as the hole transport layer. For example, the same physical vapor deposition instrument can be used to deposit both the hole transport layer as well as the lead layer.

The process 1300 may comprise applying an organic halide salt layer to the lead layer (1330). The organic halide may be an organic halide as described elsewhere herein. For example, a mixture of methylammonium iodide, methylammonium chloride, and formamidinium iodide can be applied to the lead layer. The organic halide layer may be applied by a deposition process as described elsewhere herein. For example, the organic halide can be applied by a spin coating process, an ultrasonic spray-on process, a slot-die process, or the like.

The process 1300 may comprise applying a halide layer to the organic halide layer (1340). The halide layer may comprise halides (e.g., fluorine, chlorine, bromine, iodine, etc.), oxyhalides (e.g., chlorate, etc.), other halide containing compounds, or the like, or any combination thereof. For example, the halide layer may comprise iodine. In another example, the halide layer may be iodine. The halide layer may be applied to the organic halide salt layer by deposition processes as described elsewhere herein. The halide can be applied as a gas. For example, iodine can be sublimated and applied as a gas to the organic halide salt layer. The halide can be applied evenly across the surface of the organic halide salt layer. To apply the halide uniformly, a variety of different application devices can be used. An example of an application device may be a 'shower head' (e.g., an application head comprising a plurality of holes). An example of a shower head for application of a perovskite precursor may be found in FIG. 9. Another example of an application device may be a bar comprising one or more nozzles that can be translated across the surface of the substrate. For example, a bar of the same width as the substrate can be moved across the substrate to deposit an even coat of halide.

The process 1300 may comprise performing one or more processing operations to form a perovskite layer (1350). The perovskite layer may be a perovskite layer as described elsewhere herein (e.g., a perovskite layer from FIG. 3). The one or more processing operations may be one or more processing operations as described elsewhere herein. For example, the lead layer with a lead acetate layer deposited on top of it, a methylammonium iodide/formamidinium iodide layer, and an iodide layer can be annealed together at a temperature of 90-120 degrees Celsius to form a methylammonium/formamidinium lead iodide perovskite layer. The one or more processing operations may comprise a wash. The wash may comprise use of one or more solvents described elsewhere herein. The wash may be configured to remove unreacted precursors from the perovskite layer. For example, an isopropanol was can be performed to remove residual organic halide salts. The one or more processing operations may comprise one or more treatments. Examples of treatments include, but are not limited to, application of phenethylammonium iodide, thiocyanate washes, other passivation and/or stabilization processes, or the like, or any combination thereof.

In another aspect, the present disclosure provides a method of generating a perovskite layer comprising spraying on a solution comprising precursors for the perovskite layer. A quench solution may be applied to the precursors to form the perovskite layer. The solution may comprise all of the precursors for the perovskite layer. For example, the solution can comprise a lead halide, an organohalide, and a halide. The solution may comprise perovskite precursors as described elsewhere herein. The solution may be applied by processes as described elsewhere herein. For example, the solution can be applied by ultrasonic spray on techniques. The solution may be treated after application. For example, the solution can be heated to remove solvent from the solution. The solution may not be treated after application. The quench solution may be applied to a solution (e.g., a precursor solution). The quench solution may be applied to dried precursors. The quench solution may comprise an antisolvent (e.g., a solvent that the perovskite precursors are less soluble in than the solvent for the precursor solution). Examples of antisolvents include, but are not limited to polar solvents (e.g., alcohols, acetone, etc.), long-chain non-polar solvents (e.g., octadecene, squalene, etc.), or the like, or any combination thereof. The quench solution may be applied as described elsewhere herein. For example, the quench solution may be applied by ultrasonic spray-on techniques. The solution may be subjected to one or more atmospheric conditions to aid in the removal of the solvent. The one or more atmospheric conditions may comprise reduced pressure (e.g., application of a vacuum), increased pressure (e.g., blowing gas over the substrate), or the like, or a combination thereof. The reduced pressure may comprise application of a partial vacuum around the substrate. Such a vacuum may pull solvent form the film to effect rapid solvent removal and produce a high quality film. The increased pressure may comprise use of an air knife or similar blowing scheme to aid in the removal of the solvent. Such high quality films may appear specular under visual inspection. After application of the precursor solution, the solution may be given time to self-level prior to solidification. For example, the precursor solution can be allowed to sit on the substrate for sufficient time to level prior to removal of the solvent and preparation of the perovskite layer.

Figure 8:
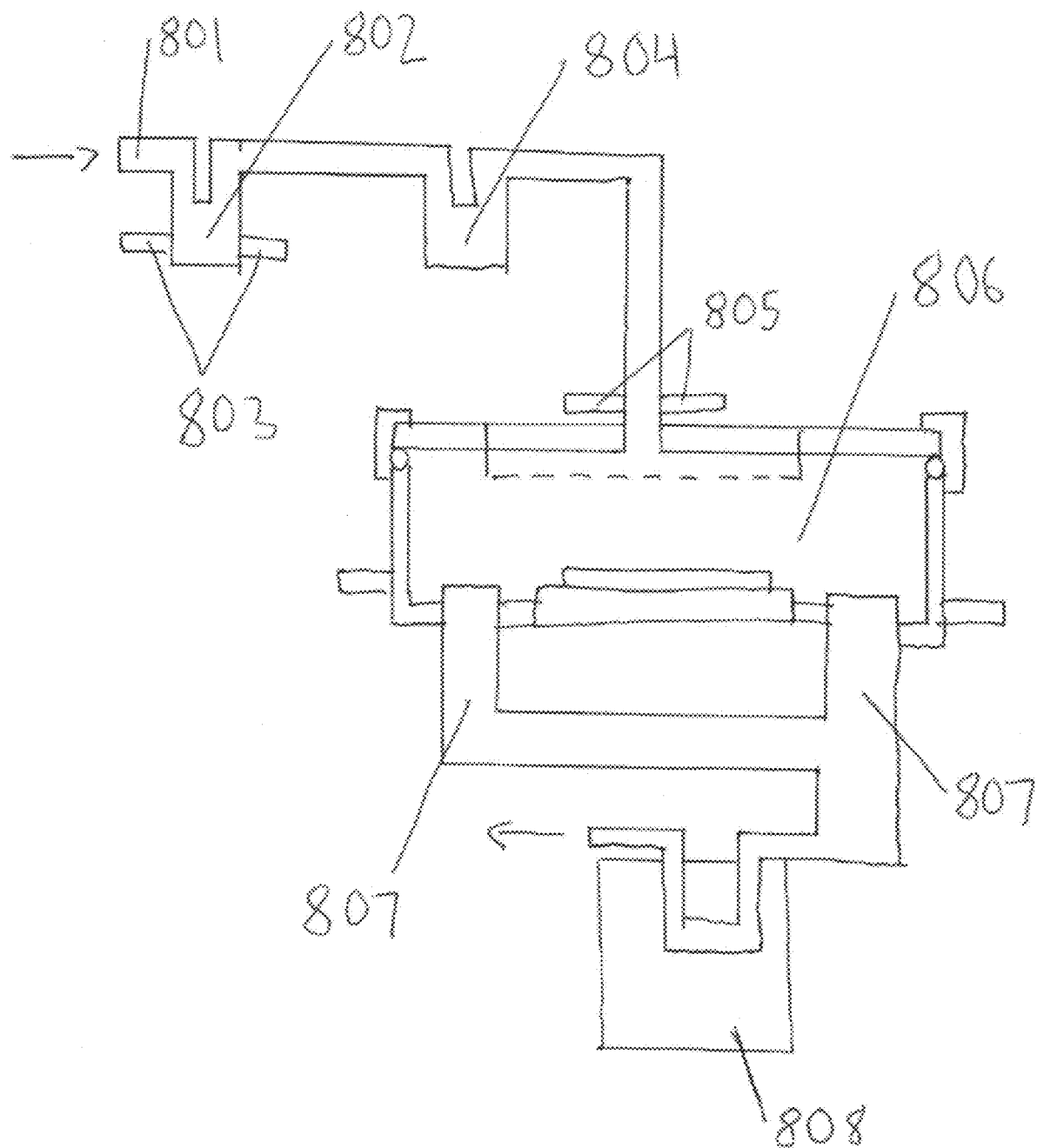
FIG. 8 schematically illustrates a perovskite precursor deposition chamber, according to an embodiment.

FIG. 8 schematically illustrates a perovskite precursor deposition chamber. Gas can flow from inlet 801 into chamber 802. The gas may be an inert gas (e.g., nitrogen, argon, etc.). The chamber 802 may comprise one or more perovskite precursors. For example, the chamber can contain solid iodine. In another example, the chamber can contain liquid bromine. The gas can be configured as a carrier gas for the one or more perovskite precursors in the reservoir. For example, the gas can carry sublimated iodine out of the chamber. The chamber may comprise an optical sensor assembly 803. The optical sensor assembly may comprise a light source and a detector as described elsewhere herein. For example, the optical sensor assembly may comprise a green laser and a photodiode detector. The gas may pick up the one or more perovskite precursors from chamber 802 and flow into to chamber 804. Chamber 804 may be configured to regulate a flow of the gas and/or the one or more perovskite precursors from chamber 802. The chamber may be configured to prevent outflow from the deposition chamber 806. The chamber 804 may be configured as a bubbler (e.g., a water bubbler, a mercury bubbler, etc.), a mass flow controller (e.g., an iodine mass flow controller, etc.), or the like, or any combination thereof. The gas may flow from chamber 804 through an additional optical sensor assembly 805 to chamber 806. The optical sensor assembly 805 may comprise a light source and a detector as described elsewhere herein. For example, the optical sensor assembly may comprise a green laser and a photodiode detector. The chamber may be a chamber as described elsewhere herein. For example, the chamber may be a chamber as described in FIG. 9. The chamber 808 may be made of or coated with a material resistant to a halide gas. For example, the chamber may be made out of titanium. In another example, the chamber may comprise an inert polymer coating. In another example, the chamber is made of glass. The chamber may be connected to exhaust ports 807, which may in turn be connected to chamber 808. Chamber 808 may comprise a bubbler. Chamber 808 may comprise a condenser apparatus (e.g., a cold head, a cold finer, a cold coil, etc.). Chamber 808 may be configured to prevent a flow of the one or more perovskite precursors out of the chamber 806 and into downstream environments. For example, a cold head can condense iodine gas to prevent it from being vented into the atmosphere.

Figure 9:
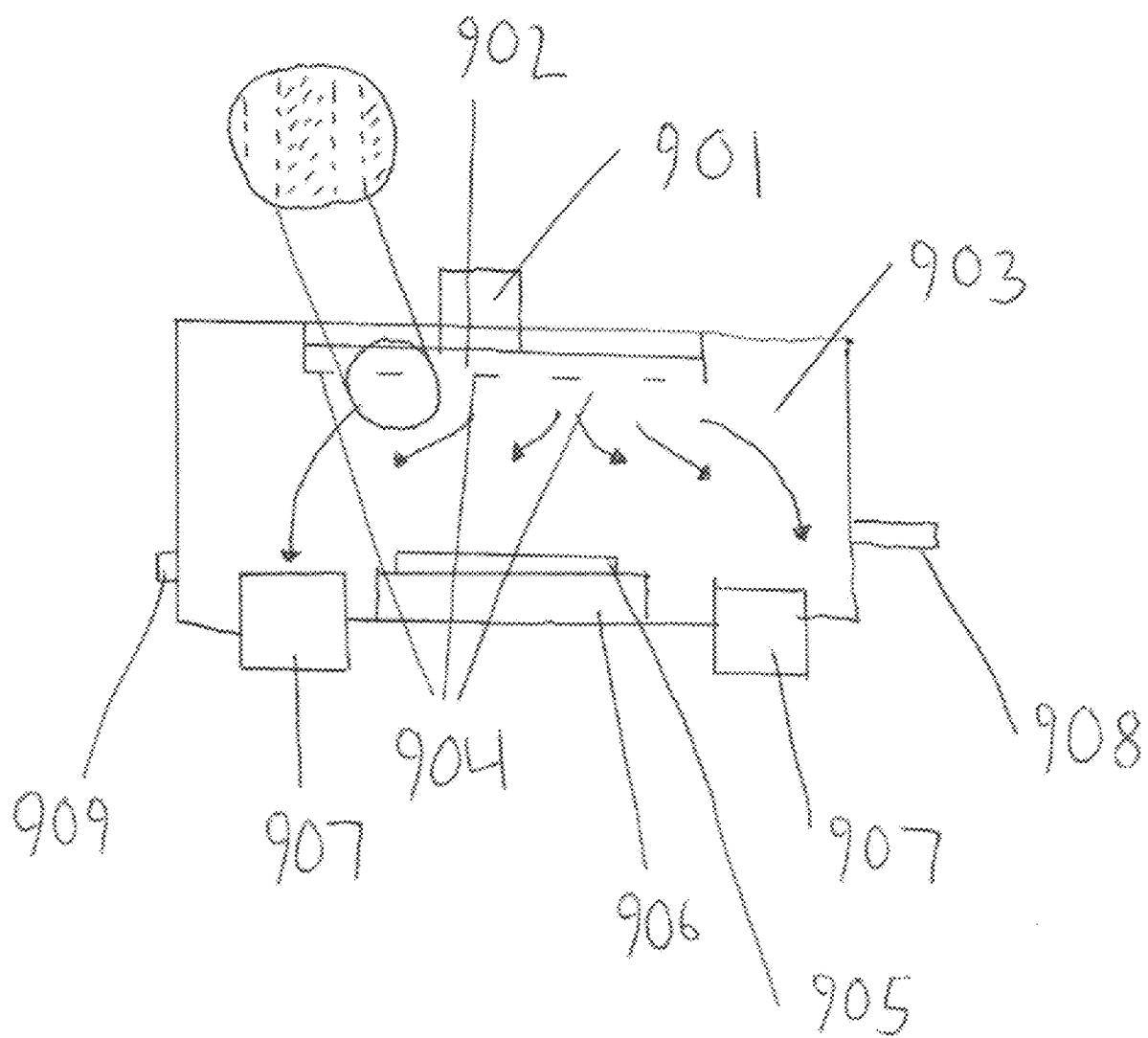
FIG. 9 schematically illustrates a shower head design for a spray-on nozzle, according to an embodiment.

FIG. 9 schematically illustrates a shower head design for a spray-on nozzle. Gas can flow through inlet 901 into deposition chamber 903 through nozzle 902. Nozzle 902 may comprise a plurality of holes 904. The plurality of holes may be at least about 2, 5, 10, 25, 50, 75, 100, 150, 200, 250, 500, 750, 1,000, or more holes. The plurality of holes may be at most about 1,000, 750, 500, 250, 200, 150, 100, 75, 50, 25, 10, 5, 3, or fewer holes. The plurality of holes may be configured to evenly distribute the gas from inlet 901 onto a substrate 905 within the chamber 903. The substrate may be a substrate as described elsewhere herein. The substrate may be placed on a heater 906. The heater may be configured to anneal the substrate. For example, the heater can anneal the substrate to permit a reaction of the perovskite precursors to form the perovskite layer. The chamber 903 may comprise one or more exhaust ports 907. The exhaust ports may be configured to remove excess gasses from the atmosphere of the chamber (e.g., excess reactants, oxygen, water, etc.). The chamber may comprise a light source 908 directed at a photodetector 909. The light source may comprise a laser (e.g., a green laser), an incoherent light source (e.g., a light emitting diode, etc.), or the like, or any combination thereof. The photodetector may comprise a zero-dimensional (0D) detector (e.g., a photodiode), a one-dimensional (1D) detector (e.g., a strip detector), a two-dimensional (2D) detector (e.g., an array detector), a film detector (e.g., a detector using silver halide crystals on a film), a phosphor plate detector (e.g., a plate of downshifting or down-converting phosphor), a semiconductor detector (e.g., a semiconductor charge coupled device (CCD), a complementary metal oxide semiconductor (CMOS) device), or the like, or any combination thereof. The substrate may be loaded into an oven for an annealing process. For example, a substrate can be loaded via an automated loader into an oven with a plurality of other substrates to perform a batch anneal process.

Figure 20:
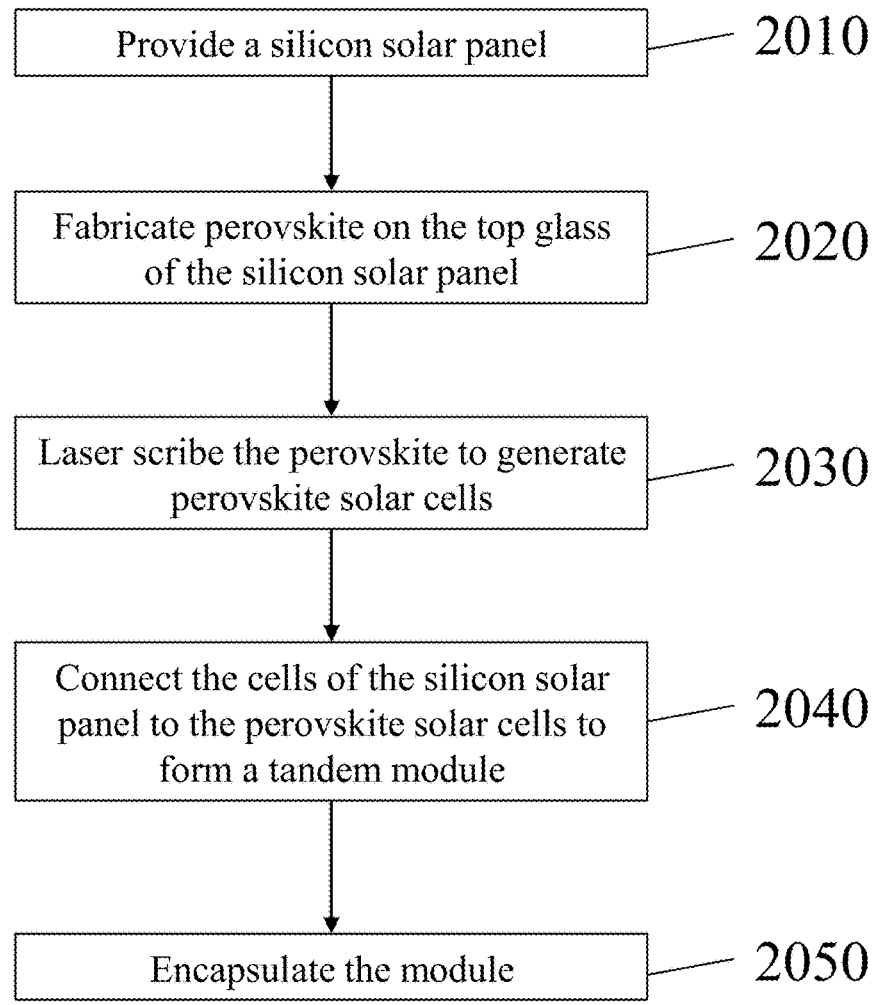
FIG. 20 is a flow chart of a process for manufacturing a tandem solar module, according to some embodiments.

FIG. 20 is a flow chart of a process 2000 for manufacturing a tandem solar module, according to some embodiments of the present disclosure. The method may comprise providing a silicon solar panel (2010). The silicon solar panel may be as described elsewhere herein. For example, the silicon solar panel may be a front contact solar panel, an integrated back contact solar panel, a shingled solar panel, or the like. The silicon solar panel may have at least about 10, 15, 20, 25, 30, 35, 40, 45, 50, 55, 60, 65, 70, 72, 75, 80, 85, 90, 95, 96, or more solar cells. The silicon solar panel may have at most about 96, 95, 90, 85, 80, 75, 72, 70, 65, 60, 55, 50, 45, 40, 35, 30, 25, 20, 15, 10, or less solar cells. In some embodiments, the silicon solar panel has 60 six-inch solar cells arranged in a 6-by-10 grid. The cells may be connected in series. The cells may each have an open circuit voltage of 0.7V, for a total open circuit voltage of approximately 42V.

The method may further comprise fabricating perovskite-on-glass as described elsewhere herein (2020). The perovskite-on-glass may have at least about 1, 2, 3, 4, 5, 6, 7, 8, 9, 10, or more layers. The perovskite-on-glass may have at most about 10, 9, 8, 7, 6, 5, 4, 3, 2, or less layers.

The method may further comprise laser scribing the perovskite-on-glass to form perovskite cells or strips (2030). The fabricating may comprise use of fabrication techniques as described elsewhere herein. For example, the fabricating can comprise use of a laser scribe to define the one or more perovskite solar cells. The one or more perovskite solar cells may be a plurality of perovskite solar cells. The one or more perovskite solar cells may be at least about 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, 95, 99, or more perovskite solar cells. The one or more perovskite solar cells may be at most about 99, 95, 90, 85, 80, 75, 70, 65, 60, 55, 50, 45, 40, 35, 30, 25, 20, 15, 14, 13, 12, 11, 10, 9, 8, 7, 6, 5, 4, 3, 2, or less perovskite solar cells. The plurality of perovskite solar cells may be connected in series. The plurality of perovskite solar cells may be connected in parallel. The laser scribing may separate the perovskite layer into a plurality of segments. The plurality of segments may be formed into a plurality of perovskite solar cells. For example, contacts can be applied to the plurality of segments to extract charge from the plurality of segments.

The laser scribing may be configured to generate a plurality of perovskite cells which, when connected together, have a same or substantially same voltage output as the silicon module. The voltage output of the perovskite layer per unit area can be known, and the perovskite layer can be scribed to form perovskite cells of a size to provide a predetermined voltage. For example, a perovskite layer can be scribed to form 5 perovskite sub-modules each comprising 40 perovskite solar cells to match a silicon solar module that has a same voltage output as the 40 perovskite solar cells. In this example, the 5 perovskite sub-modules can be connected in parallel to increase the current produced by the perovskite layer while maintaining the voltage match with the silicon module.

The method may further comprise connecting the cells of the silicon solar panel to the perovskite solar cells to form a tandem module (2040). The silicon solar panel and the perovskite solar cells may be in a voltage matched configuration. The voltage matched configuration may be as described elsewhere herein. For example, the silicon solar cells can have the same voltage as the perovskite solar cells. The perovskite solar cells may be connected to one another in parallel. The perovskite solar cells may be connected to one another in series. The perovskite solar cells may be connected such that there are a plurality of modules in the perovskite layer. For example, rows of the perovskite solar cells can be each connected in series and the connected rows can be connected in parallel. The silicon solar panel and the perovskite solar panel may be connected as described elsewhere herein. For example, the perovskite solar cells can be connected via copper (or another metal, charge collection tape, etc.) terminals to the same junction box as the silicon solar cells.

The method may further comprise encapsulating the module (2050). The encapsulating may comprise applying an encapsulant as described elsewhere herein. For example, the encapsulating can comprise applying a thermal-plastic polyolefin to the perovskite layer. In another example, the encapsulating can comprise use of a transparent conducting oxide.

The method may comprise applying a plurality of contacts to the one or more perovskite solar cells to electrically couple the one or more perovskite solar cells. The plurality of contacts may be applied using one or more processes as described elsewhere herein. For example, the plurality of contacts can be evaporated onto the perovskite solar cells. In another example, the plurality of contacts can be lithographically applied to the perovskite solar cells. The method may comprise applying an encapsulant to the one or more perovskite solar cells. The applying may be as described elsewhere herein. For example, the encapsulant can be applied via evaporation. In another example, the encapsulant can be spread as a viscous solution onto the perovskite solar cell. The encapsulant may be as described elsewhere herein. For example, the encapsulant may be a thermal-plastic polyolefin. The method may comprise applying an edge seal to the one or more perovskite solar cells. The edge seal may be as described elsewhere herein. For example, the edge seal can be HelioSeal™.

The silicon solar panel and the perovskite solar panel may be electronically coupled to a same junction box. Such coupling to the same junction box may allow for simple integration of the perovskite layer into existing silicon solar modules. Such coupling may also provide for simple installation of the tandem solar module, as there may be a single output from the tandem module instead of multiple outputs.

Figure 16:
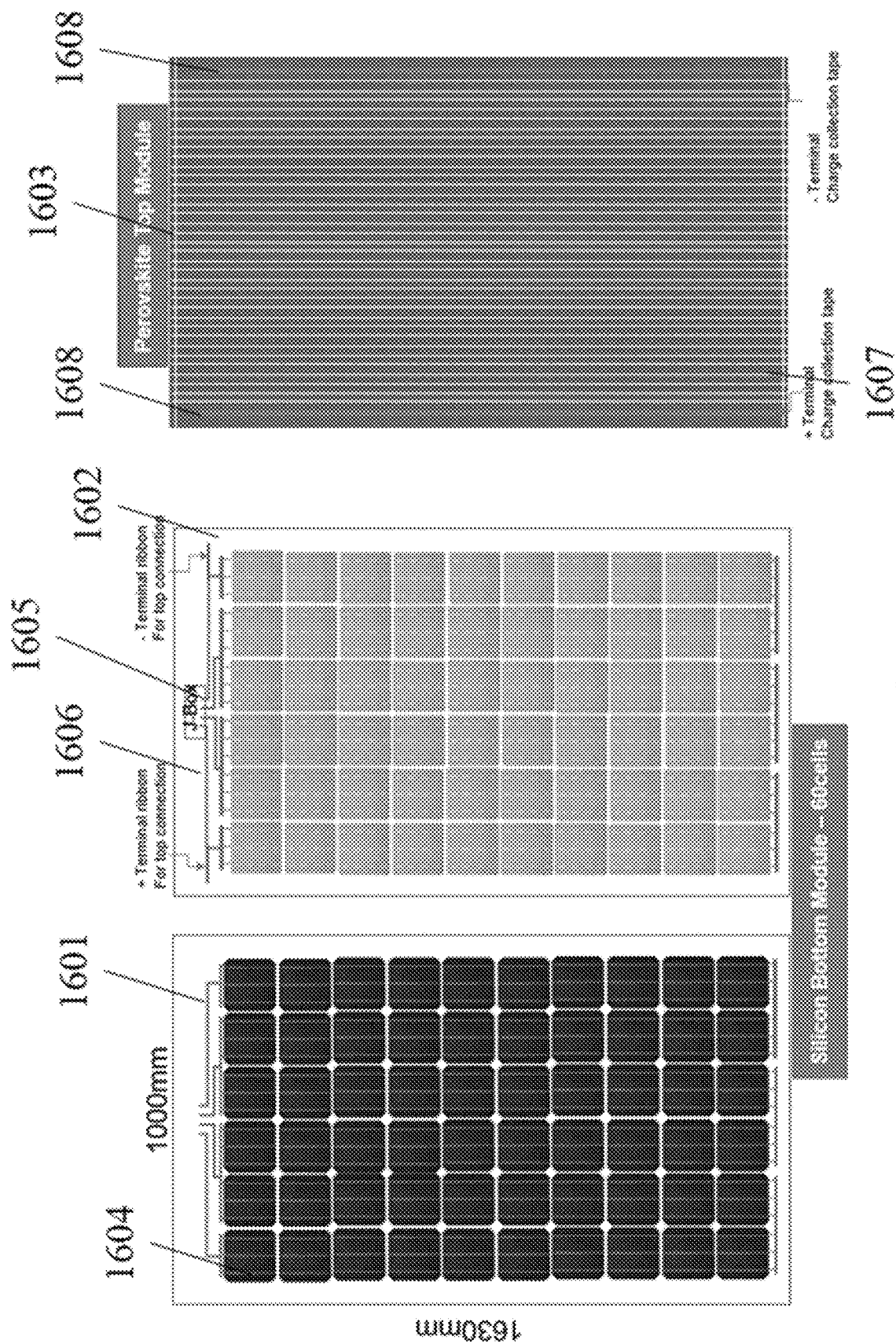
FIGS. 16-19 show examples of different electrical network connections for different types of silicon-perovskite hybrid solar modules, according to some embodiments.

FIGS. 16-19 show examples of different electrical network connections for different types of silicon-perovskite hybrid solar modules. The hybrid silicon-perovskite solar modules may be a described elsewhere herein. FIG. 16 shows an example of the front and back of a silicon solar module 1601 and 1602 as well as a perovskite top module 1603. The silicon solar module may comprise front busbars 1604. The front bus bars may be configured to connect the various solar cells in the module to a single junction box output 1605. The silicon solar module may comprise terminals 1606. The terminals may comprise copper, silver, gold, iron, alloys thereof, charge collection tape, or the like, or any combination thereof. The terminals may be configured to electrically connect with the perovskite top module 1603. For example, the terminals can be configured to electrically connect the perovskite top module to the junction box. The terminals may be configured as to provide a parallel connection between the silicon solar module and the perovskite top module. Alternatively, the terminals may be configured to provide a series connection between the silicon solar module and the perovskite top module. The tandem solar module may comprise a silicon solar panel. The silicon solar panel may comprise a plurality of silicon solar cells. The silicon solar panel may comprise a top glass sheet. The plurality of silicon solar panels may be connected in series and have a first open circuit voltage. The tandem solar module may comprise a perovskite solar panel disposed on an underside of the top glass sheet of the silicon solar panel. The perovskite solar panel may comprise a plurality of segments. Each segment of the plurality of segments may comprise a plurality of laser-scribed strips of perovskite. The plurality of laser-scribed strips of perovskite within a segment may be connected in series to generate a second open circuit voltage that may be substantially the same as the first open circuit voltage. The tandem solar module may comprise an interconnect connecting the plurality of silicon solar cells and the plurality of segments of the perovskite solar panel in parallel.

The plurality of segments may comprise at least about 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, 100, 125, 150, 175, 200, 250, 300, 400, 500, or more segments. The plurality of segments may comprise at most about 500, 400, 300, 250, 200, 175, 150, 125, 100, 90, 85, 80, 75, 70, 65, 60, 55, 50, 45, 40, 35, 30, 25, 20, 15, 14, 13, 12, 11, 10, 9, 8, 7, 6, 5, 4, 3, 2, or fewer segments. The plurality of segments may comprise a number of segments in a range as defined by any two of the proceeding values. For example, the plurality of segments can comprise from about 10 to about 200 segments.

Figure 17:
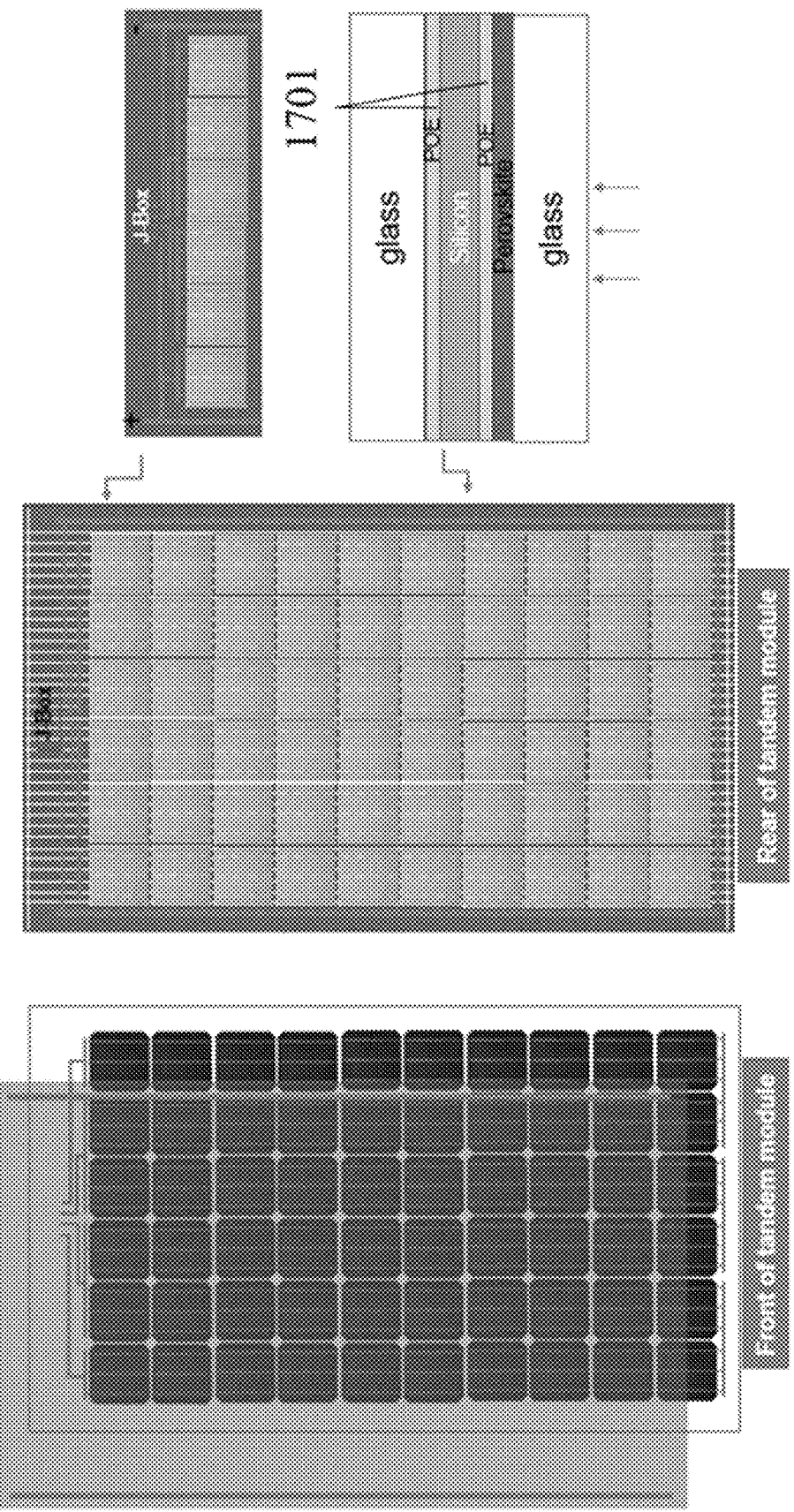
Figure 18:
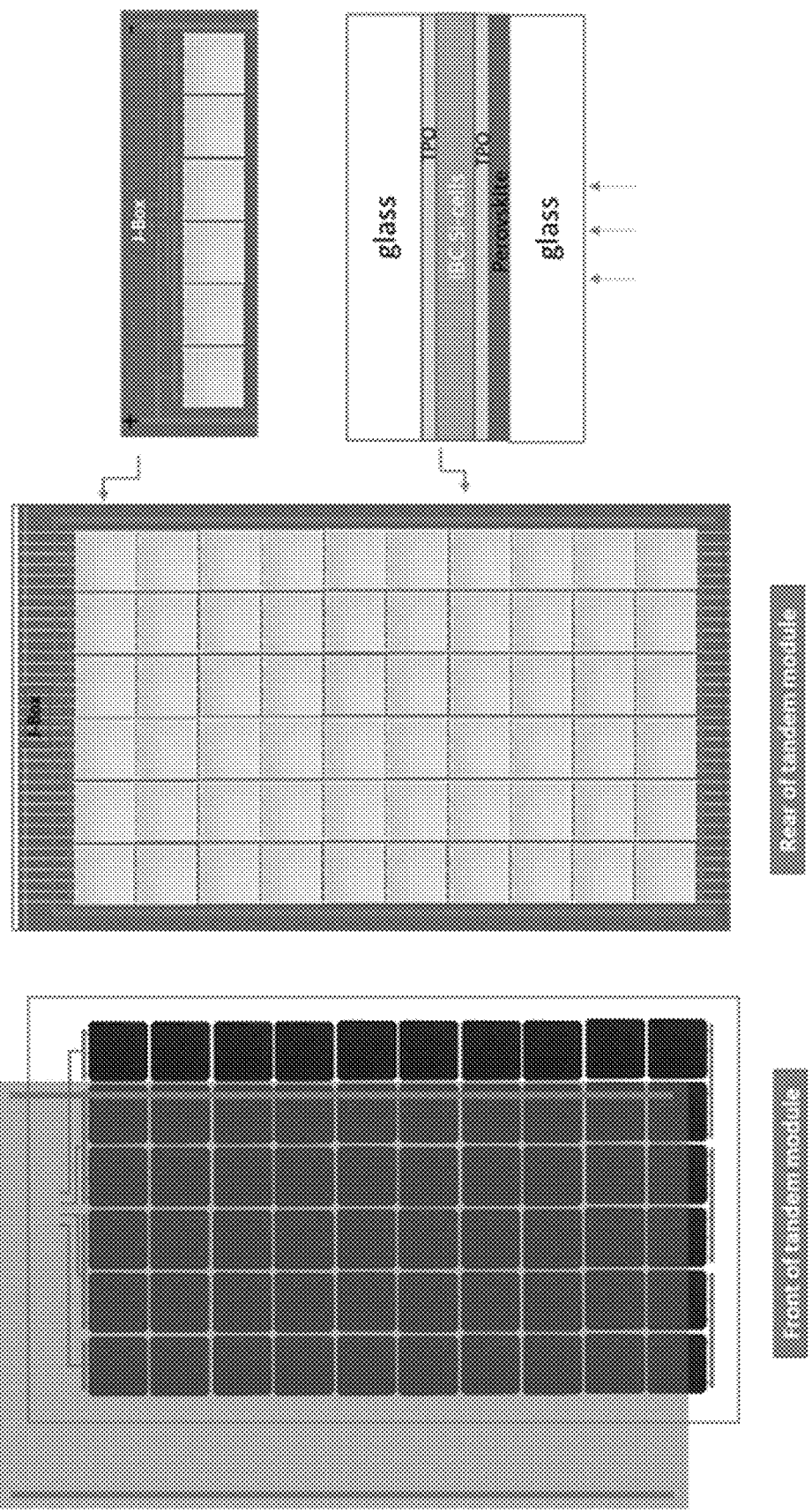
Figure 19:
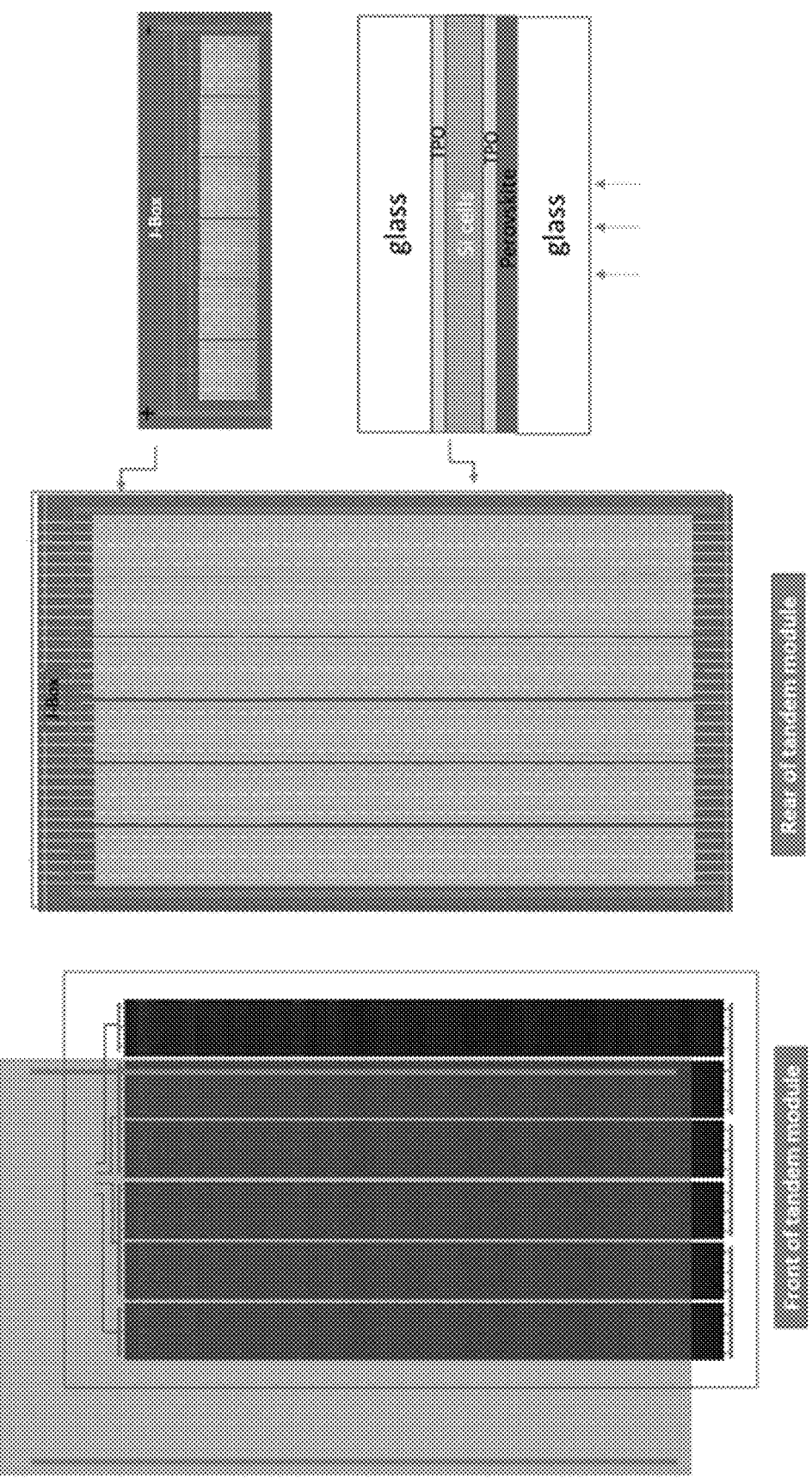

The perovskite top module may comprise one or more channels 1607, as well as one or more terminals 1608. The channels may be generated by methods described elsewhere herein. For example, the channels can be cut in with a laser scribe. The channels may be configured to isolate different perovskite solar cells from one another. In this way, a plurality of perovskite solar cells can be formed in the perovskite top module. Additional channels perpendicular to the channels can be used to form a grid of solar cells. For example, a 5 by 40 array of perovskite solar panels can be formed out of the perovskite layer. The perovskite top module may comprise at least about 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, or more perovskite solar cells. The perovskite top module may comprise at most about 90, 85, 80, 75, 70, 65, 60, 55, 50, 45, 40, 35, 30, 25, 20, 15, 14, 13, 12, 11, 10, 9, 8, 7, 6, 5, 4, 3, 2, or fewer perovskite solar cells. For example, the perovskite top layer can comprise 40 solar cells separated by channels. The perovskite solar cells can be at least about 1, 2, 3, 4, 5, 6, 7, 8, 9, 10, 11, 12, 13, 14, 15, 20, 25, 30, 35, 40, 45, 50, or more millimeters wide. The perovskite solar cells can be at most about 50, 45, 40, 35, 30, 25, 20, 15, 14, 13, 12, 11, 10, 9, 8, 7, 6, 5, 4, 3, 2, or less millimeters wide. The perovskite solar cells can be at least about 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, 100, 150, 200, 250, 500, 750, 1,000, or more millimeters long. The perovskite solar cells can be at most about 1,000, 750, 500, 250, 200, 150, 100, 90, 85, 80, 75, 70, 65, 60, 55, 50, 45, 40, 35, 30, 25, 20, 15, 14, 13, 12, 11, 10, 9, 8, 7, 6, 5, 4, 3, 2, or fewer millimeters long. The perovskite solar cells can be strips (e.g., solar cells that stretch up to the length of the module). The strips may be connected in series or parallel. In some cases, the perovskite solar cells may be connected to one another in series. The perovskite solar cells may be connected to one another in parallel. Similarly, FIG. 17 shows an example of a stacked tandem perovskite-silicon solar module. The silicon solar panel may be a top contact solar panel. For example, the silicon solar panel can comprise electrical contacts configured to extract electricity from the panel that are positioned on the side of the silicon solar cells that faces the sun. The module may comprise one or more encapsulant layers 1701. The one or more encapsulant layers may be as described elsewhere herein. The one or more encapsulant layers can be applied to a substrate, and subsequently the solar cells of the silicon solar module can be arranged onto the one or more encapsulant layers. An additional layer of encapsulant can be applied over the silicon solar cells, and the perovskite-on-glass can then be applied to the encapsulant layer. The encapsulant layer may be configured as to permit electrical connection between the silicon layer and the perovskite layer. FIG. 18 shows an example of a perovskite top module being electrically connected to an integrated back contact (IBC) silicon solar module. The silicon solar panel may be an integrated back contact solar panel. For example, the silicon solar panel can comprise electrical contacts configured to extract electricity from the panel that are positioned on the back of the silicon solar cells. FIG. 19 shows an example of a perovskite top module electrically connected to a shingled silicon solar module. The silicon solar panel may be a shingled solar panel. For example, a plurality of silicon solar cells can be stacked such that a back contact of one of the solar cells comes in contract with a front contact of an adjacent solar cell. In this example, the silicon solar cells can only partially overlap to provide a greater active area of the solar panel.

The arbitrary size of the perovskite solar cells may enable the arbitrary selection of the voltage output of the perovskite top module. For example, the perovskite solar cells can be formed such that the cells produce a predetermined voltage upon illumination. The perovskite solar cells can be configured to generate a total voltage that is substantially matched to the silicon solar module. For example, for a silicon solar cell with a 42 volt output, the perovskite solar cells can be configured to generate 44 volts. The perovskite top module may generate a voltage within at least about 5%, 10%, 20%, 30%, 40%, 50%, 60%, 70%, 80%, 90%, 99%, or more of the voltage of the silicon solar module. The perovskite top module may generate a voltage within at most about 99%, 90%, 80%, 70%, 60%, 50%, 40%, 30%, 20%, 10%, 5%, or less of the voltage of the silicon solar module. The matching or substation matching of the perovskite top module's voltage with the voltage of the silicon solar module can result in a voltage matched condition between the two modules. The voltage matched condition can produce a hybrid module with a higher current output than a hybrid module that is not voltage matched. The silicon solar panel and the perovskite solar panel may have a substantially similar area. For example, the perovskite layer can cover the entire silicon solar panel. In this example, the total power of the module can be maximized, as all of the area of available solar light is utilized. The perovskite solar panel may be at least about 5%, 10%, 20%, 30%, 40%, 50%, 60%, 70%, 80%, 90%, 99%, or more of the area of the silicon solar panel. The perovskite solar panel may be at most about 99%, 90%, 80%, 70%, 60%, 50%, 40%, 30%, 20%, 10%, 5%, or less of the area of the silicon solar panel.

Perovskite Composition and Additives

The perovskite layer described herein may have a composition of $MA_{n1}FA_{n2}Cs_{n3}PbX_3$, wherein MA is methylammonium and FA is formamidinium. n1, n2, and n3 may independently be greater than 0 and/or less than 1. n1+n2+n3 may equal 1. A perovskite solar cell comprising said perovskite layer may retain at least about 80% solar conversion efficiency after 300 hours of illumination under one sun conditions in an air atmosphere at 45° C. The perovskite layer may be used as described elsewhere herein (e.g., used as an absorbing layer for a perovskite photovoltaic).

In the above equation, X may be selected from the group consisting of fluorine, chlorine, bromine, and iodine. For example, X can be iodine. X may be a combination of two or more of fluorine, chlorine, bromine, and iodine. For example, X may be a mixture of chlorine and iodine. The combination may comprise individual components having a concentration of at least about 0.1, 0.5, 1, 2, 3, 4, 5, 6, 7, 8, 9, 10, 11, 12, 13, 14, 15, 20, 25, 30, 35, 40, 45, 50, 55, 60, 65, 70, 75, 80, 85, 90, 95, 96, 97, 98, 99, or more percent. The combination may comprise individual components having a concentration of at most about 99, 98, 97, 96, 95, 90, 85, 80, 75, 70, 65, 60, 55, 50, 45, 40, 35, 30, 25, 20, 15, 14, 13, 12, 11, 10, 9, 8, 7, 6, 5, 4, 3, 2, 1, 0.5, 0.1 or less percent. For example, the combination may be a mixture of about 1% chlorine and 99% iodine. The combination may comprise individual components having a concentration in a range as defined by any two of the previous values. For example, the combination can be a mixture of about 1%-5% bromine and about 95%-99% iodine.

In the proceeding formula, n1, n2, and n3 may individually be greater than at least about 0.0001, 0.0005, 0.001, 0.005, 0.01, 0.05, 0.1, 0.11, 0.12, 0.13, 0.14, 0.15, 0.2, 0.25, 0.3, 0.35, 0.4, 0.45, 0.5, 0.55, 0.6, 0.65, 0.7, 0.75, 0.8, 0.85, 0.9, 0.95, 0.96, 0.97, 0.98, 0.99, or more. In the proceeding formula, n1, n2, and n3 may individually be less than at most about 0.99, 0.98, 0.97, 0.96, 0.95, 0.9, 0.85, 0.8, 0.75, 0.7, 0.65, 0.6, 0.55, 0.5, 0.45, 0.4, 0.35, 0.3, 0.25, 0.2, 0.15, 0.14, 0.13, 0.12, 0.11, 0.1, 0.9, 0.8, 0.7, 0.6, 0.5, 0.4, 0.3, 0.2, 0.1, 0.05, 0.01, 0.005, 0.001, 0.0005, 0.0001, or less. In the proceeding formula, n1, n2, and n3 may individually have a range as defined by any two of the proceeding values. For example, n1 can be about 0.001 to about 0.05, n2 can be about 0.8 to about 0.989, and n3 can be about 0.01 to about 0.15.

The cations of the formula may be as described above (e.g., methylammonium, formamidinium, cesium, butylammonium). Examples of other cations that may be used include, but are not limited to, imidazolium, dimethylammonium, guanidinium, ammonium, methylformamidinium, tetramethylammonium, trimethylammonium, rubidium, copper, palladium, platinum, silver, gold, rhodium, ruthenium, sodium, potassium, iron, other inorganic cations, other organic cations, or the like, or any combination thereof. The perovskite layer may not comprise additional additives. For example, the perovskite layer may not comprise thiocyanate. In another example, the perovskite layer may not comprise carbamides. The perovskite layer may be configured to provide high performance and longevity without additional additives. The lack of additional additives may provide lower cost and easier manufacturing of the perovskite layer. The inclusion of the cesium cation (or an equivalent alternate cation) may improve the thermal stability of the perovskite layer. For example, the presence of cesium can increase the strength of the molecular bonds of the lead halide structure of the perovskite layer. The cesium ions may also have a lower vapor pressure than organic ions, which may contribute to the thermal stability of the perovskite layer. The inclusion of formamidinium may be more resilient to high temperatures due to their increased molecular weight as compared to other organic cations (e.g., methylammonium). Due to a possible intrinsic instability of a pure formamidinium perovskite, including cesium and/or methylammonium cations can improve the crystalline stability while maintaining thermal stability. Adding too many light organic cations (e.g., methylammonium) can reduce thermal stability. Adding a small percentage of butylammonium iodide can improve the quality of the perovskite layer due to the larger molecular structure of butylammonium being better able to fill the gaps in the perovskite crystalline structure to better passivate defects or imperfects within the crystal, which can in turn achieve higher quality or performance perovskite layers.

The perovskite solar cell may be a perovskite solar cell as described elsewhere herein. For example, the perovskite solar cell may be a solar cell formed on a top glass of a silicon solar cell. The perovskite layer may retain at least about 10, 11, 12, 13, 14, 15, 20, 25, 30, 35, 40, 45, 50, 55, 60, 65, 70, 75, 80, 85, 90, 95, 99, or more percent of the initial conversion efficiency value after 300 hours of illumination under one sun conditions in an air atmosphere at >25° C. and <100° C. The perovskite layer may retain at most about 99, 95, 90, 85, 80, 75, 70, 65, 60, 55, 50, 45, 40, 35, 30, 25, 20, 15, 14, 13, 12, 11, 10, or less percent of the initial conversion efficiency value after 300 hours of illumination under one sun conditions in an air atmosphere at >25° C. and <100° C. The perovskite layer may retain a percent of the initial conversion efficiency value after 300 hours of illumination under one sun conditions in an air atmosphere at >25° C. and <100° C. as defined by any two of the proceeding values.

In another aspect, the present disclosure provides a method. The method may comprise providing a substrate. A perovskite precursor may be applied to the substrate. The perovskite precursor may be annealed to form a perovskite layer. The perovskite layer may comprise a composition of $MA_{n1}FA_{n2}Cs_{n3}PbX_3$. MA may be methylammonium. FA may be formamidinium. n1, n2, and n3 may independently be greater than 0 and/or less than 1. n1+n2+n3 may equal 1. A perovskite solar cell comprising said perovskite layer may retain at least about 80% solar conversion efficiency after 300 hours of illumination under one sun conditions in an air atmosphere at >25° C. and <100° C. The perovskite layer may be subjected to an encapsulation lamination process at a temperature of at least about 120° C. The method may be as described elsewhere herein. For example, the method can be process 300 of FIG. 3.

The temperature of the encapsulation lamination process may be at least about 15, 20, 25, 30, 35, 40, 45, 50, 55, 60, 65, 70, 75, 80, 85, 90, 95, 100, 105, 110, 115, 120, 125, 130, 135, 140, 145, 150, 160, 170, 180, 190, 200, or more degrees Celsius. The temperature of the encapsulation lamination process may be at a temperature of at most about 200, 190, 180, 170, 160, 150, 145, 140, 135, 130, 125, 120, 115, 110, 105, 100, 95, 90, 85, 80, 75, 70, 65, 60, 55, 50, 45, 40, 35, 30, 25, 20, 15, or less degrees Celsius. The temperature of the encapsulation lamination process may be in a temperature range as defined by any two of the proceeding values. The encapsulation may be as described elsewhere herein (e.g., with respect to encapsulant 135 of FIG. 1).

The perovskite solar cell may be a perovskite solar cell as described elsewhere herein. For example, the perovskite solar cell can be a solar cell formed on a top glass of a silicon solar cell. The perovskite layer may retain at least about 10, 11, 12, 13, 14, 15, 20, 25, 30, 35, 40, 45, 50, 55, 60, 65, 70, 75, 80, 85, 90, 95, 99, or more percent of the initial conversion efficiency value after 300 hours of illumination under one sun conditions in an air atmosphere at >25° C. and <100° C. The perovskite layer may retain at most about 99, 95, 90, 85, 80, 75, 70, 65, 60, 55, 50, 45, 40, 35, 30, 25, 20, 15, 14, 13, 12, 11, 10, or less percent of the initial conversion efficiency value after 300 hours of illumination under one sun conditions in an air atmosphere at >25° C. and <100° C. The perovskite layer may retain a percent of the initial conversion efficiency value after 300 hours of illumination under one sun conditions in an air atmosphere at >25° C. and <100° C. as defined by any two of the proceeding values. The perovskite layer may retain at least about 10, 11, 12, 13, 14, 15, 20, 25, 30, 35, 40, 45, 50, 55, 60, 65, 70, 75, 80, 85, 90, 95, 96, 97, 98, 99, or more percent of the initial conversion efficiency value after the encapsulation lamination process. The perovskite layer may retain at most about 99, 98, 97, 96, 95, 90, 85, 80, 75, 70, 65, 60, 55, 50, 45, 40, 35, 30, 25, 20, 15, 14, 13, 12, 11, 10, or less percent of the initial conversion efficiency value after the encapsulation lamination process. The perovskite layer may retain an efficiency of the initial conversion efficiency value after the encapsulation lamination process as defined by any two of the proceeding values.

The perovskite precursor may be applied as described elsewhere herein. For example, the perovskite precursor can be applied using an ultrasonic spray-on process. In this example, the precursors can be applied in different spray-on operations (e.g., lead (II) iodide can be applied to a substrate, and methylammonium iodide can be applied to the lead iodide). In another example, the perovskite precursors can be applied in a single operation. In this example, a solution comprising all of the precursors for the perovskite layer can be applied and annealed to form the perovskite layer. The annealing process may comprise heating the perovskite layer to at least about 15, 20, 25, 30, 35, 40, 45, 50, 55, 60, 65, 70, 75, 80, 85, 90, 95, 100, 105, 110, 115, 120, 125, 130, 135, 140, 145, 150, 160, 170, 180, 190, 200, or more degrees Celsius. The annealing process may comprise hating the perovskite layer to at most about 200, 190, 180, 170, 160, 150, 145, 140, 135, 130, 125, 120, 115, 110, 105, 100, 95, 90, 85, 80, 75, 70, 65, 60, 55, 50, 45, 40, 35, 30, 25, 20, 15, or less degrees Celsius. The annealing process may comprise heating the perovskite layer to a temperature range as defined by any two of the proceeding values.

The perovskite layer described herein may comprise a composition of $MA_{n1}FA_{n2}Cs_{n3}PbX_3$, wherein MA is methylammonium and FA is formamidinium. n1 may be of a value from about 0.01 to 0.03. n2 may be of a value from about 0.82 to 0.94. n3 may be of a value from about 0.05 to 0.015. n1+n2+n3 may equal one.

The following examples are illustrative of certain systems and methods described herein and are not intended to be limiting.

Example 1—Preparation of a Perovskite Photovoltaic Cell

An incoming glass substrate can be coated with indium tin oxide followed by nickel (II) oxide in a pair of physical vapor deposition processes to generate a substrate comprising a transparent conductive layer and a hole transport layer. The nickel oxide can then be laser scribed to generate templates of individual photovoltaic cells.

Subsequently, lead (II) iodide in a solution of dimethylformamide and dimethyl sulfoxide can be applied to the hole transport layer via an ultrasonic spray process. To the lead (II) iodide, methylammonium iodide in a solution of dimethylformamide and dimethyl sulfoxide can be applied via an ultrasonic spray process. The lead (II) iodide and the methylammonium iodide can be annealed to permit reaction of the two perovskite precursors and evaporation of the solvents, thus forming a methylammonium lead iodide perovskite layer. To the newly formed perovskite layer, a phenyl-C61-butyric acid methyl ester (PCBM) hole transport layer can be applied in a solution of dimethylformamide and dimethyl sulfoxide by an ultrasonic spray process. The hole transport layer can then be laser scribed along the same pattern as the nickel oxide.

Subsequently, a second transparent conducting layer of indium tin oxide can be applied via physical vapor deposition, followed by application of silver electrodes by a similar physical vapor deposition process or in another embodiment, an attachment of charge collection tape directly to the ITO layer can be done. The electrodes can be cut via laser scribe to form the electrode assembly, and the individual photovoltaic cells can be isolated from one another by laser scribe.

Subsequently, the as formed photovoltaic cells can be investigated via various metrology techniques such as, for example, scanning electron microscopy (SEM), optical absorption/transmission, x-ray diffraction, atomic force microscopy, ellipsometry, electroluminescence spectroscopy, photoluminescence spectroscopy, time resolved optical spectroscopy, or the like, or any combination thereof. The metrology techniques may be improved for large area (e.g., greater than about 0.25, 0.5, 1, 1.25, 1.5, 2, 3, 4, 5, 6, or more square meters) metrology. For example, the metrology techniques can be configured to average over a wide area of the photovoltaic cells, which can improve throughput of the techniques. In another example, the metrology techniques can be configured to scan a plurality of small areas of the photovoltaic device for intra-device inhomogeneities. The metrology techniques may be performed in parallel (e.g., at a same or substantially same time).

After application of the second transparent conducting layer, an encapsulant can be applied to the back of the photovoltaic cell. The encapsulant can be applied prior to the isolation of the photovoltaic cells by laser scribe. A first encapsulant, such as a thermoplastic polyolefin, can be applied across the back of the photovoltaic cell while a second encapsulant, such as butyl rubber, can be applied to the edges of the photovoltaic cell. The back encapsulant can be optically transparent, while the side encapsulant can be optically transparent or opaque. For example, a higher quality (e.g., lower moisture and gas permeability) encapsulant can be placed on the sides of the photovoltaic cell even though it is not optically transparent because the side of the cell does not absorb light, while the encapsulant for the back of the cell can be transparent to allow light to pass through to a bottom junction.

Example 2—Inline Generation of Perovskite Photovoltaics

Each operation of the production of the perovskite photovoltaic cell may be integrated into a single instrument and/or location. For example, a substrate can be placed in a single instrument that performs all of the operations of process 300. The perovskite photovoltaic cell can be integrated with a second photovoltaic cell (e.g., a silicon photovoltaic cell) in the same instrument the perovskite cell was generated in. FIG. 10 is an example of an integrated production flow for a perovskite/silicon photovoltaic module. In this example, each operation can be performed in a same production line.

A large area (e.g., 1 meter×2 meter) glass substrate can be loaded onto a conveyor belt system configured to guide the glass substrate into an enclosure. The enclosure can comprise a controlled atmosphere (e.g., low moisture, oxygen content, temperature control, etc.). The enclosure can comprise a plurality of ultrasonic spray-on nozzles configured to spray a lead halide solution onto the glass substrate. Subsequent to the application of the lead halide solution, a different set of nozzles in the enclosure can apply a methylammonium halide with butylammonium halide solution to the lead halide. The conveyor belt can be configured to move the substrate from the lead halide application nozzles to the methylammonium halide/butyl halide solution application nozzles in a set time to permit formation of lead halide crystals that the methylammonium halide/butyl halide can integrate into to form a perovskite layer. After application of the methylammonium halide with butylammonium halide solution, the substrate can move into an annealing oven. In another embodiment, the formulation consisting of lead halide, methylammonium, formamidinium in a solution of dimethyl sulfoxide and methyl-2-pyrrolidinone (NMP) can be applied as a single formulation via a 1-step ultrasonic spray process, following by an accelerating drying process step via applying a low vapor pressure chemical like diethyl ether chemical, before annealing. Within the annealing oven, the substrate can be heated to form a perovskite layer with predetermined characteristics (e.g., grain size, thickness, elemental distribution, etc.). The annealing oven may be inline with the conveyor belt (e.g., the conveyor belt moves through the oven to perform the annealing). The annealing oven may be a batch annealing oven (e.g., multiple substrates can be loaded into the oven to be annealed at the same time). The type of annealing oven may be determined by the cycle time of the oven as compared to the anneal duration.

After formation of the perovskite layer, the substrate can pass through another set of ultrasonic spray-on nozzles for application of the electron transport layer to the perovskite layer. A second transparent conductive layer can then be applied via physical vapor deposition to the electron transport layer, electrodes can be applied via physical vapor deposition, and the individual photovoltaic cells can be isolated via laser scribe. The entire inline process can take place on a single conveyor belt.

Example 3—Use of PDMS as an Encapsulant

Figure 11:
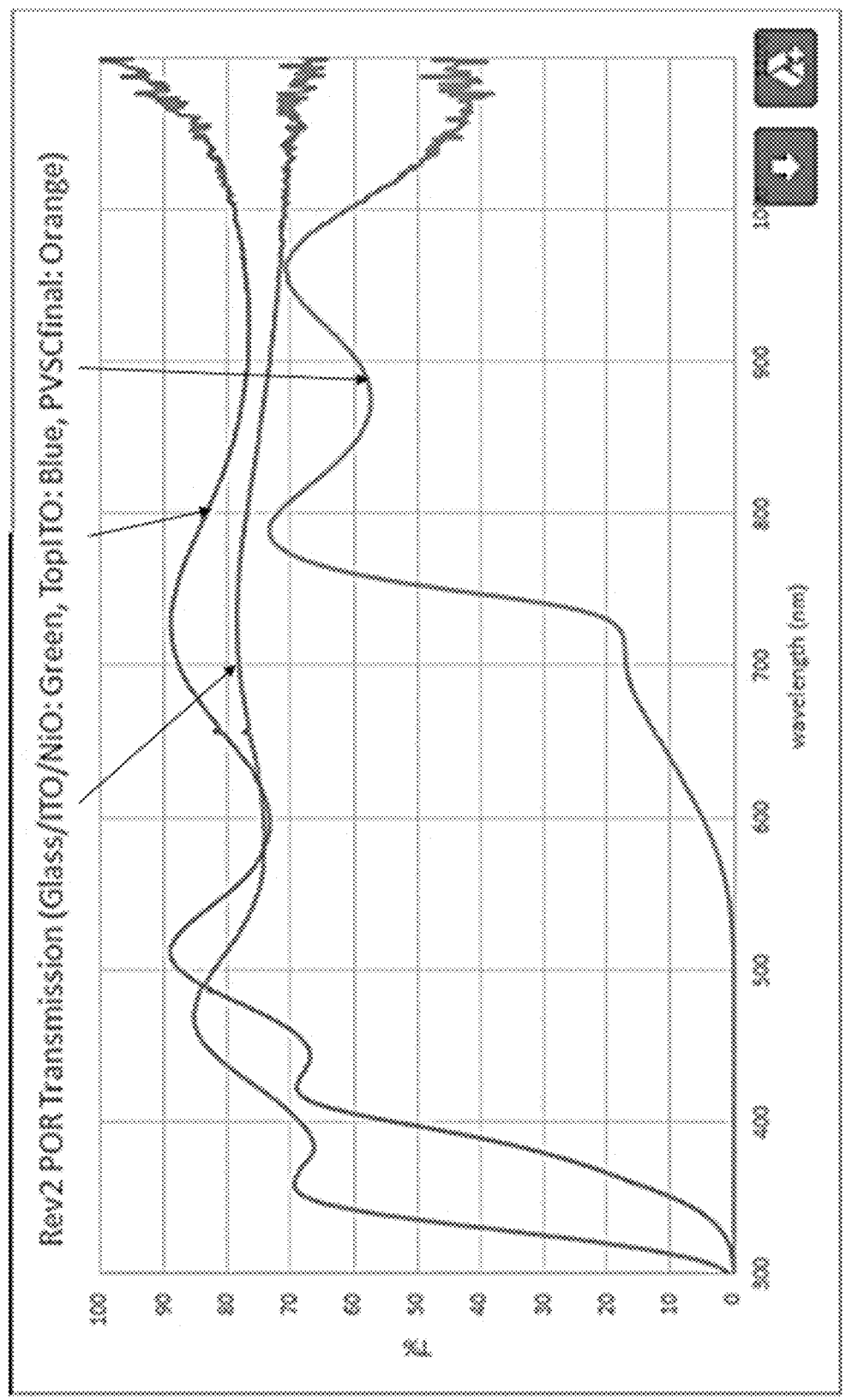
FIG. 11 shows the transmission of various wavelengths of light through a perovskite solar cell, according to an embodiment.

PDMS may be used as an encapsulant in a tandem, 4-terminal, silicon-perovskite solar module (i.e., the solar module 100 of FIG. 1). The PDMS encapsulant was placed between the perovskite solar cell and the silicon solar cell during the lamination of the perovskite to the silicon solar cell. FIG. 11 shows the transmission of various wavelengths of light through the perovskite solar cell when the PDMS encapsulant is not used. The average transmission percentage through the top TCO layer is 72.24. The average weighted transmission percentage is 74.67%. The average weighted transmission percentage is weighted according to the power delivered by each wavelength of light. The average transmission percentage through the top glass layer, the top TCO layer, and the HTL is 72.20%. The average weighted transmission percentage is 72.68%. The average transmission percentage through the perovskite solar cell is 29.20%. The average weighted transmission percentage is 24.34%. When a PDMS encapsulant is used, the transmission percentage to the silicon solar cell improves to 40.44%, with a weighted average of 33.48%.

Table 1 below shows the improvements in voltage and current characteristics when the PDMS encapsulant is used. In particular, short circuit current density improves from 13.93 milliamps per square centimeter ("mA/cm$^2$") with an airgap between the perovskite solar cell and the silicon solar cell to 22.72 mA/cm$^2$ when the air gap is filled with a spun-on PDMS. Within Table 1, "EFF" refers to efficiency, "FF" refers to fill factor of the current/voltage graph, the "aperture" refers to a test of the photovoltaic cell in which a portion of the cell is illuminated through an aperture that blocks the rest of the cell, while "cell itself" refers to a measurement over the entire cell without an aperture.

TABLE 1

|  | Cell itself | Airgap, aperature | Spun-on PDMS, aperature |
|---|---|---|---|
| EFF (%) | 20.12 | 5.75 | 8.54 |
| FF (%) | 76 | 71.9 | 70.1 |
| Open circuit voltage (Voc) (millivolts) | 649.4 | 573.8 | 535.7 |
| Short circuit current density (Jsc) (milliamps/square centimeter) | 40.74 | 13.93 | 22.72 |
| Maximum voltage (Vmax) (millivolts) | 528.4 | 460.5 | 421.7 |
| Maximum current density (Jmax) (milliamps/square centimeter) | 38.07 | 12.48 | 20.25 |
| Short circuit current (Isc) (amps) | 0.102 | 0.0163 | 0.005772 |
| Short circuit resistance (Rsc) (Ohms) | 385.66 | 327.47 | 97473 |
| Open circuit resistance (Roc) (Ohms) | 0.417 | 2.8526 | 4.9478 |
| Area (square centimeters) | 2.5 | 1.17 | 0.254 |

Example 4—Use of PDMS on the Top Glass Sheet

PDMS may be applied to the top glass sheet of a tandem, 4-terminal, silicon-perovskite solar module (i.e., the solar module 100 of FIG. 1). Table 2 shows the resulting uptick in short circuit current density when such various types of PDMS are used. The improvements are the result of better light trapping and refractive index matching as light travels to the perovskite solar cell from the air, through the PDMS, and to the glass.

TABLE 2

|  | bare | 1:10 alumina_PDMS | textured 1:50 alumina_PDMS | textured PDMS |
|---|---|---|---|---|
| EFF | 15.39 | 16.35 | 16.32 | 16.83 |
| FF | 74.6 | 75.3 | 74.9 | 74.8 |
| Voc | 1105.1 | 1105.5 | 1117.7 | 1125 |

TABLE 2-continued

|  | bare | 1:10 alumina_PDMS | textured 1:50 alumina_PDMS | textured PDMS |
|---|---|---|---|---|
| Jsc | 18.67 | 19.63 | 19.49 | 20.01 |
| Vmax | 900 | 900 | 920 | 920 |
| Jmax | 17.1 | 18.16 | 17.74 | 18.3 |
| Isc | 0.004741 | 0.004986 | 0.004951 | 0.005083 |
| Rsc | 12125 | 25615 | 15660 | 22587 |
| Roc | 22.993 | 20.78 | 22.156 | 23.072 |
| Area |  | 0.254 |  |  |

Example 5—Performance of a Solar Module with and without an Ultrathin Silver Layer As mentioned in the disclosure, the PVD of the second TCO layer on the ETL can lead to defects in both the perovskite layer and the ETL in the tandem, 4-terminal, silicon-perovskite solar module (i.e., the solar module 100 of FIG. 1). The defects can be minimized with the inclusion of an ultrathin layer of silver deposited at the interface between the ETL and the second TCO layer.

Figure 15:
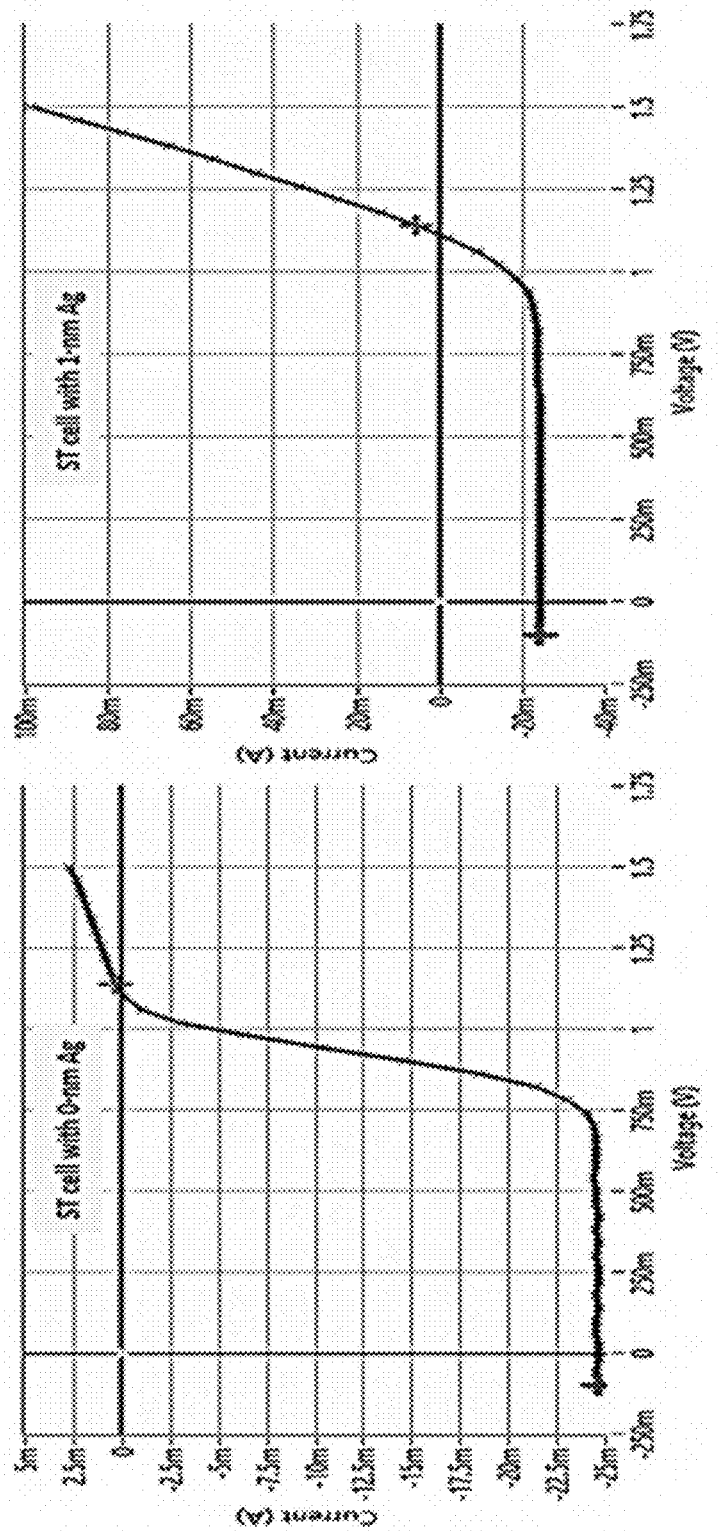
FIG. 15 is a graph illustrating the current-voltage performance of solar modules manufactured with and without an ultrathin layer of silver, according to an embodiment.

As illustrated in FIG. 15, the current and voltage (IV) performance of a solar module with the ultrathin layer of silver is better than that of a solar module without the ultrathin layer of silver. The ultrathin layer of silver leads to better performance due to the added blocking and shielding effect of the silver during the TCO PVD process. Without the silver layer, the solar module has a degraded fill factor (FF) due to an increased number of defect sites at the interface between the second TCO layer and the ETL and/or the bulk of the ETL and perovskite layers due to the TCO PVD process.

Table 3 further illustrates the increased performance of the solar module with the inclusion of the ultrathin silver layer. For example, with the silver layer, the solar module shows better efficiency, fill factor, open circuit voltage (Voc), short circuit voltage (Jsc), short circuit current (Isc), short circuit resistance (Rsc), and open circuit resistance (Roc).

TABLE 3

| 22-Oct |  |  |  |  |  |
|---|---|---|---|---|---|
| Thin Ag | 0 |  | 1 |  | nm |
| PbX2 | 467 + 24 + 25 | 474 + 18 + 24 | 467 + 24 + 25 | 474 + 18 + 24 | mg/ml |
| top ITO |  | 40 W 23 nm, 60 W 350 nm |  |  |  |
| Semitransparent Cells |  |  |  |  |  |
| EFF | 6.94 | 7.31 | 11.74 | 11.32 | % |
| FF | 34.5 | 35.5 | 54.5 | 54.4% | % |
| Voc | 1139.8 | 1149.2 | 1148.3 | 1122.3 | mV |
| Jsc | 17.66 | 17.9 | 18.75 | 18.54 | mA/cm2 |
| Vmax | 525 | 600.1 | 725.1 | 750.1 | mV |
| Jmax | 13.22 | 12.17 | 16.19 | 15.09 | mA/cm2 |
| Isc | 0.02349 | 0.02381 | 0.02494 | 0.02465 | A |
| Rsc | 505.19 | 270.77 | 1488.7 | 587.7 | Ohm |
| Roc | 345.34 | 174.56 | 21.416 | 10.623 | Ohm |
| A |  | 1.33 |  |  | cm2 |
| Values after 100 C. postanneal |  |  |  |  |  |
| EFF | 13.58 | 13.26 | 15.99 | 14.85 | % |
| FF | 66.4 | 61.3 | 74.2 | 71 | % |
| Voc | 1104.6 | 1134.7 | 1136.8 | 1111.5 | mV |
| Jsc | 18.51 | 19.07 | 18.97 | 18.8 | mA/cm2 |
| Vmax | 800 | 775.1 | 900.2 | 875.1 | mV |
| Jmax | 16.97 | 17.11 | 17.76 | 16.96 | mA/cm2 |
| Isc | 0.02462 | 0.02537 | 0.02523 | 0.02501 | A |
| Rsc | 2155.9 | 843.58 | 4412.3 | 1847.3 | Ohm |
| Roc | 41.151 | 89.698 | 5.897 | 5.8811 | Ohm |

Example 6—Performance of a Solar Module Fabricated in an Inline PVD Process

As described herein, the 4-terminal, silicon-perovskite solar module (i.e., the solar module 100 of FIG. 1) can be fabricated in an inline manufacturing process. The inline manufacturing process reduces the amount of ion damage and UV exposure to the ETL and perovskite layers during the PVD process, which leads to an increased efficiency of the resultant solar module.

Table 4 illustrates the increased efficiency of the solar modules fabricated in the inline manufacturing process. Table 4 points out (in bold text) specific scenarios where the solar module exhibited high efficiency, fill factor, and open circuit voltage due to the inline manufacturing process. Table 4 also illustrates that the inline manufacturing process is sufficiently effective in reducing defects to the ETL and perovskite layers such that the addition of the ultrathin layer of silver is not necessarily needed. As shown in Table 4, the ultrathin layer of silver does not provide for the same increase in efficiency as it does for solar modules not fabricated using the inline manufacturing process (e.g., compare the data in Table 4 to the data provided in Table 3 of Example 5).

TABLE 4

| Devices with thin Ag (0.6 nm) | | | | Devices without thin Ag | | | |
|---|---|---|---|---|---|---|---|
| 468-100 C., 6m + scribing | | 470-100 C., 6m + scribing | | 471-100 C., 3m + scribing | | 472-scribing | |
| EFF | 7.07% | EFF | 10.20% | EFF | 15.21% | EFF | 3.72% |
| FF | 36% | FF | 48% | FF | 63.7% | FF | 25.7% |
| $V_{OC}$ | 1021.7 mV | Voc | 1118 mV | Voc | 1147.5 mV | Voc | 930.4 mV |
| $J_{SC}$ | 19.24 mA/cm2 | Usc | 19.01 mA/cm2 | Jsc | 20.8 mA/cm2 | Jsc | 15.58 mA/cm2 |
| Devices with thin Ag (0.6 nm) | | | | Devices without thin Ag | | | |
| 463-100 C., 3m | | 467-No anneal | | 462-100 C., 3m | | 462-100 C., 3m | |
| EFF | 15.33% | EFF | 14.12% | EFF | 12.04% | EFF | 14.51% |
| FF | 66.2% | FF | 61.7% | FF | 51.2% | FF | 66.7% |
| $V_{OC}$ | 1073 mV | Voc | 1081 mV | Voc | 1089 mV | Voc | 1073 mV |
| $J_{SC}$ | 21.57 mA/cm2 | Jsc | 21.15 mA/cm2 | Jsc | 21.58 mA/cm2 | Jsc | 20.25 mA/cm2 |
| Devices with thin Ag (1.2 nm) | | | | Devices without thin Ag | | | |
| 510-100 C., 3m | | 511- 100 C., 3m | | 512-100 C., 3m | | 519 | |
| EFF | 16.08% | EFF | 15.74% | EFF | 15.11% | DOA - fab problem | |
| FF | 71.3% | FF | 70.1% | FF | 72.0% | | |
| $V_{OC}$ | 1081 mV | Voc | 1074 mV | $V_{OC}$ | 1057 mV | | |
| $J_{SC}$ | 20.86 mA/cm2 | Jsc | 20.91 mA/cm2 | $J_{SC}$ | 19.83 mA/cm2 | | |
| Devices with thin Ag (1.2 nm) | | | | Devices without thin Ag | | | |
| 523-no anneal | | 537-100 C., 3m | | 517-100 C., 3m | | 520-100 C., 2m | |
| EFF | 9.78% | EFF | 14.66% | EFF | 14.33% | EFF | 11.41% |
| FF | 49.3% | FF | 65.9% | FF | 68.4% | FF | 61.2% |
| $V_{OC}$ Shunted | 1028 mV | $V_{OC}$ | 1064 mV | $V_{OC}$ | 1087 mV | $V_{OC}$ | 1046 mV |
| $J_{SC}$ | 19.28 mA/cm2 | $J_{SC}$ | 20.92 mA/cm2 | $J_{SC}$ | 19.28 mA/cm2 | $J_{SC}$ | 17.81 mA/cm2 |
| Devices with thin Ag (1.2 nm) | | | | Devices without thin Ag | | | |
| 522-no anneal | | 547-100 C., 2m | | 516-100 C., 2m | | 518-100 C., 2m | |
| EFF | 1.03% | EFF | 17.52% | EFF | 16.72% | EFF | 17.50% |
| FF | 25% | FF | 77.9% | FF | 73.2% | FF | 77.2% |
| $V_{OC}$ Shunted | 259 mV | $V_{OC}$ | 1114 mV | $V_{OC}$ | 1101 mV | $V_{OC}$ | 1116 mV |
| $J_{SC}$ | 15.85 mA/cm2 | $J_{SC}$ | 20.19 mA/cm2 | $J_{SC}$ | 20.74 mA/cm2 | $J_{SC}$ | 20.3 mA/cm2 |
| | $J_{SC}$ (mA/cm$^2$) | | 21.22 | 21.01 | | | |
| | $V_{MAX}$ (mV) | | 975.1 | 925.2 | | | |
| | $J_{MAX}$ (mA/cm$^2$) | | 19.59 | 20.15 | | | |
| | $I_{SC}$ (A) | | 0.0255 | 0.0273 | | | |
| | $R_{SC}$ (Ohm) | | 1200 | 8400 | | | |
| | $R_{OC}$ (Ohm) | | 3.83 | 3.73 | | | |
| | A (cm$^2$) | | 1.2 | 1.3 | | | |

Example 7—Electrical Connections of Tandem Solar Modules

FIGS. 16-19 show examples of different electrical network connections for different types of silicon-perovskite hybrid solar modules. The detail inserts can illustrate the electrical connectivity of the silicon-perovskite hybrid solar modules. The leads from the perovskite solar module can be connected to the leads of the silicon solar module. For example, the perovskite solar module can comprise a plurality of strips of perovskite solar cells connected in series. The silicon solar cells can be connected in a similar way. This can result in two leads coming from the silicon solar module and two leads coming from the perovskite solar module. These leads can then be connected together and to a junction box for transfer of the power out of the solar module. Such a scheme of connecting a silicon solar module and perovskite solar module to form a hybrid solar module can work for any geometry of silicon and perovskite solar cells. For example, the silicon module can comprise front contact silicon solar cells, integrated back contact silicon solar cells, shingled silicon solar cells, etc. In another example, the perovskite solar cells can be strip solar cells, tiled solar cells, front contact solar cells, etc. The perovskite solar cells may comprise a plurality of cells comprising a plurality of strips of perovskite solar cells connected in series. For example, a plurality of cells each comprising a plurality of strips of perovskite solar cells can be connected in parallel in a voltage matching scheme.

In an example of a hybrid module, a six by ten array of silicon solar cells is electrically connected in series to form a silicon solar module with an open circuit voltage of 0.7 V×60=42 V. A perovskite layer is cut via laser scribe to form 40 strip solar cells. Each strip is about 20 mm wide by 300 mm long. The 40 strips are connected in series. The strips can be connected, for example, via a P1/P2/P3 layer method. The connected strips can in turn be connected to one another via electrodes/charge collection tape placed at the ends of the connected strips as described elsewhere herein. Each strip may have an open circuit voltage of 1.1 V, and the 40 series-connected strip may have a total voltage of 1.1 V×40=44V. To achieve full coverage of the silicon solar panel, five units of the 40 strip solar cells can be tiled on the same glass sheet. The units can in turn be connected in parallel to maintain the voltage matching condition. This can result in a substantially voltage matched hybrid module.

Example 8—Performance of a Mixed Composition Perovskite Solar Cell

As described elsewhere herein, a perovskite layer (e.g., the perovskite layer 120 of FIG. 1) can comprise a mixed composition. The mixed composition can improve the stability of the perovskite layer, thus improving the overall output of the tandem solar module. Further, the mixed composition can be used to tune the properties of the perovskite layer to match a specific application.

Figure 21:
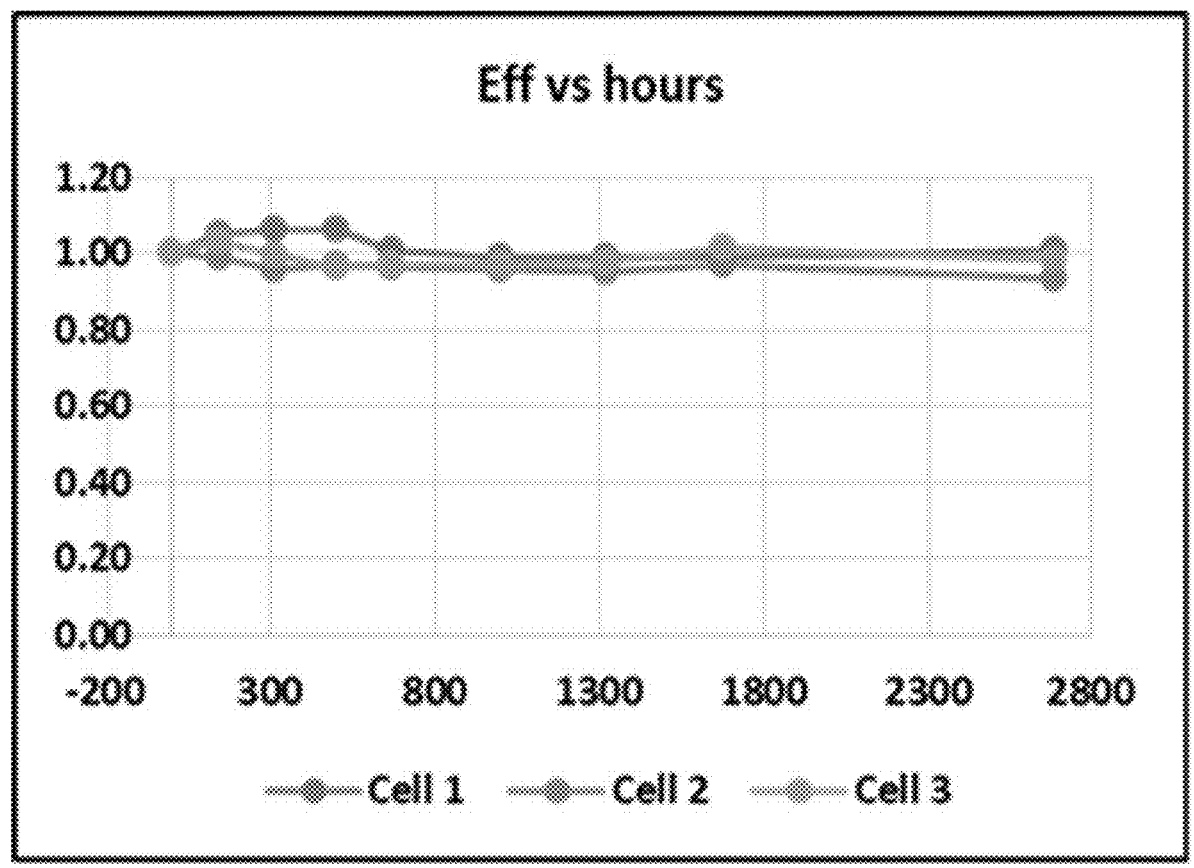
FIG. 21 is a graph that illustrates the efficiency of three perovskite solar cells during a reliability test at 85° C. and 85% relative humidity, according to an embodiment.

FIG. 21 is a graph which illustrates the efficiency of three perovskite solar cells over the course of an extended 85° C. at 85% relative humidity (85° C./85%) reliability test. Such a reliability test can be an accelerated aging test that can show the long-term stability of the solar cell to moisture or atmospheric ingress. As seen in FIG. 21, the solar cells can show little degradation even over long times. Such slow degradation can be due to a combination of the composition of the perovskite layer as well as the quality of the encapsulation of the perovskite layer. The module can have performance that passes a standardized testing requirement. For example, such a module can pass a reliability test such as the IEC 61215 or IEC 61646 standard, and even exceed the performance of the standard (e.g., still pass the standard after 4000 hours of testing).

Figure 22A:
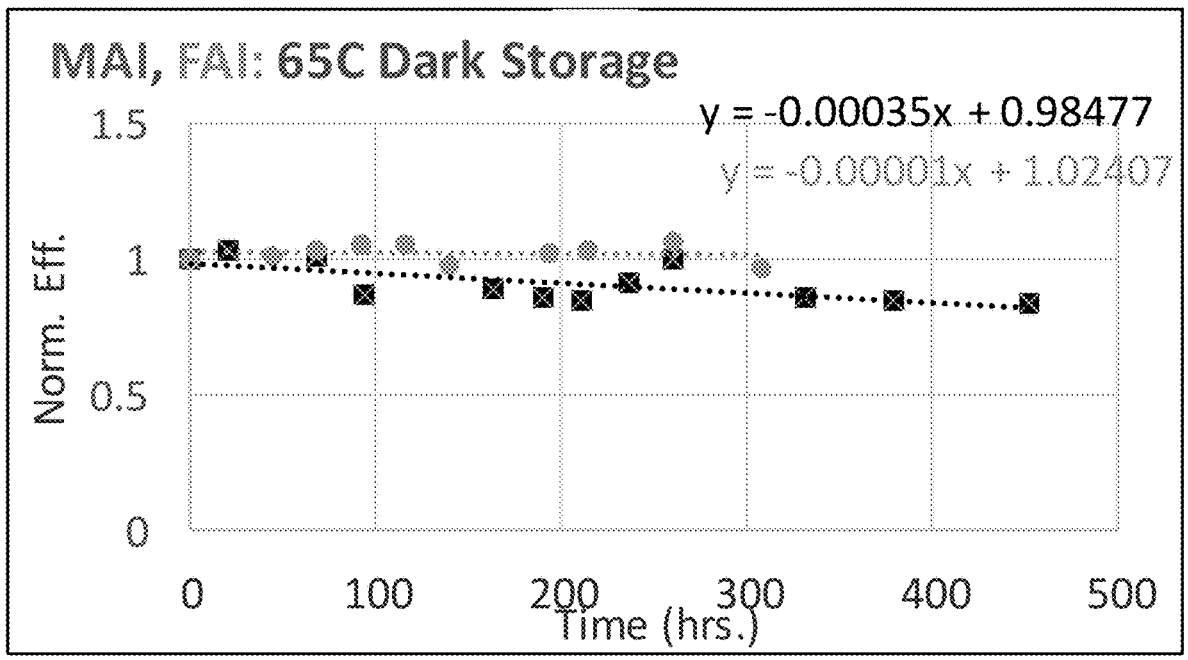
FIGS. 22A-22B show an example of the efficiency degradation of a perovskite solar cell under dark thermal stress testing and under 1-sun illumination at the maximum power point thermal stress testing, according to an embodiment.
Figure 22B:
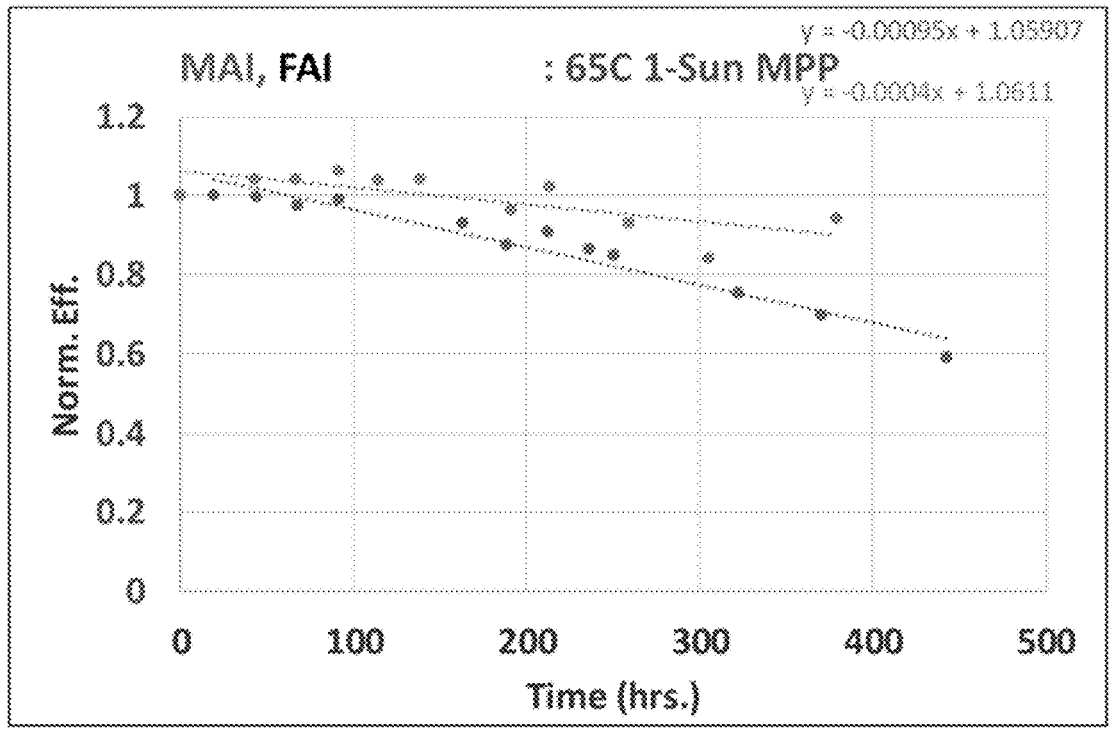

FIGS. 22A-22B show an example of the efficiency degradation of a perovskite solar cell under dark thermal stress testing (FIG. 22A) and under 1-sun illumination at the maximum power point thermal stress testing (FIG. 22B). The perovskite solar cell comprising formamidinium can show little to no degradation under no illumination at 65° C., demonstrating the improved thermal stability granted by the heavier cation as compared to the minor thermal degradation of the solar cell comprising methylammonium. Under illumination at 65° C. the performance improvement of the formamidinium containing solar cell can become more apparent, with the formamidinium solar cell losing less than a quarter of the performance loss of the methylammonium solar cell.

Figure 23A:
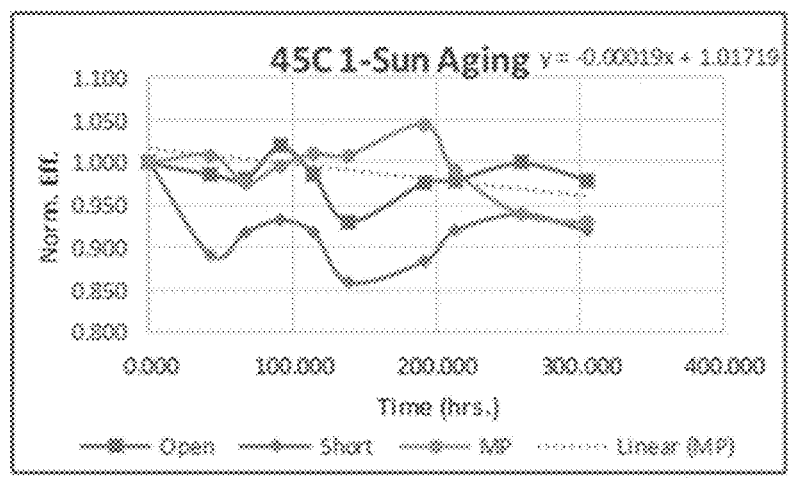
FIGS. 23A-23C show open, short, and maximum power point efficiency graphs for a variety of temperatures for a perovskite solar cell, according to an embodiment.
Figure 23B:
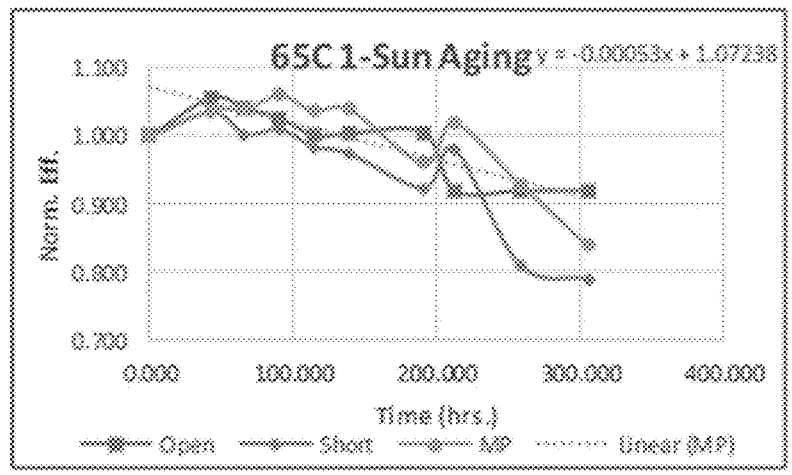
Figure 23C:
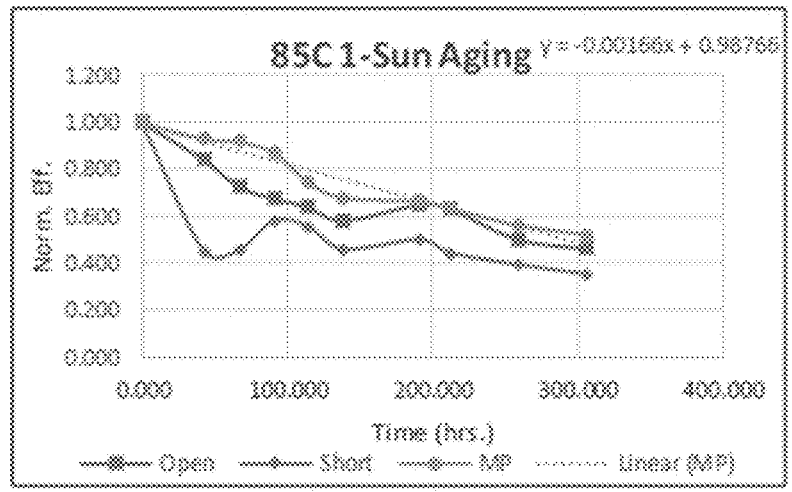

The high temperature aging plots of FIGS. 23A-23C show open, short, and maximum power point efficiency graphs for a variety of temperatures for a perovskite solar cell with a composition of $MA_{0.2}FA_{0.88}Cs_{0.1}PbI_3$. As seen in FIG. 23B, the mixed composition perovskite performs better than the corresponding methylammonium only or formamidinium only perovskite from FIG. 17B under the same conditions.

Table 5 illustrates the performance of a thermally stable perovskite with a composition of $Cs_{0.12}FA_{0.88}MA_{0.02}PbCl_{0.01}Br_{0.09}I_{0.9}$. Despite being subjected to a relatively high temperature annealing operation, the perovskite solar cell was still able to maintain a high solar conversion efficiency of 18.64%. Such a high efficiency demonstrates the high stability that can be achieved in mixed composition perovskites.

TABLE 5

| $Cs_{0.12}FA_{0.88}MA_{0.02}PbCl_{0.01}Br_{0.09}I_{0.9}$ | | |
|---|---|---|
| Device Type | Opaque | Semitransparent |
| Top ITO | NA | 40 W 23 nm, 60 W 350 nm |
| Post Annealing | NA | 140° C. |
| Efficiency (%) | 19.11 | 18.64 |
| Fill Factor (%) | 77.9 | 78.6 |
| $V_{OC}$ (mV) | 1155.7 | 1129.6 |
| $J_{SC}$ (mA/cm$^2$) | 21.22 | 21.01 |
| $V_{MAX}$ (mV) | 975.1 | 925.2 |
| $J_{MAX}$ (mA/cm$^2$) | 19.59 | 20.15 |
| $I_{SC}$ (A) | 0.0255 | 0.0273 |
| $R_{SC}$ (Ohm) | 1200 | 8400 |
| $R_{OC}$ (Ohm) | 3.83 | 3.73 |
| A (cm$^2$) | 1.2 | 1.3 |

Table 6 illustrates various parameters for perovskite solar cells with different types of edge sealing before a high temperature (e.g., >120° C.) encapsulation lamination process, directly after lamination, after an annealing operation at 100° C. for 10 minutes, and again after two days. The first column provides data for a perovskite solar cell with no edge sealing, while the middle column is for a perovskite solar cell with two edges sealed and the right column is for a perovskite solar cell with all four edges sealed. In each case, the perovskite solar cell was able to recover most, if not all, of the original efficiency after the annealing. Such thermal stability can permit use of higher quality, and higher temperature, encapsulation processes, which can in turn improve the longevity and efficiency of the solar cells.

TABLE 6

| | Cell #693 | | | | #692 | | | |
|---|---|---|---|---|---|---|---|---|
| | Lami temp (C.) 120 | | | | | | | |
| | Pressing/curing 3 min high pressure/5 min vac | | | | | | | |
| | Edge | | | | | | | |
| | No Helio-Seal | | | | Helio-Seal (2 sides) | | | |
| | Initial | Lami-nation | 100 C., 10 min | Restest 2 days | Initial | Lami-nation | 100 C., 10 min | Restest 2 days |
| EFF (%) | 9.35 | 7.37 | 8.35 | 8.07 | 17.46 | 8.21 | 11.89 | 15.81 |
| FF (%) | 53.4 | 50.1 | 52.1 | 62.5 | 75.4 | 48.5 | 59.6 | 74.4 |
| Voc (mV) | 862.5 | 845.1 | 939 | 1073.2 | 1120.1 | 829.2 | 1006.3 | 1122.7 |
| Jsc (mA/cm2) | 20.31 | 17.41 | 17.07 | 12.03 | 20.68 | 20.41 | 19.83 | 18.94 |
| Vmax (mV) | 575 | 550 | 625.1 | 750.1 | 925.1 | 525 | 700.1 | 900.1 |
| Jmax (mA/cm2) | 16.27 | 13.4 | 13.36 | 10.76 | 18.87 | 15.63 | 16.99 | 17.57 |
| Isc (A) | 0.026407 | 0.022631 | 0.02219 | 0.015635 | 0.026888 | 0.026539 | 0.025773 | 0.02462 |
| Rsc (ohm) | 9097 | 1281.5 | 2185.3 | 1812.8 | 1396.7 | 1838.5 | 2218.8 | 3176.3 |
| Roc (ohm) | 9.9289 | 15.304 | 14.151 | 12.7 | 4.3539 | 11.503 | 10.212 | 5.2715 |
| A (cm2) | 1.3 | 1.3 | 1.3 | 1.3 | 1.3 | 1.3 | 1.3 | 1.3 |

| | #698 | | | |
|---|---|---|---|---|
| | Lami temp (C.) 120 | | | |
| | Pressing/curing 3 min high pressure/5 min vac | | | |
| | Edge | | | |
| | Helio-Seal (4 sides) | | | |
| | Initial | Lami-nation | 100 C., 10 min | Restest 2 days |
| EFF (%) | 17.4 | 11.07 | 15.63 | 17.65 |
| FF (%) | 74.9 | 54.1 | 67.4 | 76.7 |
| Voc (mV) | 1116.6 | 977.6 | 1118.2 | 1119.4 |
| Jsc (mA/cm2) | 20.81 | 20.95 | 20.74 | 20.57 |
| Vmax (mV) | 900.1 | 650.2 | 850.1 | 925.1 |
| Jmax (mA/cm2) | 19.34 | 17.03 | 18.38 | 19.08 |
| Isc (A) | 0.027051 | 0.027231 | 0.026965 | 0.026736 |
| Rsc (ohm) | 1562.7 | 5824.8 | 5467.8 | 1128.7 |
| Roc (ohm) | 4.3176 | 10.488 | 6.0506 | 4.282 |
| A (cm2) | 1.3 | 1.3 | 1.3 | 1.3 |

Example 9—Scalable Manufacturing Methods for Perovskite Solar Cells

A spray on precursor solution comprising lead (II) halides, methylammonium iodide, cesium, formamidinium iodide, dimethylformamide, dimethylsulfoxide, and N-methyl-2-pyrrolidone can be formed as described elsewhere herein. For example, the precursors or salts thereof can be mixed together, stirred, and slightly heated to improve homogeneity. The resultant precursor solution can be applied to a substrate via an ultrasonic spray-on process and dried at room temperature for 5-15 minutes. The substrate with the precursor layer can then be soaked in an antisolvent to form the perovskite layer. Examples of soaking include substrate dipping into the antisolvent, mechanical spraying of the antisolvent, chemical showering of the antisolvent, or the like, or any combination thereof. A slow addition of the perovskite film to the antisolvent may be effective in reducing defects in the film and residue left on the film. For example, a back and forth movement of the film during addition to an antisolvent bath can produce defects at the contact line between the film and the antisolvent. The substrates can be slowly introduced to the solvent bath to avoid such defects. Alternatively, a controlled pour rinse followed by a air knife dry can produce a high quality perovskite film.

Figure 24A:
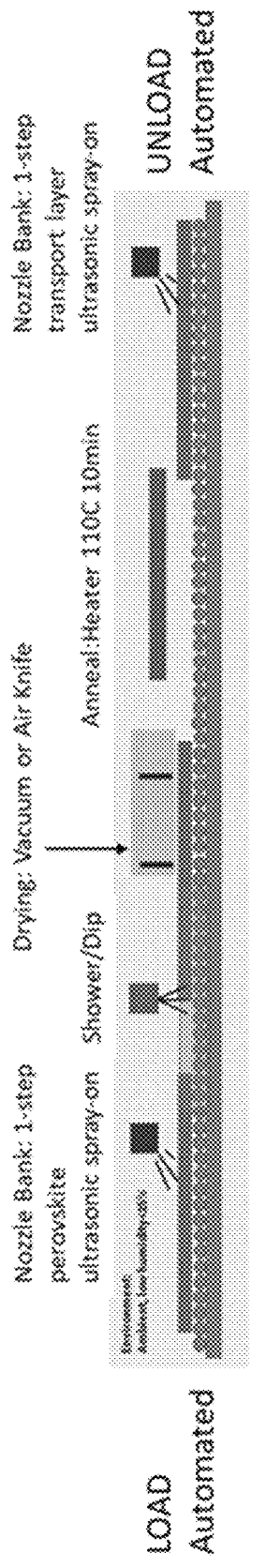
FIGS. 24A-24B show examples of apparatuses for generating a perovskite layer comprising use of an antisolvent and without use of an antisolvent, respectively, according to some embodiments.

Examples of antisolvent include, but are not limited to, diethyl ether, dibutyl ether, chlorobenzene, chloroform, or the like, or any combination thereof. Selection of the antisolvent may depend on miscibility of the antisolvent with the solvent (e.g., the solvent and antisolvent can be miscible), solubility of the perovskite in the antisolvent (e.g., the antisolvent may not effectively dissolve the perovskite), and the like. The quick removal of the solvent by way of the antisolvent may be important to the overall quality of the film. For example, if the antisolvent does not fully remove the solvent, an impenetrable skin can form on the top of the layer and inhibit further solvent removal. In another example, the quick removal of the solvent can result in a high quality film. The effluent from the soak can be recovered, refreshed (e.g., by removing solid particles), and reused for production of the next perovskite layer. The perovskite layer may be subsequently annealed as described elsewhere herein. For example, the perovskite layer can be annealed at a temperature between 90° C. and 110° C. for 5-15 minutes, and subsequently annealed at 110° C. for 10 minutes. FIG. 24A is an example of an apparatus for generating a perovskite layer comprising use of an antisolvent, according to an embodiment.

Figures 25A, 25B:
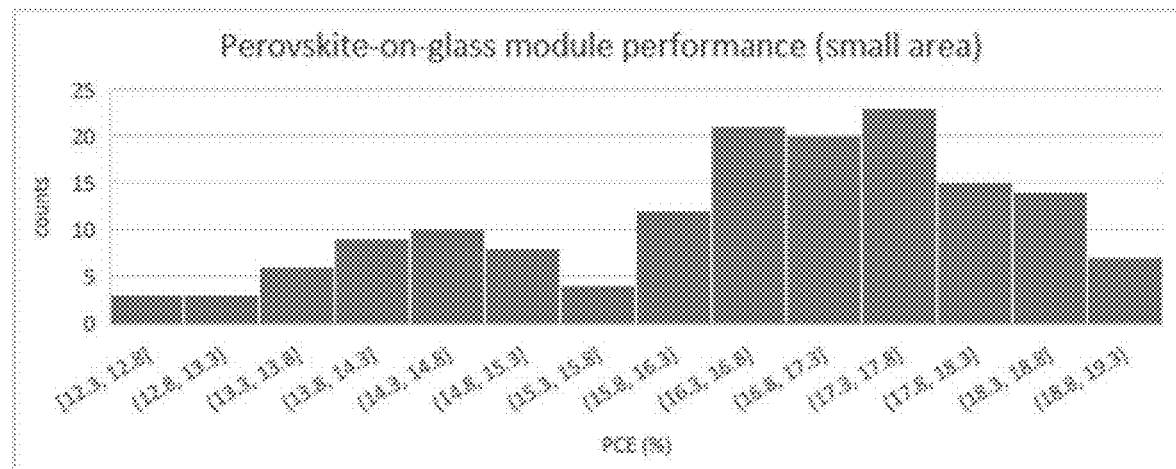
FIGS. 25A-25B show example histograms of the efficiency of various perovskite layers produced by the methods and system described herein in a small area (FIG. 25A) and a large area (FIG. 25B) device, according to an embodiment.

Such a method of producing a perovskite film can generate a perovskite solar cell with good performance and low hysteresis. Table 7 shows an example of the properties of an approximately 350 nm thick perovskite film made by this method. FIG. 25A shows an example histogram of the efficiency of various perovskite layers produced by the methods and system described herein for a small area cell, while FIG. 25B shows an example histogram of the efficiency achieved for various perovskite layers produced by the methods and systems described herein for a large area cell and slot-die application of the perovskite precursors, according to an embodiment. This figure demonstrates the feasibility of generating consistent high performance perovskite solar modules for use in the devices described herein. Additional parameter tuning as described elsewhere herein may also lead to further improvements in efficiency and consistency of the product perovskite modules.

TABLE 7

| | |
|---|---|
| EFF | 14.52% |
| FF | 73.16 |
| $V_{OC}$ | 1081.4 mV |
| $J_{SC}$ | 18.37 mA/cm2 |
| Vmax | 875.1 mV |
| Imax | 16.59 mA/cm2 |
| $I_{SC}$ | 0.002389 A |
| $R_{SC}$ | 5.10E+04 Ohm |
| $R_{OC}$ | 53.393 Ohm |
| A | 0.13 cm2 |

Figure 24B:
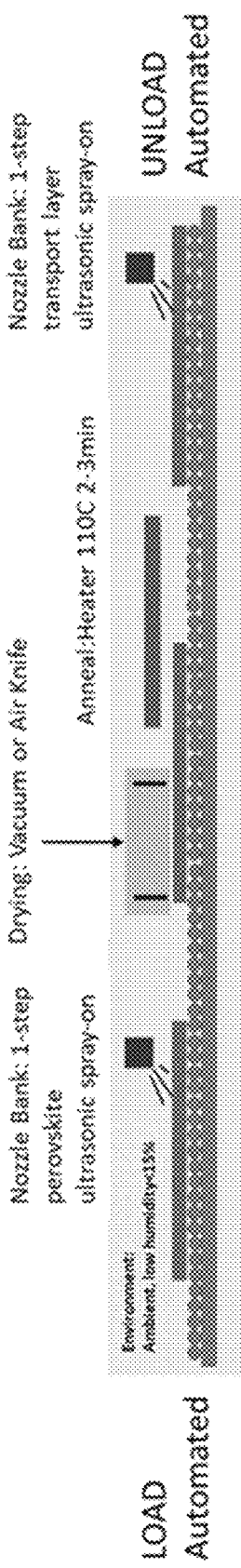

An antisolvent free method of preparing perovskite layers may comprise utilization of a precursor solution comprising lead (II) acetate, lead (II) halide, methylammonium halide, and dimethylformamide. Such a solution may not use application of an anti solvent to form the perovskite layer. For example, the solution can be applied to a substrate and allowed to dry for 5-15 minutes at room temperature to form the perovskite layer. The perovskite layer may be subsequently annealed as described elsewhere herein. FIG. 24B is an example of an apparatus for generating a perovskite layer without use of an antisolvent, according to an embodiment.

Such methods may be scalable due to a combination of facile atmospheric controls (e.g., ambient conditions with low humidity), one-operation perovskite spray-on formulations, scalable drying processes (e.g., vacuum, air-knife (e.g., inert gas-knife), etc.), scalable annealing processes, and scalable electron transport layer addition (e.g., ultrasonic spray-on formulations and apparatuses).

Example 10—Reliability Testing and Packaging

Figure 26:
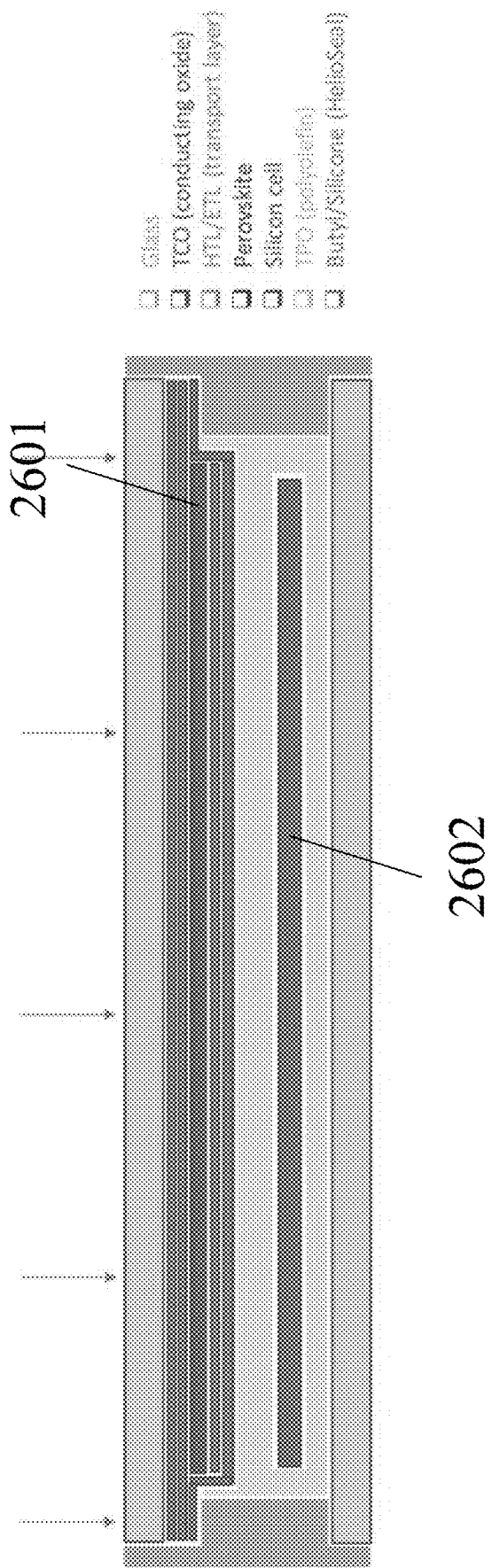
FIG. 26 is a schematic of an example solar module package, according to an embodiment.
Figure 27:
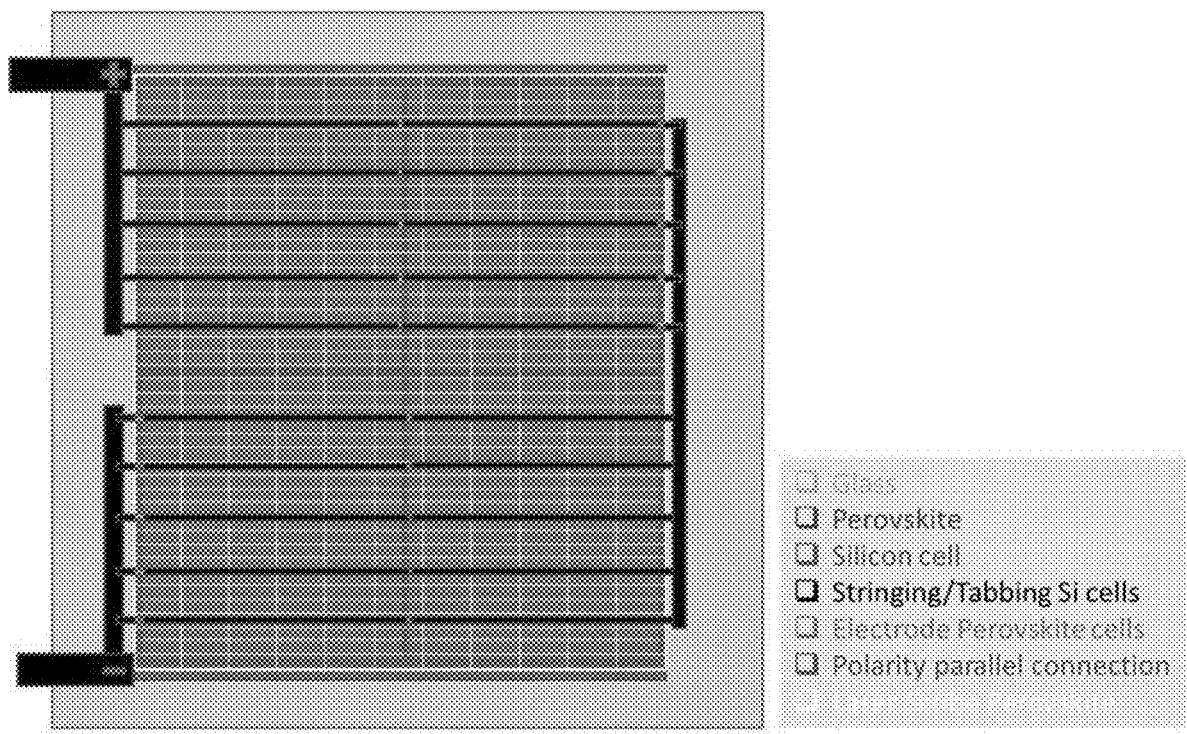
FIG. 27 is a schematic of an example wiring diagram for a module package, according to an embodiment.

FIG. 26 is a schematic of an example solar module package, according to an embodiment. FIG. 27 is a schematic of an example wiring diagram for a module package, according to an embodiment. The example solar module package can be a hybrid module comprising a perovskite layer 2601 and a silicon layer 2602. The perovskite layer can be formed via the methods and systems described elsewhere herein. For example, the perovskite layer can be formed on a top glass sheet of a silicon solar module. The perovskite layer can be placed atop a hole transport layer that is itself atop an approximately 7 Ohm/square meter transparent conductive oxide layer as described elsewhere herein. The perovskite layer can than have an electron transport layer added to it, and another layer of the transparent conductive oxide can be added onto the electron transport layer. A metal layer can then be added to form the electrode contacts configured for removal of current from the perovskite layer. The perovskite on glass can then be overlaid onto a series connected 2×2 array of 6 inch silicon solar cells. As shown, the perovskite solar cells can be connected in parallel with the silicon solar cells. Alternatively, the perovskite and silicon solar cells can be electronically separate (e.g., a 4 terminal architecture). The perovskite layer may be placed in a glass on glass configuration with the silicon solar cells. The glass on glass configuration may improve light trapping within the solar module, and thus increase the overall efficiency of the module. As shown in FIG. 27, the perovskite layer can be laser scribed into a plurality of strips such that the open circuit voltage of the ensemble of perovskite cells can match that of the silicon cells. This voltage matching can reduce waste and increase overall module performance.

The module can be tested to ensure that that the performance of the module will hold up over time. Such testing may comprise performance testing (e.g., performance measurements, temperature coefficient measurements, normal operating cell temperature measurements, low light irradiance performance, light induced degradation measurements, light and elevated temperature induced degradation measurements, etc.), environmental durability testing (e.g., temperature cycling, humidity freeze testing, damp heat testing, potential induced degradation testing, etc.), long term durability testing (e.g., outdoor exposure testing, hot spot testing, reverse current overload testing, UV conditioning, hail durability, etc.), or the like, or any combination thereof.

Computer Systems

Figure 12:
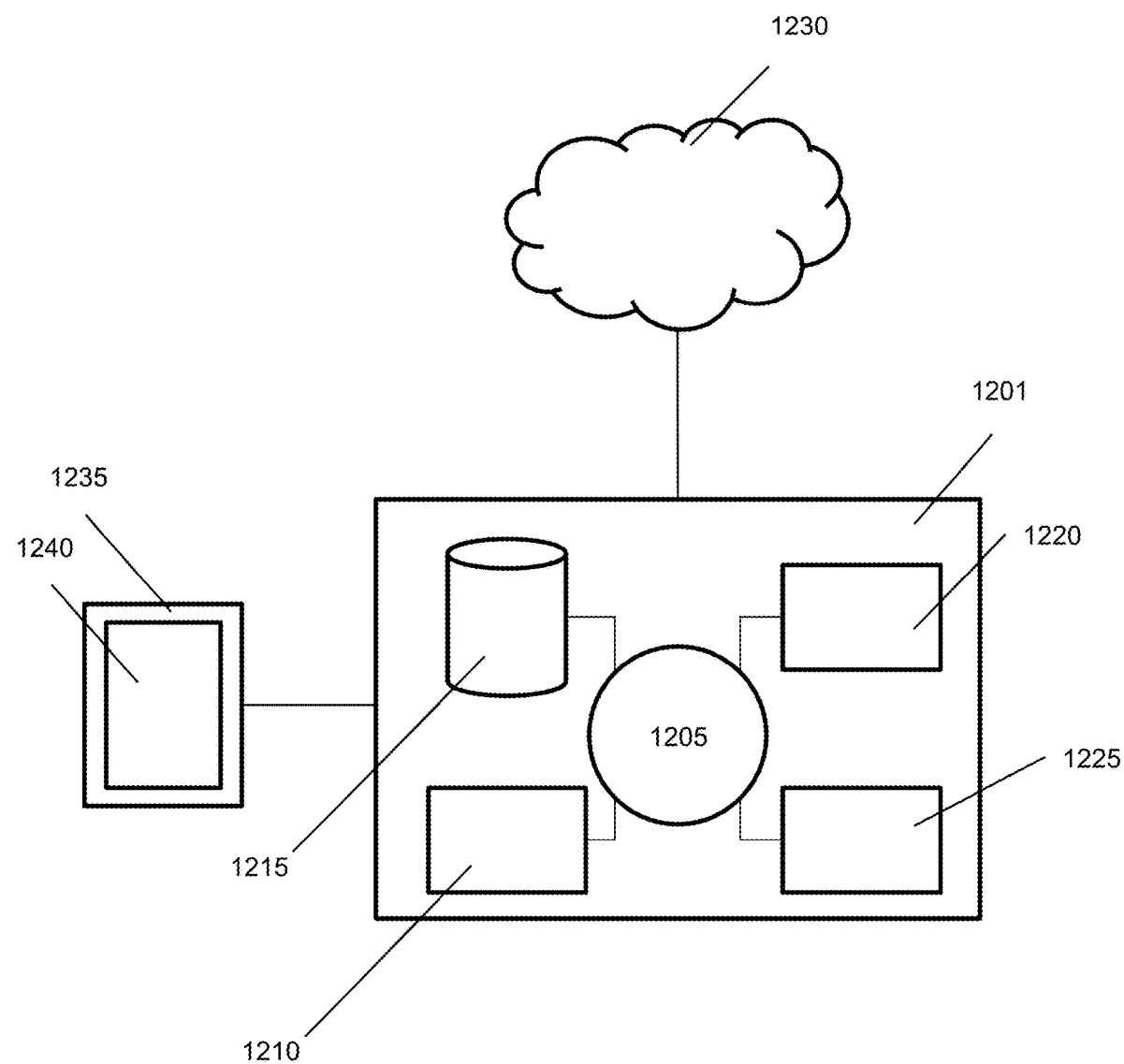
FIG. 12 shows a computer system that is programmed or otherwise configured to implement methods provided herein.

The present disclosure provides computer systems that are programmed to implement methods of the disclosure. FIG. 12 shows a computer system 1201 that is programmed or otherwise configured to direct the fabrication and manufacturing processes described herein (e.g., physical vapor deposition, ultrasonic spray-on, etc.) or control power electronics connected to the solar modules described herein.

The computer system 1201 includes a central processing unit (CPU, also "processor" and "computer processor" herein) 1205, which can be a single core or multi core processor, or a plurality of processors for parallel processing. The computer system 1201 also includes memory or memory location 1210 (e.g., random-access memory, read-only memory, flash memory), electronic storage unit 1215 (e.g., hard disk), communication interface 1220 (e.g., network adapter) for communicating with one or more other systems, and peripheral devices 1225, such as cache, other memory, data storage and/or electronic display adapters. The memory 1210, storage unit 1215, interface 1220 and peripheral devices 1225 are in communication with the CPU 1205 through a communication bus (solid lines), such as a motherboard. The storage unit 1215 can be a data storage unit (or data repository) for storing data. The computer system 1201 can be operatively coupled to a computer network ("network") 1230 with the aid of the communication interface 1220. The network 1230 can be the Internet, an internet and/or extranet, or an intranet and/or extranet that is in communication with the Internet. The network 1230 in some cases is a telecommunication and/or data network. The network 1230 can include one or more computer servers, which can enable distributed computing, such as cloud computing. The network 1230, in some cases with the aid of the computer system 1201, can implement a peer-to-peer network, which may enable devices coupled to the computer system 1201 to behave as a client or a server.

The CPU 1205 can execute a sequence of machine-readable instructions, which can be embodied in a program or software. The instructions may be stored in a memory location, such as the memory 1210. The instructions can be directed to the CPU 1205, which can subsequently program or otherwise configure the CPU 1205 to implement methods of the present disclosure. Examples of operations performed by the CPU 1205 can include fetch, decode, execute, and writeback.

The CPU 1205 can be part of a circuit, such as an integrated circuit. One or more other components of the system 1201 can be included in the circuit. In some cases, the circuit is an application specific integrated circuit (ASIC).

The storage unit 1215 can store files, such as drivers, libraries and saved programs. The storage unit 1215 can store user data, e.g., user preferences and user programs. The computer system 1201 in some cases can include one or more additional data storage units that are external to the computer system 1201, such as located on a remote server that is in communication with the computer system 1201 through an intranet or the Internet.

The computer system 1201 can communicate with one or more remote computer systems through the network 1230. For instance, the computer system 1201 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 1201 via the network 1230.

Methods as described herein can be implemented by way of machine (e.g., computer processor) executable code stored on an electronic storage location of the computer system 1201, such as, for example, on the memory 1210 or electronic storage unit 1215. The machine executable or machine-readable code can be provided in the form of software. During use, the code can be executed by the processor 1205. In some cases, the code can be retrieved from the storage unit 1215 and stored on the memory 1210 for ready access by the processor 1205. In some situations, the electronic storage unit 1215 can be precluded, and machine-executable instructions are stored on memory 1210.

The code can be pre-compiled and configured for use with a machine having a processor adapted to execute the code or can be compiled during runtime. The code can be supplied in a programming language that can be selected to enable the code to execute in a pre-compiled or as-compiled fashion.

Aspects of the systems and methods provided herein, such as the computer system 1201, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1201 can include or be in communication with an electronic display 1235 that comprises a user interface (UI) 1240 for providing, for example, control over fabrication process parameter. Examples of UI's include, without limitation, a graphical user interface (GUI) and web-based user interface.

Methods and systems of the present disclosure can be implemented by way of one or more algorithms. An algorithm can be implemented by way of software upon execution by the central processing unit 1205.

Aspects of the Disclosure

1. A method, comprising:
   (a) providing a silicon solar module with a first voltage output, wherein the silicon solar module comprises a top glass panel;
   (b) forming a perovskite layer on said top glass panel;
   (c) fabricating one or more perovskite solar cells from said perovskite layer, wherein said one or more perovskite solar cells produce a voltage substantially matched to said voltage output of said silicon solar module; and
   (d) electrically connecting said silicon solar module to said one or more perovskite solar cells.
2. The method of aspect 1, wherein said fabricating comprises use of a laser scribe to define said one or more perovskite solar cells.
3. The method of aspect 1, wherein said one or more perovskite solar cells are a plurality of perovskite solar cells.
4. The method of aspect 3, wherein said plurality of perovskite solar cells are connected in series.

5. The method of aspect 1, further comprising applying a plurality of contacts to said one or more perovskite solar cells to electrically couple said one or more perovskite solar cells.
6. The method of aspect 1, further comprising applying an encapsulant to said one or more perovskite solar cells.
7. The method of aspect 6, wherein said encapsulant is a thermal-plastic polyolefin.
8. The method of aspect 7, wherein said encapsulant is ethyl-vinyl acetate.
9. The method of aspect 1, further comprising applying an edge seal to said one or more perovskite solar cells.
10. A tandem solar module, comprising:
    a silicon solar panel comprising (i) a plurality of silicon solar cells connected in series and (ii) a top glass sheet, wherein said plurality of silicon solar cells are connected in series and combined have a first open circuit voltage;
    a perovskite solar panel disposed on an underside of said top glass sheet of said silicon solar panel, wherein said perovskite solar panel comprises a plurality of segments, wherein each segment of said plurality of segments comprises a plurality of laser-scribed strips of perovskite, wherein said plurality of laser-scribed strips of perovskite within a segment are connected in series to generate a second open circuit voltage that is substantially the same as said first open circuit voltage; and
    an interconnect connecting said plurality of silicon solar cells and said plurality of segments of said perovskite solar panel in parallel.
11. The device of aspect 10, wherein said plurality of segments comprises from about 10 to about 200 segments.
12. The device of aspect 10, wherein said silicon solar panel is a top contact solar panel, an integrated back contact solar panel, or a shingled solar panel.
13. The device of aspect 10, wherein said silicon solar panel and said perovskite solar panel are connected to a same junction box.
14. The device of aspect 10, wherein said silicon solar panel and said perovskite solar panel have a substantially similar area.
15. The device of aspect 10, wherein said plurality of laser-scribed strips of perovskite are connected via a P1/P2/P3 scheme.
16. A perovskite layer, comprising:
    a composition of $MA_{n1}FA_{n2}Cs_{n3}PbX_3$, wherein MA is methylammonium, FA is formamidinium, n1, n2, and n3 are independently greater than 0 and less than 1, and n1+n2+n3=1, wherein a perovskite solar cell comprising said perovskite layer retains at least about 80% solar conversion efficiency after 300 hours of illumination under one sun conditions in an air atmosphere at >25° C. and <100° C.
17. The perovskite layer of aspect 16, wherein X is selected from the group consisting of fluorine, chlorine, bromine, and iodine.
18. The perovskite layer of aspect 17, wherein X is a combination of two or more of fluorine, chlorine, bromine, and iodine.
19. The perovskite layer of aspect 16, wherein n1 is from about 0.001 to about 0.05.
20. The perovskite layer of aspect 16, wherein n3 is from about 0.001 to about 0.15.
21. The perovskite layer of aspect 16, wherein said solar conversion efficiency is at least about 90% of the initial conversion efficiency value after 300 hours of illumination under one sun conditions.
22. The perovskite layer of aspect 21, wherein said solar conversion efficiency is at least about 95% of the initial conversion efficiency value after 300 hours of illumination under one sun conditions.
23. The perovskite layer of aspect 16, wherein said perovskite layer does not comprise additional additives.
24. A method, comprising:
    (a) providing a substrate;
    (b) applying a perovskite precursor to said substrate;
    (c) annealing said perovskite precursor to form a perovskite layer; wherein said perovskite layer has a composition of $MA_{n1}FA_{n2}Cs_{n3}PbX_3$, wherein n1, n2, and n3 are independently greater than 0 and less than 1 and n1+n2+n3=1, wherein a perovskite solar cell comprising said perovskite layer retains at least about 80% solar conversion efficiency after 300 hours of illumination under one sun conditions at >25° C. and <100° C.; and
    (d) subjecting said perovskite layer to an encapsulation lamination process at a temperature of at least about 120° C.
25. The method of aspect 24, wherein said perovskite solar cell retains at least about 80% of the initial conversion efficiency value after said encapsulation lamination process.
26. The method of aspect 25, wherein said perovskite solar cell retains at least about 97% of the initial conversion efficiency value after said encapsulation lamination process.
27. The method of aspect 24, wherein said applying said perovskite precursor via an ultrasonic spray-on process.
28. The method of aspect 24, wherein said annealing process comprises heating said perovskite layer to a temperature of at least about 40-120° C.
29. A perovskite layer, comprising:
    a composition of $MA_{n1}FA_{n2}Cs_{n3}PbX_3$, wherein MA is methylammonium, FA is formamidinium, n1 is from about 0.01 to 0.03, n2 is from about 0.82 to 0.94, and n3 is from about 0.05 to 0.015, and n1+n2+n3=1.
30. The perovskite layer of aspect 29, wherein X is selected from the group consisting of fluorine, chlorine, bromine, and iodine.
31. The perovskite layer of aspect 30, wherein X is a combination of two or more of fluorine, chlorine, bromine, and iodine.
32. The perovskite layer of aspect 29, wherein the perovskite solar cell does not comprise additional additives.
33. A device, comprising:
    a silicon solar cell having a first band gap;
    a top glass sheet covering the silicon solar cell, wherein the top glass sheet comprises a top surface and a bottom surface; and
    a perovskite solar cell having a second band gap, wherein the perovskite solar cell is deposited on the bottom surface of the top glass sheet.
34. The device of aspect 33, wherein the silicon solar cell is electrically isolated from the perovskite solar cell.
35. The device of aspect 34, wherein the silicon solar cell comprises two terminals and the perovskite solar cell comprises two terminals.
36. The device of aspect 33, wherein the perovskite solar cell comprises a photoactive perovskite layer, wherein the photoactive perovskite layer comprises $CH_3NH_3PbX_3$ or $H_2NCHNH_2PbX_3$.

37. The device of aspect 36, wherein X comprises iodide, bromide, chloride, or a combination thereof.

38. The device of aspect 33, wherein the perovskite solar cell comprises a first transparent conductive oxide (TCO) layer and a second TCO layer.

39. The device of aspect 38, wherein the first TCO layer and the second TCO layer are terminals of the perovskite solar cell.

40. The device of aspect 39, wherein the first TCO layer and the second TCO layer comprise indium oxide, indium tin oxide, or aluminum zinc oxide.

41. The device of aspect 33, wherein the perovskite solar cell comprises an electron transport layer (ETL) comprising phenyl-C61-butyric acid methyl ester or C60.

42. The device of aspect 33, wherein the perovskite solar cell comprises a hole transport layer (HTL) comprising nickel oxide.

43. The device of aspect 33, further comprising a plurality of silicon solar cells including the silicon solar cell and a plurality of perovskite solar cells including the perovskite solar cell, wherein the plurality of perovskite solar cells is laser scribed in the top glass sheet so as to voltage-match or current-match the plurality of perovskite solar cells to the plurality of silicon solar cells.

44. The device of aspect 33, wherein the top glass sheet has a surface area that substantially corresponds to a surface area of a 60- or 72-cell solar panel.

45. The device of aspect 33, wherein the top surface of the top glass sheet comprises an anti-reflective coating.

46. The device of aspect 33, wherein the top surface of the top glass sheet comprises polydimethylsiloxane (PDMS).

47. The device of aspect 46, wherein the PDMS comprises 1:10 alumina PDMS, textured 1:50 alumina PDMS, or textured PDMS.

48. The device of aspect 33, wherein the bottom surface of the top glass sheet has a textured surface.

49. The device of aspect 33, further comprising an encapsulant disposed between the silicon solar cell and the perovskite solar cell.

50. The device of aspect 33, wherein the encapsulant is selected from the group consisting of ethylene-vinyl-acetate ("EVA"), thermal plastic polyolefin ("TPO"), PDMS, silicone, and paraffin.

51. The device of aspect 33, wherein the silicon solar cell and the perovskite solar cell are connected electrically in parallel.

52. The device of aspect 33, wherein the silicon solar cell and the perovskite solar cell are connected electrically in series.

53. The device of aspect 33, wherein the second bandgap is between about 1.5 and 1.9 electron volts (eV).

54. The device of aspect 33, wherein the silicon solar cell is selected from the group consisting of a monocrystalline solar cell, a polycrystalline solar cell, a passivated emitter rear contact (PERC) solar cell, an interdigitated back contact cell (IBC), and a heterojunction with intrinsic thin layer (HIT) solar cell.

55. A method for manufacturing a solar module comprising:
(a) providing a silicon solar cell having a first band gap;
(b) forming a perovskite solar cell having a second band gap in a bottom surface of a glass sheet; and
(c) affixing the glass sheet to the silicon solar cell to form the solar module such that the bottom surface of the glass sheet is adjacent to the silicon solar cell.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method, comprising:
(a) providing a substrate comprising a hole transport layer;
(b) applying a solution to said substrate to form a coating of the solution on a surface of the hole transport layer, the solution comprising a perovskite precursor and a solvent, the perovskite precursor comprising a metal halide and organohalides selected from the group consisting of formamidinium chloride, formamidinium bromide, formamidinium iodide, methylammonium chloride, methylammonium bromide, methylammonium iodide, and butylammonium halides, and the solvent comprising N,N'-dimethylpropyleneurea;
(c) removing the solvent from the coating to form a perovskite precursor layer on the substrate;
(d) annealing said perovskite precursor layer at a temperature in a range from 40° C. to 120° C. to form a perovskite layer; wherein said perovskite layer has a composition of $MA_{n1}FA_{n2}Cs_{n3}PbX_3$, where MA is methylammonium, FA is formamidinium, Cs is Cesium, Pb is lead, and X is selected from the group consisting of fluorine, chlorine, bromine, and iodine, wherein n1, n2, and n3 are independently greater than 0 and less than 1 and n1+n2+n3=1;
(e) applying an electron transport layer to the perovskite layer;
(f) forming a transparent conducting layer on the electron transport layer, forming the transparent conducting layer comprising creating a buffer layer of a transparent conducting oxide on the electron transport layer using a physical vapor deposition process at a first power and then creating a bulk layer of the transparent conducting oxide on the buffer layer using the physical vapor deposition process at a second power greater than the first power;
(g) subjecting said perovskite layer, electron transport layer, and transparent conducting layer to an encapsulation lamination process at a temperature of at least 70° C. and at most 130° C. to provide a stack comprising the substrate, the perovskite layer, the electron transport layer, and the transparent conducting layer;
(h) forming a solar cell using the stack, wherein the perovskite layer in the solar cell retains at least 80% solar conversion efficiency relative to an initial solar conversion efficiency after 300 hours of illumination under one sun conditions at >25° C. and <100° C.

2. The method of claim 1, wherein said solar cell retains at least 97% of the initial conversion efficiency value.

3. The method of claim 1, wherein said applying said solution comprises applying solution via an ultrasonic spray-on process.

4. The method of claim 1, wherein said applying said solution comprises applying said solution via blade-coating.

5. The method of claim 1, wherein said solar cell is a silicon solar cell and said substrate is a top glass of the silicon solar cell.

6. The method of claim 1, wherein said perovskite layer has an initial absolute solar conversion efficiency of at least 18%.

7. The method of claim 1, further comprising applying an edge sealant to said perovskite layer.

8. The method of claim 1, wherein the metal halide is a lead halide.

9. The method of claim 8, wherein the lead halide is lead iodide.

10. The method of claim 1, wherein the perovskite precursor layer is annealed in an atmosphere that is reactive with the perovskite precursor.

11. The method of claim 1, wherein the encapsulation lamination processes comprises encapsulating the perovskite layer, electron transport layer, and transparent conducting layer with a layer of material selected from the group consisting of ethylene-vinyl-acetate, thermal plastic polyolefin, polydimethylsiloxane, silicone, and paraffin.

12. The method of claim 1, wherein said applying said solution comprises applying solution via slot-die coating.

13. The method of claim 1, wherein removing the solvent comprises evaporating the solvent.

14. The method of claim 1, wherein removing the solvent comprises applying an antisolvent to the coating.

15. The method of claim 1, wherein forming the solar cell comprises attaching the stack to a silicon solar cell to provide a tandem solar module.

16. The method of claim 15, wherein the stack forms a top glass layer of the silicon solar cell.

17. The method of claim 1, wherein the electron transport layer comprises phenyl-C61-butyric acid methyl ester.

18. The method of claim 1, wherein the solvent is a solvent mixture comprising the N,N'-dimethylpropyleneurea and at least one co-solvent, wherein a ratio of the N,N'-dimethylpropyleneurea to the at least one co-solvent in the solution is sufficient to reduce a rate of drying of the coating relative to a comparable solution free of N,N'-dimethylpropyleneurea.

19. The method of claim 1, wherein the solvent further comprises dimethyl sulfoxide.

20. The method of claim 19, wherein a ratio of dimethyl sulfoxide to N,N'-dimethylpropyleneurea is 1:99 or more.

21. The method of claim 20, wherein a ratio of dimethyl sulfoxide to N,N'-dimethylpropyleneurea is in a range from 20:80 or more.

* * * * *